(12) United States Patent
Farmwald et al.

(10) Patent No.: US 6,697,295 B2
(45) Date of Patent: Feb. 24, 2004

(54) MEMORY DEVICE HAVING A PROGRAMMABLE REGISTER

(75) Inventors: Michael Farmwald, Berkeley, CA (US); Mark Horowitz, Palo Alto, CA (US)

(73) Assignee: Rambus Inc., Los Altos, CA (US)

( * ) Notice: Subject to any disclaimer, the term of this patent is extended or adjusted under 35 U.S.C. 154(b) by 0 days.

(21) Appl. No.: 09/801,151

(22) Filed: Mar. 7, 2001

(65) Prior Publication Data

US 2001/0030904 A1 Oct. 18, 2001

Related U.S. Application Data

(63) Continuation of application No. 09/629,497, filed on Jul. 31, 2000, now Pat. No. 6,314,051, which is a continuation of application No. 09/566,551, filed on May 8, 2000, now Pat. No. 6,266,285, which is a continuation of application No. 09/213,243, filed on Dec. 17, 1998, now Pat. No. 6,101,152, which is a continuation of application No. 09/196,199, filed on Nov. 20, 1998, now Pat. No. 6,038,195, which is a continuation of application No. 09/798,520, filed on Feb. 10, 1997, now Pat. No. 5,841,580, which is a division of application No. 08/448,657, filed on May 24, 1995, now Pat. No. 5,638,334, which is a division of application No. 08/222,646, filed on Mar. 31, 1994, now Pat. No. 5,513,327, which is a continuation of application No. 07/954,945, filed on Sep. 30, 1992, now Pat. No. 5,319,755, which is a continuation of application No. 07/510,898, filed on Apr. 18, 1990, now abandoned.

(51) Int. Cl.$^7$ .................................................. G11C 8/00

(52) U.S. Cl. .................................... 365/233; 365/194

(58) Field of Search ........................... 365/233, 194, 365/233.5

(56) References Cited

U.S. PATENT DOCUMENTS 3,691,534 A 9/1972 Veradi et al. ................. 365/78
3,771,145 A 11/1973 Wiener ........................ 365/240

(List continued on next page.)

FOREIGN PATENT DOCUMENTS

| EP | 0 126 976 | 12/1984 |
| EP | 0 166 192 | 1/1986 |

(List continued on next page.)

OTHER PUBLICATIONS

Watanabe, T.; "Session XIX: High Density SRAMS"; IEEE International Solid State Circuits Conference pp. 266–267 (1987).

(List continued on next page.)

Primary Examiner—Tan T. Nguyen
(74) Attorney, Agent, or Firm—Hunton & Williams LLP

(57) ABSTRACT

The present invention includes a memory subsystem comprising at least two semiconductor devices, including at least one memory device, connected to a bus, where the bus includes a plurality of bus lines for carrying substantially all address, data and control information needed by said memory devices, where the control information includes device-select information and the bus has substantially fewer bus lines than the number of bits in a single address, and the bus carries device-select information without the need for separate device-select lines connected directly to individual devices.

The present invention also includes a protocol for master and slave devices to communicate on the bus and for registers in each device to differentiate each device and allow bus requests to be directed to a single or to all devices. The present invention includes modifications to prior-art devices to allow them to implement the new features of this invention. In a preferred implementation, 8 bus data lines and an AddressValid bus line carry address, data and control information for memory addresses up to 40 bits wide.

51 Claims, 15 Drawing Sheets

U.S. PATENT DOCUMENTS

| | | | |
|---|---|---|---|
| 3,821,715 A | 6/1974 | Hoff, Jr. et al. | 711/1 |
| 3,846,763 A | 11/1974 | Riikonen | 710/70 |
| 3,950,735 A | 4/1976 | Patel | 710/60 |
| 3,969,706 A | 7/1976 | Proebsting et al. | 365/189.02 |
| 4,084,154 A | 4/1978 | Panigrahi | 365/222 |
| 4,092,665 A | 5/1978 | Saran | 341/63 |
| 4,099,231 A | 7/1978 | Kotok et al. | 711/168 |
| 4,183,095 A | 1/1980 | Ward | 365/189.02 |
| 4,205,373 A | 5/1980 | Shah et al. | 710/128 |
| 4,247,817 A | 1/1981 | Heller | 327/63 |
| 4,253,147 A | 2/1981 | MacDougall et al. | 711/169 |
| 4,257,097 A | 3/1981 | Moran | 711/119 |
| 4,315,308 A | 2/1982 | Jackson | 710/33 |
| 4,330,852 A | 5/1982 | Redwine et al. | 365/221 |
| 4,408,272 A | 10/1983 | Walters | 710/61 |
| 4,426,685 A | 1/1984 | Lorentzen | 713/401 |
| 4,445,204 A * | 4/1984 | Nishiguchi | 365/194 |
| 4,468,733 A | 8/1984 | Oka et al. | 710/312 |
| 4,499,536 A | 2/1985 | Gemma et al. | 711/167 |
| 4,509,142 A | 4/1985 | Childers | 711/169 |
| 4,519,034 A | 5/1985 | Smith et al. | 710/61 |
| 4,528,646 A | 7/1985 | Ochii et al. | 365/203 |
| 4,536,795 A | 8/1985 | Hirota et al. | 348/714 |
| 4,570,220 A | 2/1986 | Tetrick et al. | 710/126 |
| 4,629,909 A | 12/1986 | Cameron | 327/211 |
| 4,630,193 A | 12/1986 | Kris | 713/502 |
| 4,631,659 A | 12/1986 | Hayne et al. | 711/167 |
| 4,639,890 A | 1/1987 | Heilveil et al. | 345/559 |
| 4,641,276 A | 2/1987 | Dunki-Jacobs | 710/71 |
| 4,644,469 A | 2/1987 | Sumi | 711/211 |
| 4,648,102 A | 3/1987 | Riso et al. | 375/356 |
| 4,649,511 A | 3/1987 | Gdula | 711/106 |
| 4,663,735 A | 5/1987 | Novak et al. | 345/533 |
| 4,675,850 A | 6/1987 | Kumanoya et al. | 365/230.01 |
| 4,680,738 A | 7/1987 | Tam | 365/239 |
| 4,685,088 A | 8/1987 | Ianucci | 365/189.02 |
| 4,703,418 A | 10/1987 | James | 700/32 |
| 4,710,904 A | 12/1987 | Suzuki | 365/226 |
| 4,712,194 A | 12/1987 | Yamaguchi et al. | 365/203 |
| 4,726,021 A | 2/1988 | Horiguchi et al. | 714/773 |
| 4,734,880 A | 3/1988 | Collins | 711/105 |
| 4,739,502 A | 4/1988 | Nozaki | 365/233 |
| 4,747,079 A | 5/1988 | Yamaguchi | 365/189.08 |
| 4,747,081 A | 5/1988 | Heilveil et al. | 365/219 |
| 4,757,473 A | 7/1988 | Kurihara et al. | 365/189.12 |
| 4,761,567 A | 8/1988 | Walters, Jr. et al. | 327/295 |
| 4,763,249 A | 8/1988 | Bomba et al. | 713/600 |
| 4,766,536 A | 8/1988 | Wilson, Jr. et al. | 710/121 |
| 4,782,439 A | 11/1988 | Borkar et al. | 710/23 |
| 4,785,394 A | 11/1988 | Fischer | 700/114 |
| 4,788,667 A | 11/1988 | Nakano et al. | 365/193 |
| 4,792,926 A | 12/1988 | Roberts | 365/189.02 |
| 4,799,199 A | 1/1989 | Scales, III et al. | 365/230.08 |
| 4,807,189 A | 2/1989 | Pinkham et al. | 365/189.05 |
| 4,811,202 A | 3/1989 | Schabowski | 710/127 |
| 4,821,226 A | 4/1989 | Christopher et al. | 365/230.03 |
| 4,823,321 A * | 4/1989 | Aoyama | 365/189.05 |
| 4,825,287 A | 4/1989 | Baji et al. | 348/720 |
| 4,839,801 A | 6/1989 | Nicely et al. | 710/35 |
| 4,845,664 A | 7/1989 | Aichelmann, Jr. et al. | 711/405 |
| 4,845,670 A | 7/1989 | Nishimoto et al. | 365/78 |
| 4,845,677 A | 7/1989 | Chappell et al. | 365/189.02 |
| 4,851,990 A | 7/1989 | Johnson et al. | 710/100 |
| 4,858,113 A | 8/1989 | Saccardi | 710/132 |
| 4,860,198 A | 8/1989 | Takenaka | 710/127 |
| 4,870,562 A | 9/1989 | Kimoto et al. | 711/167 |
| H696 H | 10/1989 | Davidson | 364/900 |
| 4,873,671 A | 10/1989 | Kowshik et al. | 365/189.12 |
| 4,876,670 A | 10/1989 | Nakabayashi et al. | 365/194 |
| 4,878,166 A | 10/1989 | Johnson et al. | 710/127 |
| 4,882,712 A | 11/1989 | Ohno et al. | 365/206 |
| 4,901,036 A | 2/1990 | Herold et al. | 331/25 |
| 4,905,201 A | 2/1990 | Ohira et al. | 365/233.03 |
| 4,912,630 A | 3/1990 | Cochcroft, Jr. | 711/211 |
| 4,916,670 A | 4/1990 | Suzuki et al. | 365/233 |
| 4,920,483 A | 4/1990 | Pogue et al. | 711/219 |
| 4,922,141 A | 5/1990 | Lofgren et al. | 327/244 |
| 4,928,265 A | 5/1990 | Higuchi et al. | 365/189.01 |
| 4,930,065 A | 5/1990 | McLagan et al. | 710/50 |
| 4,933,953 A | 6/1990 | Yagi | 375/149 |
| 4,937,734 A | 6/1990 | Bechtolsheim | 711/202 |
| 4,951,251 A | 8/1990 | Yamaguchi et al. | 365/189.02 |
| 4,953,128 A | 8/1990 | Kawai et al. | 365/194 |
| 4,953,130 A | 8/1990 | Houston | 365/203 |
| 4,954,987 A | 9/1990 | Auvinen et al. | 365/189.02 |
| 4,961,171 A | 10/1990 | Pinkham et al. | 365/230.05 |
| 4,970,418 A | 11/1990 | Masterson | 327/141 |
| 4,975,872 A | 12/1990 | Zaiki | 365/49 |
| 4,975,877 A | 12/1990 | Bell | 365/189.01 |
| 4,979,145 A | 12/1990 | Remington et al. | 711/106 |
| 4,998,262 A | 3/1991 | Wiggers | 375/356 |
| 5,016,226 A | 5/1991 | Hiwada et al. | 365/233 |
| 5,018,111 A | 5/1991 | Madland | 365/233 |
| 5,023,835 A | 6/1991 | Akimoto et al. | 365/155 |
| 5,023,838 A | 6/1991 | Herbert | 365/189.08 |
| 5,029,124 A | 7/1991 | Leahy et al. | 710/105 |
| 5,034,917 A | 7/1991 | Bland et al. | 711/167 |
| 5,036,495 A | 7/1991 | Busch et al. | 365/233 |
| 5,051,889 A | 9/1991 | Fung et al. | 711/157 |
| 5,099,481 A | 3/1992 | Miller | 371/22.1 |
| 5,101,117 A | 3/1992 | Johnson et al. | 327/149 |
| 5,107,465 A | 4/1992 | Fung et al. | 365/230.08 |
| 5,109,498 A | 4/1992 | Kamiya et al. | 711/123 |
| 5,111,486 A | 5/1992 | Oliboni et al. | 375/376 |
| 5,123,100 A | 6/1992 | Hisada et al. | 713/401 |
| 5,133,064 A | 7/1992 | Hotta et al. | 709/400 |
| 5,140,688 A | 8/1992 | White et al. | 710/600 |
| 5,142,637 A | 8/1992 | Harlin et al. | 711/106 |
| 5,148,523 A | 9/1992 | Harlin et al. | 345/519 |
| 5,153,856 A | 10/1992 | Takahashi | 365/233 |
| 5,157,776 A | 10/1992 | Foster | 711/131 |
| 5,179,667 A | 1/1993 | Iyer | 711/167 |
| 5,184,027 A | 2/1993 | Masuda et al. | 327/149 |
| 5,206,833 A | 4/1993 | Lee | 365/233 |
| 5,210,715 A | 5/1993 | Houston | 365/194 |
| 5,251,309 A | 10/1993 | Kinoshita et al. | 711/167 |
| 5,276,846 A | 1/1994 | Aichelmann, Jr. et al. | 711/165 |
| 5,287,532 A | 2/1994 | Hunt | 712/10 |
| 5,301,278 A | 4/1994 | Bowater et al. | 711/5 |
| 5,361,277 A | 11/1994 | Grover | 375/356 |
| 5,598,554 A | 1/1997 | Litaize et al. | 716/1 |
| 5,684,753 A | 11/1997 | Hashimoto et al. | 365/219 |
| 5,847,997 A | 12/1998 | Harada et al. | 365/185.33 |
| 6,112,287 A | 8/2000 | Litaize et al. | 712/11 |
| 6,345,321 B1 | 2/2002 | Litaize et al. | 710/23 |

FOREIGN PATENT DOCUMENTS

| | | |
|---|---|---|
| EP | 0 187 289 | 7/1986 |
| EP | 0 189 576 | 8/1986 |
| EP | 0 246 767 | 4/1987 |
| EP | 0 276 871 | 1/1988 |
| EP | 0282735 | 9/1988 |
| EP | 0 334 552 | 3/1989 |
| EP | 0218523 | 5/1989 |
| EP | 0 329 418 A2 | 8/1989 |
| EP | 0449052 | 3/1990 |
| EP | 0424774 | 5/1991 |
| JP | S56-82961 | 7/1981 |
| JP | S57-14922 | 1/1982 |
| JP | 33471/1982 | 3/1982 |
| JP | sho 58-31637 A | 2/1983 |

| | | |
|---|---|---|
| JP | sho 59-165285 A | 3/1983 |
| JP | Sho 60-80193 | 5/1983 |
| JP | sho 58-184626 A | 10/1983 |
| JP | SHO 58-192154 | 11/1983 |
| JP | sho 60-261095 A | 6/1984 |
| JP | 135684/1984 | 8/1984 |
| JP | Sho 60-55459 | 3/1985 |
| JP | 61028248 | 2/1986 |
| JP | S61-72350 | 4/1986 |
| JP | SHO 61-107453 | 5/1986 |
| JP | SHO 61-160556 | 10/1986 |
| JP | SHO 62-16289 | 1/1987 |
| JP | 120553/1987 | 1/1987 |
| JP | 62-51509 | 3/1987 |
| JP | Sho 62-71428 | 3/1987 |
| JP | SHO 63-34795 | 2/1988 |
| JP | SHO 63-91766 | 4/1988 |
| JP | S63-142445 | 6/1988 |
| JP | B63-46864 | 9/1988 |
| JP | sho 63-300310 | 12/1988 |
| JP | S64-29951 | 1/1989 |
| JP | 1043894 | 2/1989 |
| JP | A-1-236494 | 9/1989 |
| JP | 1284132 | 11/1989 |
| JP | hei 2-8950 | 1/1990 |
| WO | 82/02615 | 8/1982 |
| WO | WO 89/12936 | 12/1989 |

OTHER PUBLICATIONS

Ohno, C.; "Self–Timed RAM: STRAM"; Fujitsu Sci. TechJ., 24, 4, pp 293–300 (Dec. 1988).
"Fast Packet Bus for Microprocessor Systems with Caches", IBM Technical Disclosure Bulletin, pp. 279–282 (Jan 1989).
Gustavson, D. "Scalable Coherent Interface"; Invited Paper, COMPCON Spring '89 , San Francisco, CA; IEEE, pp. 536–538 (Feb 27–Mar 3, 1989).
James, D.; "Scalable I/O Architecture for Busses"; IEEE, pp. 539–544 (Apr. 1989).
European Search Report for EPO Patent Application No. 00 101 1832.
European Search Report for EPO Patent Application No. 89 30 2613.
Z. Amitai, "New System Architectures for DRAM Control and Error Correction", Monolithic Memories Inc., Electro/ 87 and Mini/Mico Northeast: Focusing on the OEM Conference Record, pp. 1132, 4/31–3, (Apr. 1987).
N. Siddique, "100–MHz DRAM Controller Sparks Multiprocessor Designs", Electronic Design, pp. 138–141, (Sep. 1986).
H. Kuriyama et al., "A 4–Mbit CMOS SRAM With 8–NS Serial Access Time", IEEE Symposium On VLSI Circuits Digest Of Technical Papers, pp. 51–52, (Jun. 1990).
A. Fielder et al., "A 3 NS 1K X 4 Static Self–Timed GaAs RAM", IEEE Gallium Arsenide Integrated Circuit Symposium Technical Digest, pp. 67–70, (Nov. 1988).
JEDEC Standard No. 21C.
M. Horowitz et al., "MIPS–X: A 20–MIPS Peak 32–bit Microprocessor with On–Chip Cache", IEEE Journal of Solid State Circuits, vol. 22 No. 5, pp. 790–799 (Oct. 1987).
T.L. Jeremiah et al., "Synchronous LSSD Packet Switching Memory and I/O Channel," IBM Tech. Disc. Bul,. vol. 24, No. 10, pp. 4986–4987 (Mar. 1982).
L. R. Metzeger, "A 16K CMOS Prom with Polysilicon Fusible Links", IEEE Journal of Solid State Circuits, vol. 18, No. 5, pp. 562–567 (Oct. 1983).

A. Yuen et al., "A 32K ASIC Synchronous RAM Using a Two–Transistor Basic Cell", IEEE Journal of Solid State Circuits, vol. 24 No. 1, pp. 57–61 (Feb. 1989).
D.T. Wong et al., "An 11—ns 8Kx18 CMOS Static RAM with 0.5–μm Devices", IEEE Journal of Solid State Circuits, vol. 23 No. 5, pp. 1095–1103 (Oct. 1988).
T. Williams et al., "An Experimental 1—Mbit CMOS SRAM with Configurable Organization and Operation", IEEE Journal of Solid State Circuits, vol. 23 No. 5, pp. 1085–1094 (Oct. 1988).
D. Jones, "Synchronous static ram", Electronics and Wireless World, vol. 93, No. 1622, pp. 1243–1244 (Dec. 1987).
F. Miller et al., "High Frequency System Operation Using Synchronous SCRAMS", Midcon/87 Conference Record, pp. 430–432 Chicago, IL, USA; Sep. 15–17, 1987.
K. Ohta, "A 1—Mbit DRAM with 33–MHz Serial I/O Ports", IEEE Journal of Solid State Circuits, vol. 21 No. 5, pp. 649–654 (Oct. 1986).
K. Nogami et al., "A 9–ns HIT–Delay 32–kbyte Cache Macro for High–Speed RISC", IEEE Journal of Solid State Circuits, vol. 25 No. 1, pp. 100–108 (Feb. 1990).
F. Towler et al., "A 128k 6.5ns Access/5ns Cycle CMOS ECL Static RAM", 1989 IEEE International Solid State Circuits Conference, (Feb. 1989).
M. Kimoto, "A 1.4ns/64kb RAM with 85ps/3680 Logic Gate Array", 1989 IEEE Custom Integrated Circuits Conference.
D. Wendell et al. "A 3.5ns, 2Kx9 Self Timed SRAM", 1990 IEEE Symposium on VLSI Circuits (Feb 1990).
E. H. Frank, "The SBUS: Sun's High Performance Bus for RISC Workstations", Sun Microsystems Inc. 1990.
H. L. Kalter et al. "A 50–ns 16Mb DRAM with a 10–ns Data Rate and On–Chip ECC" IEEE Journal of Solid State Circuits, vol. 25 No. 5, pp. 1118–1128 (Oct 1990).
J. Chun et al. "A pipelined 650MHz GaAs 8K ROM with Translation Logic" GaAs IC Symposium 1990.
European Search Report for EPO Patent Application No. 00 10 0018.
European Search Report for EPO Patent Application No. 00 10 822.
Takasugi, A. et al., "A Data–Transfer Architecture for Fast Multi–Bit Serial Acess Mode DRAM," 11$^{th}$ European Solid State Circuits Conference, Toulouse, France pp. 161–165 (Sep. 1985).
Amitai, Z., "Burst Mode Memories Improve Cache Design," WESCON/90 Conference Record, pp. 29–32 (Nov. 1990).
Fagan, J.L., "A 16–kbit Nonvolatile Charge Addressed Memory," IEEE Journal of Solid–State Circuits, vol. SC–11, No. 5, pp. 631–636 (Oct. 1976).
Ikeda, Hiroaki et al., "100 MHz Serial Access Architecture for 4Md Field Memory," Symposium of VLSI Circuits, Digest of Technical Papers, pp. 11–12 (Jun. 1990).
Schmitt–Landsiedel, Doris, "Pipeline Architecture for Fast CMOS Buffer RAMs," IEEE Journal of Solid–State Circuits, vol. 25, No. 3, pp. 741–747 (Jun. 1990).
Horowitz et al., "MIPS–X: A 20–MIPS Peak 32–Bit Microprocessor with ON–Chip Cache", IEEE J. Solid State Circuits, vol. SC–22, No. 5, pp. 790–798 (Oct. 1987).
Robert J. Lodi et al., "Chip and System Characteristics of a 2048–Bit MNOS–BORAM LSI Circuit," 1976 IEEE International Solid–State Circuits Conference (Feb. 18, 1976).
1989 GaAs IC Data Book & Designers Guide, Gigabit Logic Inc. (Aug. 1989).

"IC's for Entertainment Electronics, Picture in Picture System Edition 8.89", Siemens AG, 2/89.

Svensson, Christer, "High Speed CMOS Chip to Chip Communications Circuit," IEEE International Symposium on Circuits and Systems, pp. 2228–2231 (Jun. 1991).

Wakayama, Myles, "A 30–MHz Low–Jitter High–Linearity CMOS Voltage–Controlled Oscillator," IEEE Journal of Solid–State Circuits, vol. SC–22, No. 6, pp. 1074–1081 (Dec. 1987).

Whiteside, Frank, "A Dual–Port 65ns 64Kx4 DRAM with a 50MHz Serial Output," IEEE International Solid–State Circuits Conference Digest (Feb. 1986).

Wu, Jich–Tsorng, "A 100–MHz Pipelined CMOS Comparator," IEEE Journal of Solid–State Circuits, vol. 23, No. 6, pp. 1379–1385 (Dec. 1988).

Lineback, J. Robert, "System Snags Shouldn't Slow the Boom in Fast Static RAMs," Electronics, pp. 60–62 (Jul. 23, 1997).

Graham, Andy and Stewart Sando, "Pipelined Static RAM Endows Cache Memories with 1–ns Speed," Electronic Design, pp. 157–170 (Dec. 1984).

Pinkham, Raymond, "A High Speed Dual Port Memory with Simultaneous Serial and Random Mode Access for Video Applications," IEEE Journal of Solid–State Circuits, vol. SC–19, No. 6, pp. 999–1007 (Dec. 1984).

Ishimoto, S. et al., "A 256K Dual Port Memory," ISSCC Digest of Technical Papers, p. 38–39 (Feb. 1985).

Iqbal, Mohammad Shakaib, "Internally Timed RAMs Build Fast Writable Control Stores," Electronic Design, pp. 93–96 (Aug. 25, 1988).

Schnaitter, William M. et al., "A 0.5–GHz CMOS Digital RF Memory Chip," IEEE Journal of Solid–State Circuits, vol. SC–21, No. 5, pp. 720–726 (Oct. 1986).

Bursky, Dave, "Advanced Self–Timed SRAM Pares Access Time to 5 ns," Electronic Design, pp. 145–147 (Feb. 22, 1990).

Tomoji Takada et al., "A Video Codec LSI for High–Definition TV Systems with One–Transistor DRAM Line Memories," IEEE Journal of Solid–State Circuits, vol. 24, No. 6, pp. 1656–1659.

Robert J. Lodi et al., "MNOS–BORAM Memory Characteristics," IEEE Journal of Solid–State Circuits, vol. SC–11, No. 5, pp. 622–631 (Oct. 1976).

Gregory Uvieghara et al., "An On–Chip Smart Memory for a Data–Flow CPU," IEEE Journal of Solid–State Circuits, vol. 25, No. 1, pp. 84–89 (Feb. 1990).

Ray Pinkham et al., "A 128Kx8 70–MHz Multiport Video RAM with Auto Register Reload and 8x4 WRITE Feature," IEEE Journal of Solid State Circuits, vol. 23, No. 3, pp. 1133–1139 (Oct. 1988).

Graham, Andy and Stewart Sando, "Pipelined Static RAM Endows Cache Memories with 1–ns Speed," Electronic Design pp. 157–170.

Hans–Jurgen Mattausch et al., "A Memory–Based High–Speed Digital Delay Line with a Large Adjustable Length," IEEE Journal of Solid–State Circuits, vol. 23, No. 1, pp. 105–110 (Feb. 1988).

Kanopoulos, Nick and Jill H. Hallenbeck, "A First–In, First–Out Memory for Signal Processing Applications," IEEE Transactions on Circuits and Systems, vol. CAS–33, No. 5, pp. 556–558 (May 1986).

Motorola MC88200 Cache/Memory Management Unit User's Manual, Motorola Inc. 1989.

B. Ramakrishna et al., "The Cydra 5 Departmental Supercomputer Design Philosophies, Decisions, and Trade–offs" Computer IEEE, Jan 1989 pp. 12–35.

Ralston, E.D. Reilly, "Encyclopedia of Computer Science", Chapman & Hall, 1983, p. 1471.

S.A. Ward, R.H. Halstead, "Computation Structures", The MIT Press, McGraw–Hill Book Company, 1990, pp. 174–175, 93, 250–251, and 258–259.

Betty Prince, "Semiconductor Memories", Second Edition, John Wiley & Sons, 1991, pp. 251, 310, 314, 200–201, 467.

"MIPS Chip Set Implements Full ECL CPU" Microprocessor Report, MicroDesign Resources Inc., vol. 3: No. 12; Dec. 1989.

"R6000 System Bus & R6020 SBC Specification" MIPS Computer Systems Inc., Sunnyvale, CA, Aug 22, 1989.

R.A. Volz et al., "Position Paper on Global Clock for the Futurebus+", SCL—1989—doc—59, pp. 1–9.

"ECL bus controller hits 266 Mbytes/s" Microprocessor Report, MicroDesign Resources Inc., vol. 4: No. 1; p. 12, Jan. 24, 1990.

"Intel MCS–4 Micro Computer Set", Intel Corporation, Santa Clara, CA,1972, (pp. 1–12).

"MIPS R3010 coprocessor", IEEE Micro Jun. 1988, (pp. 54–62).

"Intel MCS–4 Micro Computer Set Users Manual", Intel Corporation, Santa Clara, CA, Mar. 1972, (pp. 1–26, and 60–68).

"Bipolar/MOS Memories Data Book", Advanced Micro Devices, Sunnyvale, CA, 1986 (pp. 4–143 to 4–163).

"Memories 1986–87 Databook", Fujitsu Inc., 1986 (pp. 1–102 to 1–128).

H. J. Mattausch, et al., "A Memory–Based High–Speed Digital Delay Line With a Large Adjustable Length", IEEE Journal of Solid State Circuits, vol. 23, No. 1, Feb. 1988 (pp. 105–110).

S. Muchmore, "Designing Computer Systems Based on Multibus II", New Electronics, vol. 20, No. 16, pp. 31–32, Aug. 11, 1987.

"Accodion Start–Stop Sequencer for a Variable Cycle Storage Controller", IBM Technical Disclosure Bulletin, pp. 2074–2075, (a delphion.com reprint on two sheets), Oct. 1986.

"Motorola 68030 Cache Organization", posting to Internet Newsgroup net.arch by aglew@ccvaxa.UUCP,(a google-.com reprint on two sheets), Sep. 29, 1986.

M. Bazes et al., "A Programmable NMOS DRAM Controller for Microcomputer Systems with Dual–Port Memory and Error Checking and Correction", IEEE Journal of Solid State Circuits, vol. 18, No. 2, pp. 164–172, Apr. 1983.

R.W. Callahan et al., "Burst–Mode PIO Bus Control", IBM Technical Disclosure Bulletin, vol. 21, No. 4, pp. 1417–1419, (a delphion.com reprint on two sheets), Sep. 1978.

Stanley D. Rosenbaum et al., "A 16 384–Bit High–Density CCD Memory" IEEE Journal of Solid State Circuits, vol. SC–11, No. 1, pp. 33–39, Feb. 1976.

Hopper et al., "Multiple vs. Wide Shared Bus Multiprocessors" Proceedings of the 16th Annual International Symposium on Computer Architecture, Jerusalem, Israel, June 1989, IEEE Computer Society Press, 1989.

Gerninger et al., "A Survey of Commerical Parallel Processors", Computer Architecture News, vol. 16, No. 4, Sep. 1988.

Dubois et al., "Effects of Cache Coherency in Multiprocessors", IEEE Transaction in Computers, vol. C31, No. 11, pp. 1083–1099, Nov. 1982.

\* cited by examiner

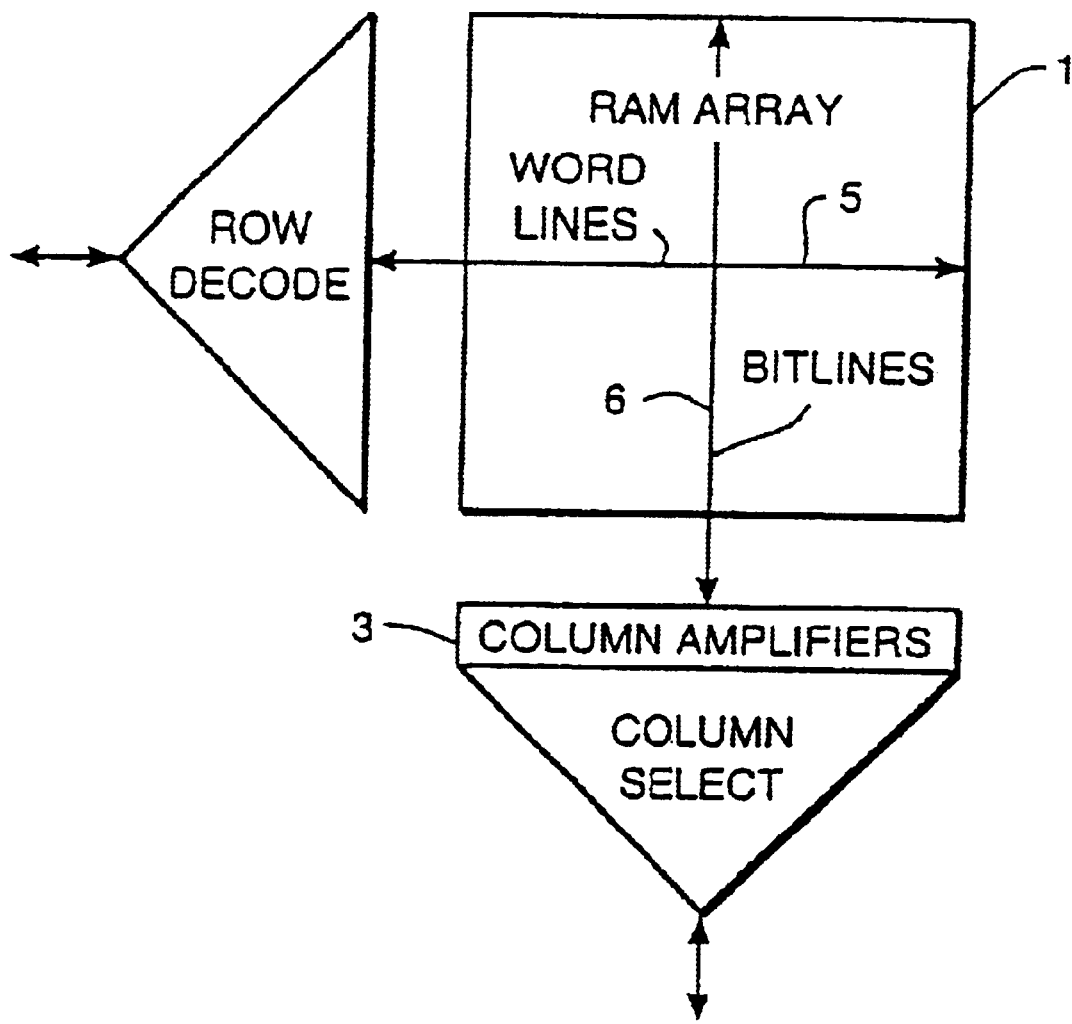
FIG_1

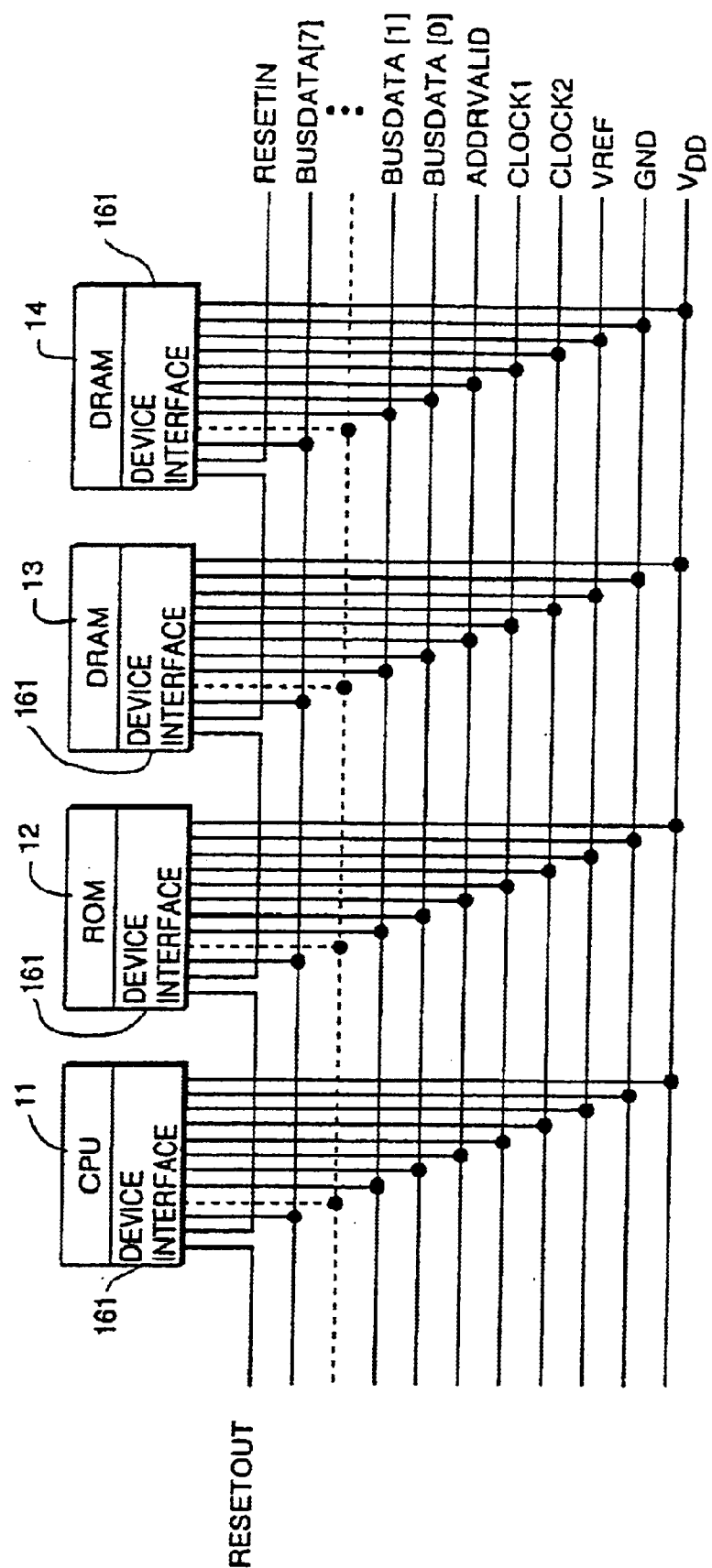

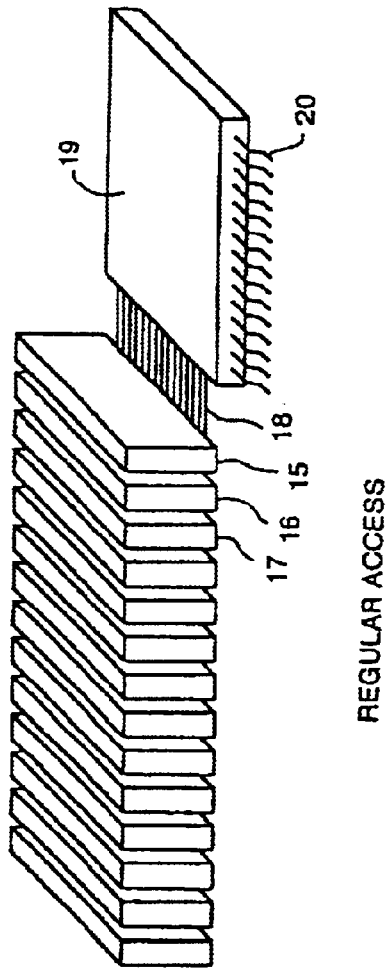
FIG_3
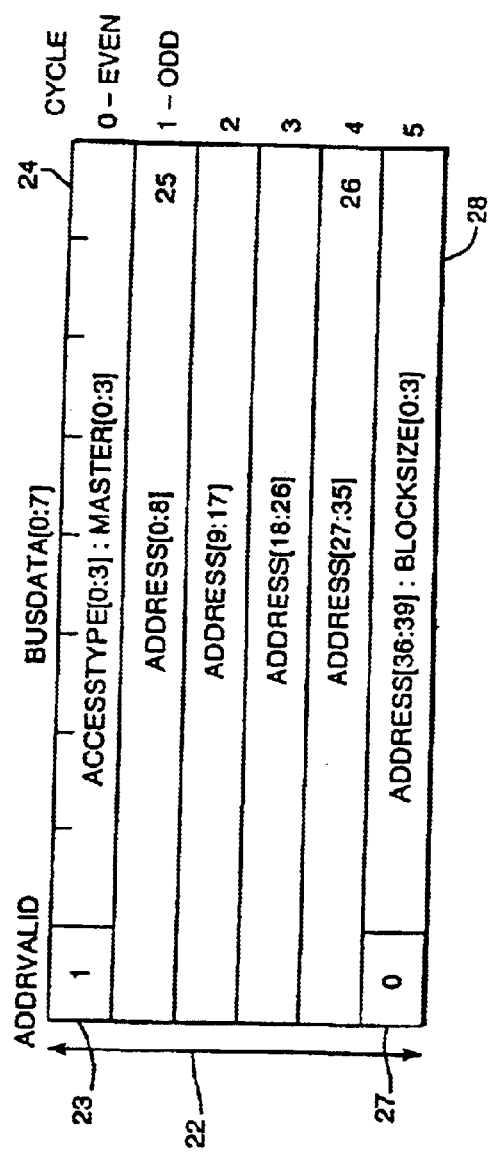
FIG_4

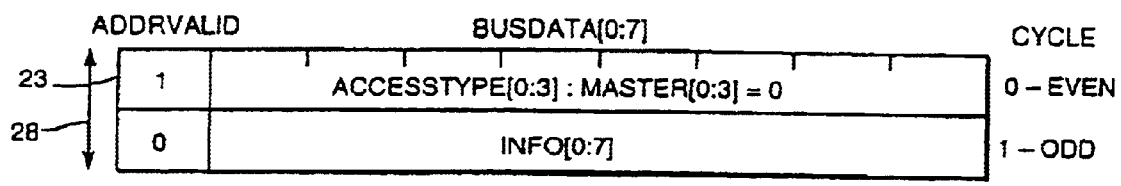
FIG_5
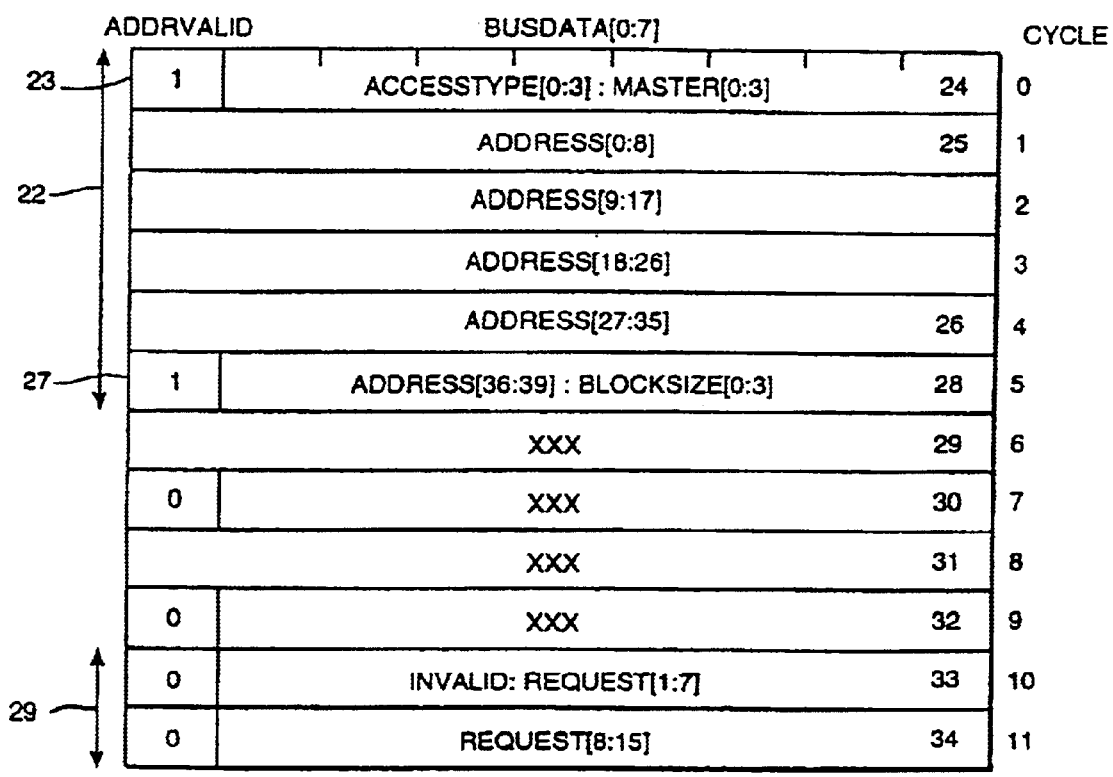
FIG_6

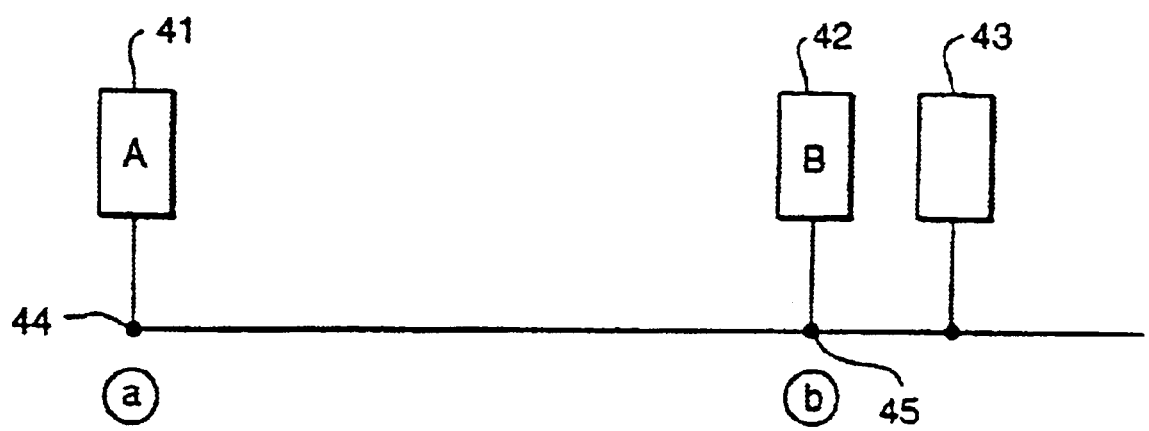
FIG_7A

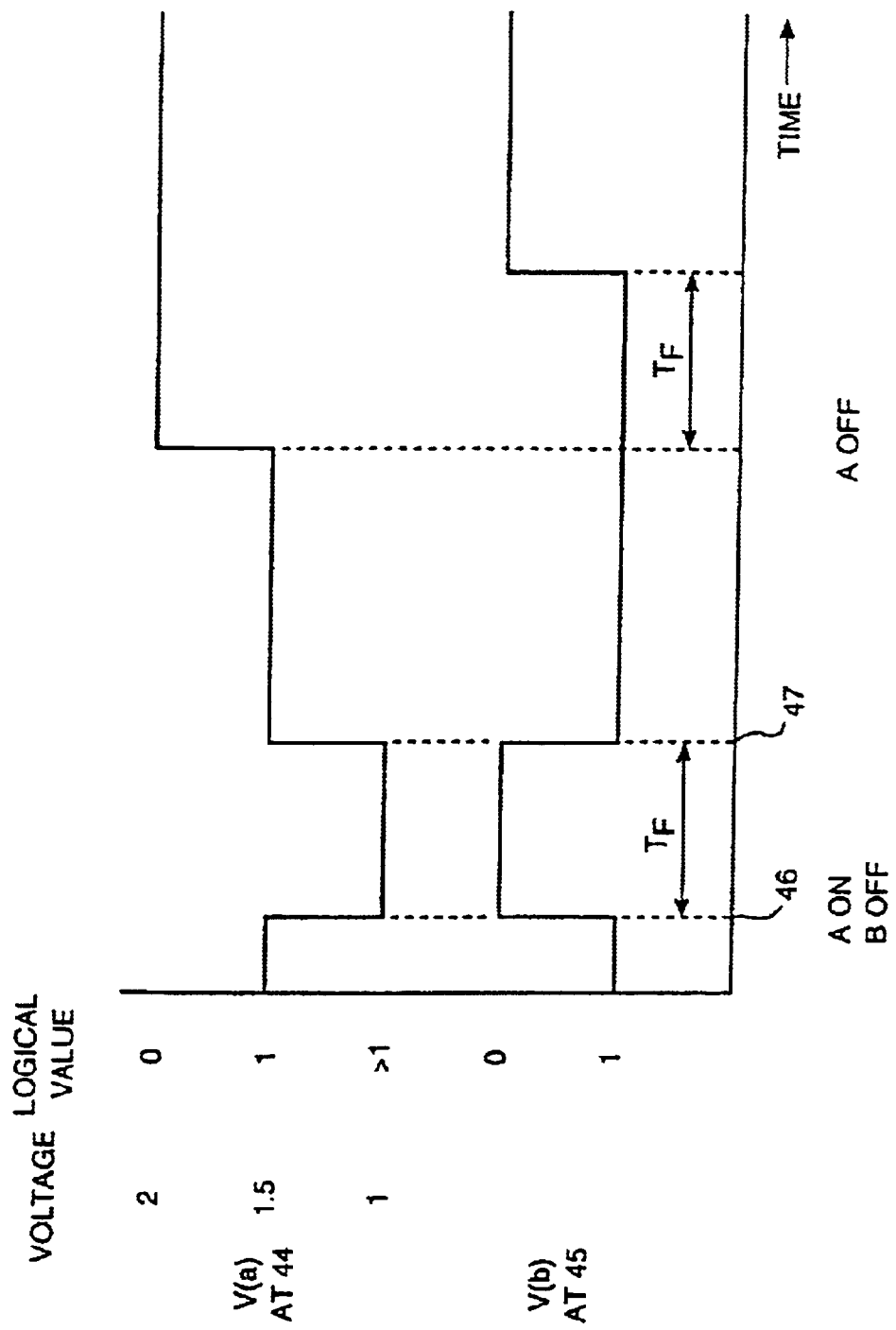
FIG_7B.

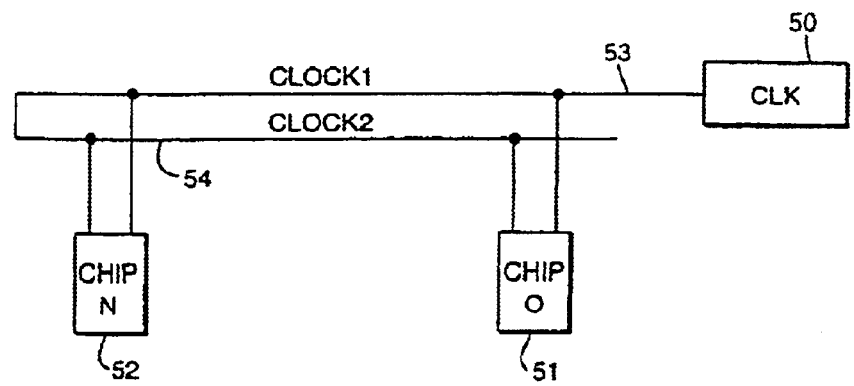
FIG_8A
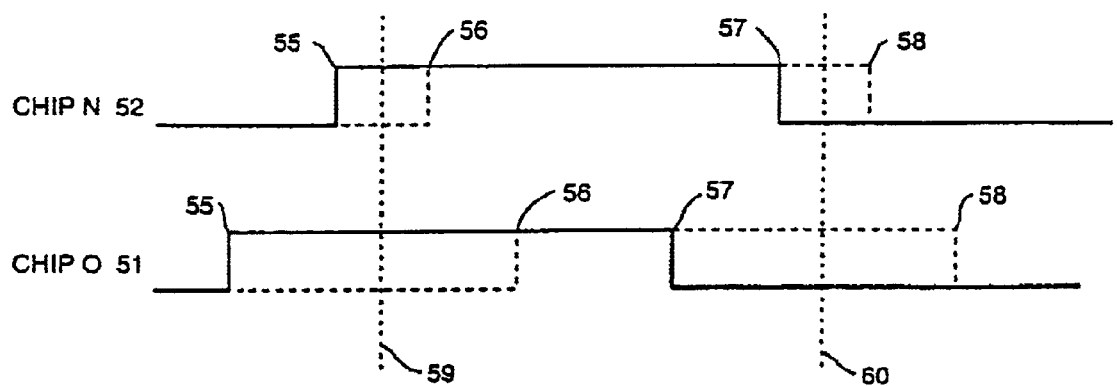
FIG_8B

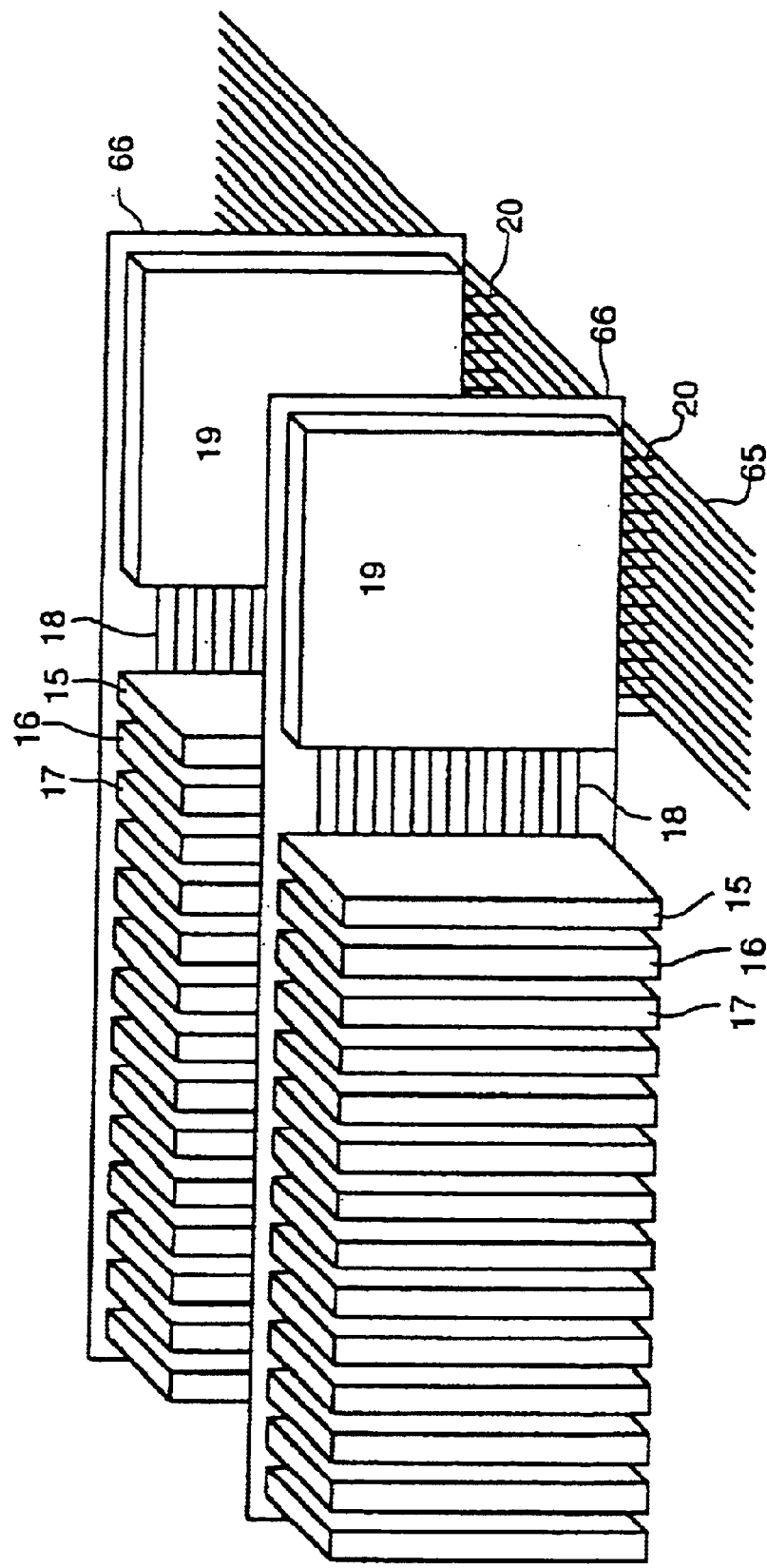
FIG_9

FIG_11

FIG_12

FIG_14

FIG_15

MEMORY DEVICE HAVING A PROGRAMMABLE REGISTER

This application is a continuation of application Ser. No. 09/629,497, filed Jul. 31, 2000 now U.S. Pat. No. 6,314,051, issued on Jun. 18, 2001, which is a continuation of application Ser. No. 09/566,551, filed May 8, 2000, now U.S. Pat. No. 6,226,285, issued on Mar. 31, 2001; which is a continuation of application Ser. No. 09/213,243, filed Dec. 17, 1998 (now U.S. Pat. No. 6,101,152); which is a continuation of application Ser. No. 09/196,199, filed on Nov. 20, 1998 (now U.S. Pat. No. 6,038,195), which is a continuation of application Ser. No. 08/798,520, filed on Feb. 10, 1997 (now U.S. Pat. No. 5,841,580); which is a division of application Ser. No. 08/448,657, filed May 24, 1995 (now U.S. Pat. No. 5,638,334); which is a division of application Ser. No. 08/222,646, filed on Mar. 31, 1994 (now U.S. Pat. No. 5,513,327); which is a continuation of application Ser. No. 07/954,945, filed on Sep. 30, 1992 (now U.S. Pat. No. 5,319,755); which is a continuation of application Ser. No. 07/510,898, filed on Apr. 18, 1990 (now abandoned).

FIELD OF THE INVENTION

An integrated circuit bus interface for computer and video systems is described which allows high speed transfer of blocks of data, particularly to and from memory devices, with reduced power consumption and increased system reliability. A new method of physically implementing the bus architecture is also described.

BACKGROUND OF THE INVENTION

Semiconductor computer memories have traditionally been designed and structured to use one memory device for each bit, or small group of bits, of any individual computer word, where the word size is governed by the choice of computer. Typical word sizes range from 4 to 64 bits. Each memory device typically is connected in parallel to a series of address lines and connected to one of a series of data lines. When the computer seeks to read from or write to a specific memory location, an address is put on the address lines and some or all of the memory devices are activated using a separate device select line for each needed device. One or more devices may be connected to each data line but typically only a small number of data lines are connected to a single memory device. Thus data line 0 is connected to device(s) 0, data line 1 is connected to device(s) 1, and so on. Data is thus accessed or provided in parallel for each memory read or write operation. For the system to operate properly, every single memory bit in every memory device must operate dependably and correctly.

To understand the concept of the present invention, it is helpful to review the architecture of conventional memory devices. Internal to nearly all types of memory devices (including the most widely used Dynamic Random Access Memory (DRAM), Static RAM (SRAM) and Read Only Memory (ROM) devices), a large number of bits are accessed in parallel each time the system carries out a memory access cycle. However, only a small percentage of accessed bits which are available internally each time the memory device is cycled ever make it across the device boundary to the external world.

Referring to FIG. 1, all modern DRAM, SRAM and ROM designs have internal architectures with row (word) lines 5 and column (bit) lines 6 to allow the memory cells to tile a two dimensional area 1. One bit of data is stored at the intersection of each word and bit line. When a particular word line is enabled, all of the corresponding data bits are transferred onto the bit lines. Some prior art DRAMs take advantage of this organization to reduce the number of pins needed to transmit the address. The address of a given memory cell is split into two addresses, row and column, each of which can be multiplexed over a bus only half as wide as the memory cell address of the prior art would have required.

COMPARISON WITH PRIOR ART

Prior art memory systems have attempted to solve the problem of high speed access to memory with limited success. U.S. Pat. No. 3,821,715 (Hoff et.al.), was issued to Intel Corporation for the earliest 4-bit microprocessor. That patent describes a bus connecting a single central processing unit (CPU) with multiple RAMs and ROMs. That bus multiplexes addresses and data over a 4-bit wide bus and uses point-to-point control signals to select particular RAMs or ROMs. The access time is fixed and only a single processing element in permitted. There is no block-mode type of operation, and most important, not all of the interface signals between the devices are bused (the ROM and RAN control lines and the RAN select lines are point-to-point).

In U.S. Pat. No. 4,315,308 (Jackson), a bus connecting a single CPU to a bus interface unit is described. The invention uses multiplexed address, data, and control information over a single 16-bit wide bus. Block-mode operations are defined, with the length of the block sent as part of the control sequence. In addition, variable access-time operations using a "stretch" cycle signal are provided. There are no multiple processing elements and no capability for multiple outstanding requests, and again, not all of the interface signals are bused.

In U.S. Pat. No. 4,449,207 (Kung, et. al.), a DRAM is described which multiplexes address and data on an internal bus. The external interface to this DRAM is conventional, with separate control, address and data connections.

In U.S. Pat. Nos. 4,764,846 and 4,706,166 (Go), a 3-D package arrangement of stacked die with connections along a single edge is described. Such packages are difficult to use because of the point-to-point wiring required to interconnect conventional memory devices with processing elements. Both patents describe complex schemes for solving these problems. No attempt is made to solve the problem by changing the interface.

In U.S. Pat. No. 3,969,706 (Proebsting, et. al.), the current state-of-the-art DRAM interface is described. The address is two-way multiplexed, and there are separate pins for data and control (RAS, CAS, WE, CS). The number of pins grows with the size of the DRAM, and many of the connections must be made point-to-point in a memory system using such DRAMs.

There are many backplane buses described in the prior art, but not in the combination described or having the features of this invention. Many backplane buses multiplex addresses and data on a single bus (e.g., the NU bus). ELXSI and others have implemented split-transaction buses (U.S. Pat. Nos. 4,595,923 and 4,481,625 (Roberts)). ELXSI has also implemented a relatively low-voltage-swing current-mode ECL driver (approximately 1 V swing). Address-space registers are implemented on most backplane buses, as is some form of block mode operation.

Nearly all modern backplane buses implement some type of arbitration scheme, but the arbitration scheme used in this invention differs from each of these. U.S. Pat. No. 4,837,682 (Culler), U.S. Pat. No. 4,818,985 (Ikeda), U.S. Pat. No.

4,779,089 (Theus) and U.S. Pat. No. 4,745,548 (Blahut) describe prior art schemes. All involve either log N extra signals, (Theus, Blahut), where N is the number of potential bus requesters, or additional delay to get control of the bus (Ikeda, Culler). None of the buses described in patents or other literature use only bused connections. All contain some point-to-point connections on the backplane. None of the other aspects of this invention such as power reduction by fetching each data block from a single device or compact and low-cost 3-D packaging even apply to backplane buses.

The clocking scheme used in this invention has not been used before and in fact would be difficult to implement in backplane buses due to the signal degradation caused by connector stubs. U.S. Pat. No. 4,247,817 (Heller) describes a clocking scheme using two clock lines, but relies on ramp-shaped clock signals in contrast to the normal rise-time signals used in the present invention.

In U.S. Pat. No. 4,646,270 (Voss), a video RAM is described which implements a parallel-load, serial-out shift register on the output of a DRAM. This generally allows greatly improved bandwidth (and has been extended to 2, 4 and greater width shift-out paths.) The rest of the interfaces to the DRAM (RAS, CAS, multiplexed address, etc.) remain the same as for conventional DRAMS.

One object of the present invention is to use a new bus interface built into semiconductor devices to support high-speed access to large blocks of data from a single memory device by an external user of the data, such as a microprocessor, in an efficient and cost-effective manner.

Another object of this invention is to provide a clocking scheme to permit high speed clock signals to be sent along the bus with minimal clock skew between devices.

Another object of this invention is to allow mapping out defective memory devices or portions of memory devices.

Another object of this invention is to provide a method for distinguishing otherwise identical devices by assigning a unique identifier to each device.

Yet another object of this invention is to provide a method for transferring address, data and control information over a relatively narrow bus and to provide a method of bus arbitration when multiple devices seek to use the bus simultaneously.

Another object of this invention is to provide a method of distributing a high-speed memory cache within the DRAM chips of a memory system which is much more effective than previous cache methods.

Another object of this invention is to provide devices, especially DRAMs, suitable for use with the bus architecture of the invention.

SUMMARY OF INVENTION

The present invention includes a memory subsystem comprising at least two semiconductor devices, including at least one memory device, connected in parallel to a bus, where the bus includes a plurality of bus lines for carrying substantially all address, data and control information needed by said memory devices, where the control information includes device-select information and the bus has substantially fewer bus lines than the number of bits in a single address, and the bus carries device-select information without the need for separate device-select lines connected directly to individual devices.

Referring to FIG. 2, a standard DRAM 13, 14, ROM (or SRAM) 12, microprocessor CPU 11, I/O device, disk controller or other special purpose device such as a high speed switch is modified to use a wholly bus-based interface rather than the prior art combination of point-to-point and bus-based wiring used with conventional versions of these devices. The new bus includes clock signals, power and multiplexed address, data and control signals. In a preferred implementation, 8 bus data lines and an AddressValid bus line carry address, data and control information for memory addresses up to 40 bits wide. Persons skilled in the art will recognize that 16 bus data lines or other numbers of bus data lines can be used to implement the teaching of this invention. The new bus is used to connect elements such as memory, peripheral, switch and processing units.

In the system of this invention, DRAMs and other devices receive address and control information over the bus and transmit or receive requested data over the same bus. Each memory device contains only a single bus interface with no other signal pins. Other devices that may be included in the system can connect to the bus and other non-bus lines, such as input/output lines. The bus supports large data block transfers and split transactions to allow a user to achieve high bus utilization. This ability to rapidly read or write a large block of data to one single device at a time is an important advantage of this invention.

The DRAMs that connect to this bus differ from conventional DRAMs in a number of ways. Registers are provided which may store control information, device identification, device-type and other information appropriate for the chip such as the address range for each independent portion of the device. New bus interface circuits must be added and the internals of prior art DRAM devices need to be modified so they can provide and accept data to and from the bus at the peak data rate of the bus. This requires changes to the column access circuitry in the DRAM, with only a minimal increase in die size. A circuit is provided to generate a low skew internal device clock for devices on the bus, and other circuits provide for demultiplexing input and multiplexing output signals.

High bus bandwidth is achieved by running the bus at a very high clock rate (hundreds of MHz). This high clock rate is made possible by the constrained environment of the bus. The bus lines are controlled-impedance, doubly-terminated lines. For a data rate of 500 MHz, the maximum bus propagation time is less than 1 ns (the physical bus length is about 10 cm). In addition, because of the packaging used, the pitch of the pins can be very close to the pitch of the pads. The loading on the bus resulting from the individual devices is very small. In a preferred implementation, this generally allows stub capacitances of 1–2 pF and inductances of 0.5–2 nH. Each device 15, 16, 17, shown in FIG. 3, only has pins on one side and these pins connect directly to the bus 18. A transceiver device 19 can be included to interface multiple units to a higher order bus through pins 20.

A primary result of the architecture of this invention is to increase the bandwidth of DRAM access. The invention also reduces manufacturing and production costs, power consumption, and increases packing density and system reliability.

BRIEF DESCRIPTION OF THE DRAWINGS

FIG. 1 is a diagram which illustrates the basic 2-D organization of memory devices.

FIG. 2 is a schematic block diagram which illustrates the parallel connection of all bus lines and the serial Reset line to each device in the system.

FIG. 3 is a perspective view of a system of the invention which illustrates the 3-D packaging of semiconductor devices on the primary bus.

FIG. 4 shows the format of a request packet.

FIG. 5 shows the format of a retry response from a slave.

FIG. 6 shows the bus cycles after a request packet collision occurs on the bus and how arbitration is handled.

FIGS. 7a and 7b show the timing whereby signals from two devices can overlap temporarily and drive the bus at the same time.

FIGS. 8a and 8b show the connection and timing between bus clocks and devices on the bus.

FIG. 9 is a perspective view showing how transceivers can be used to connect a number of bus units to a transceiver bus.

DETAILED DESCRIPTION

Figure 10:
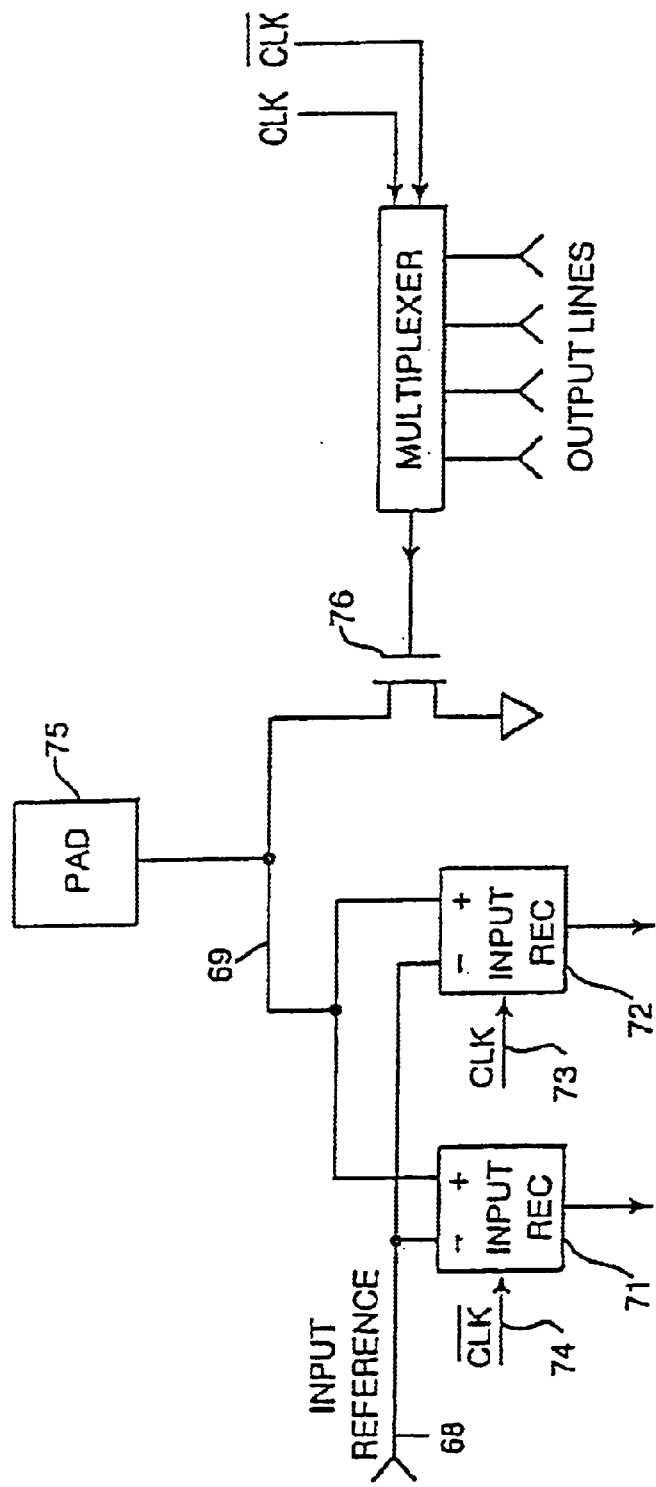
FIG. 10 is a block and schematic diagram of input/output circuitry used to connect devices to the bus.

The present invention is designed to provide a high speed, multiplexed bus for communication between processing devices and memory devices and to provide devices adapted for use in the bus system. The invention can also be used to connect processing devices and other devices, such as I/O interfaces or disk controllers, with or without memory devices on the bus. The bus consists of a relatively small number of lines connected in parallel to each device on the bus. The bus carries substantially all address, data and control information needed by devices for communication with other devices on the bus. In many systems using the present invention, the bus carries almost every signal between every device in the entire system. There is no need for separate device-select lines since device-select information for each device on the bus is carried over the bus. There is no need for separate address and data lines because address and data information can be sent over the same lines. Using the organization described herein, very large addresses (40 bits in the preferred implementation) and large data blocks (1024 bytes) can be sent over a small number of bus lines (8 plus one control line in the preferred implementation).

Virtually all of the signals needed by a computer system can be sent over the bus. Persons skilled in the art recognize that certain devices, such as CPUs, may be connected to other signal lines and possibly to independent buses, for example a bus to an independent cache memory, in addition to the bus of this invention. Certain devices, for example cross-point switches, could be connected to multiple, independent buses of this invention. In the preferred implementation, memory devices are provided that have no connections other than the bus connections described herein and CPUs are provided that use the bus of this invention as the principal, if not exclusive, connection to memory and to other devices on the bus.

All modern DRAM, SRAM and ROM designs have internal architectures with row (word) and column (bit) lines to efficiently tile a 2-D area. Referring to FIG. 1, one bit of data is stored at the intersection of each word line 5 and bit line 6. When a particular word line is enabled, all of the corresponding data bits are transferred onto the bit lines. This data, about 4000 bits at a time in a 4 MBit DRAM, is then loaded into column sense amplifiers 3 and held for use by the I/O circuits.

In the invention presented here, the data from the sense amplifiers is enabled 32 bits at a time onto an internal device bus running at approximately 125 MHz. This internal device bus moves the data to the periphery of the devices where the data is multiplexed into an 8-bit wide external bus interface, running at approximately 500 MHz.

The bus architecture of this invention connects master or bus controller devices, such as CPUs, Direct Memory Access devices (DMAs) or Floating Point Units (FPUs), and slave devices, such as DRAM, SRAM or ROM memory devices. A slave device responds to control signals; a master sends control signals. Persons skilled in the art realize that some devices may behave as both master and slave at various times, depending on the mode of operation and the state of the system. For example, a memory device will typically have only slave functions, while a DMA controller, disk controller or CPU may include both slave and master functions. Many other semiconductor devices, including I/O devices, disk controllers, or other special purpose devices such as high speed switches can be modified for use with the bus of this invention.

Figure 16:
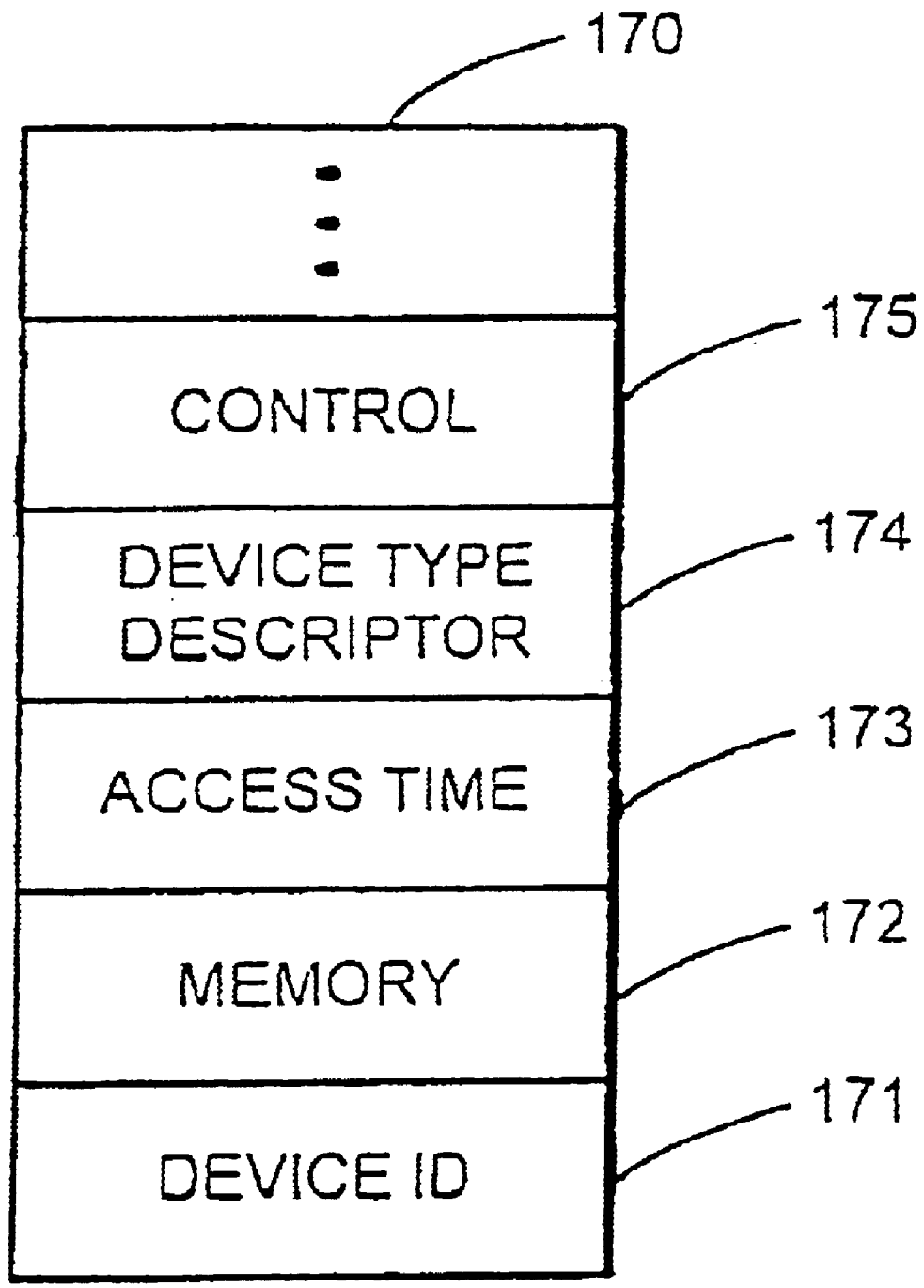
FIG. 16 is a block diagram representation of a set of internal registers within each device illustrated in FIG. 2.

With reference to FIG. 16, each semiconductor device contains a set of internal registers 170, preferably including a device identification (device register 171, a device-type descriptor register 174, control registers 175 and other registers containing other information relevant to that type of device. In a preferred implementation, semiconductor devices connected to the bus contain registers 172 which specify the memory addresses contained within that device and access-time registers 173 which store a set of one or more delay times at which the device can or should be available to send or receive data.

Most of these registers can be modified and preferably are set as part of an initialization sequence that occurs when the system is powered up or reset. During the initialization sequence each device on the bus is assigned a unique device ID number, which is stored is the device ID register 171. A bus master can then use these device ID numbers to access and set appropriate registers in other devices, including access-time to registers 173, control registers 175, and memory registers 172, to configure the system. Each slave may have one or several access-time registers 173 (four in a preferred embodiment) In a preferred embodiment, one access-time register in each slave is permanently or semi-permanently programmed with a fixed value to facilitate certain control functions. A preferred implementation of an initialization sequence is described below in more detail.

All information sent between master devices and slave devices is sent over the external bus, which, for example, may be 8 bits wide. This is accomplished by defining a protocol whereby a master device, such as a microprocessor, seizes exclusive control of the external bus (i.e., becomes the bus master) and initiates a bus transaction by sending a request packet (a sequence of bytes comprising address and control information) to one or more slave devices on the bus. An address can consist of 16 to 40 or more bits according to the teachings of this invention. Each slave on the bus must decode the request packet to see if that slave needs to respond to the packet. The slave that the packet is directed to must then begin any internal processes needed to carry out the requested bus transaction at the requested time. The requesting master may also need to transact certain internal processes before the bus transaction begins. After a specified access time the slave(s) respond by returning one or more bytes (8 bits) of data or by storing information made available from the bus. More than one access time can be provided to allow different types of responses to occur at different times.

A request packet and the corresponding bus access are separated by a selected number of bus cycles, allowing the bus to be used in the intervening bus cycles by the same or other masters for additional requests or brief bus accesses. Thus multiple, independent accesses are permitted, allowing maximum utilization of the bus for transfer of short blocks of data. Transfers of long blocks of data use the bus efficiently even without overlap because the overhead due to bus address, control and access times is small compared to the total time to request and transfer the block.

Device Address Mapping

Another unique aspect of this invention is that each memory device is a complete, independent memory subsystem with all the functionality of a prior art memory board in a conventional backplane-bus computer system. Individual memory devices may contain a single memory section or may be subdivided into more than one discrete memory section. Memory devices preferably include memory address registers for each discrete memory section. A failed memory device (or even a subsection of a device) can be "mapped out" with only the loss of a small fraction of the memory, maintaining essentially full system capability. Mapping out bad devices can be accomplished in two ways, both compatible with this invention.

The preferred method uses address registers in each memory device (or independent discrete portion thereof) to store information which defines the range of bus addresses to which this memory device will respond. This is similar to prior art schemes used in memory boards in conventional backplane bus systems. The address registers can include a single pointer, usually pointing to a block of known size, a pointer and a fixed or variable block size value or two pointers, one pointing to the beginning and one to the end (or to the "top" and "bottom") of each memory block. By appropriate settings of the address registers, a series of functional memory devices or discrete memory sections can be made to respond to a contiguous range of addresses, giving the system access to a contiguous block of good memory, limited primarily by the number of good devices connected to the bus. A block of memory in a first memory device or memory section can be assigned a certain range of addresses, then a block of memory in a next memory device or memory section can be assigned addresses starting with an address one higher (or lower, depending on the memory structure) than the last address of the previous block.

Preferred devices for use in this invention include device-type register information specifying the type of chip, including how much memory is available in what configuration on that device. A master can perform an appropriate memory test, such as reading and writing each memory cell in one or more selected orders, to test proper functioning of each accessible discrete portion of memory (based in part on information like device ID number and device-type) and write address values (up to 40 bits in the preferred embodiment, $10^{12}$ bytes), preferably contiguous, into device address-space registers. Non-functional or impaired memory sections can be assigned a special address value which the system can interpret to avoid using that memory.

The second approach puts the burden of avoiding the bad devices on the system master or masters. CPUs and DMA controllers typically have some sort of translation look-aside buffers (TLBS) which map virtual to physical (bus) addresses. With relatively simple software, the TLBs can be programmed to use only working memory (data structures describing functional memories are easily generated). For masters which don't contain TLBs (for example, a video display generator), a small, simple RAM can be used to map a contiguous range of addresses onto the addresses of the functional memory devices.

Either scheme works and permits a system to have a significant percentage of non-functional devices and still continue to operate with the memory which remains. This means that systems built with this invention will have much improved reliability over existing systems, including the ability to build systems with almost no field failures.

Bus

The preferred bus architecture of this invention comprises 11 signals: BusData[0:7]; AddrValid; Clk1 and Clk2; plus an input reference level and power and ground lines connected in parallel to each device. Signals are driven onto the bus during conventional bus cycles. The notation "Signal[i:j]" refers to a specific range of signals or lines, for example, BusData[0:7] means BusData0, BusData1, . . . , BusData7. The bus lines for BusData[0:7] signals form a byte-wide, multiplexed data/address/control bus. AddrValid is used to indicate when the bus is holding a valid address request, and instructs a slave to decode the bus data as an address and, if the address is included on that slave, to handle the pending request. The two clocks together provide a synchronized, high speed clock for all the devices on the bus. In addition to the bused signals, there is one other line (ResetIn, ResetOut) connecting each device in series for use during initialization to assign every device in the system a unique device ID number (described below in detail).

To facilitate the extremely high data rate of this external bus relative to the gate delays of the internal logic, the bus cycles are grouped into pairs of even/odd cycles. Note that all devices connected to a bus should preferably use the same even/odd labeling of bus cycles and preferably should begin operations on even cycles. This is enforced by the clocking scheme.

Protocol and Bus Operation

The bus uses a relatively simple, synchronous, split-transaction, block-oriented protocol for bus transactions. One of the goals of the system is to keep the intelligence concentrated in the masters, thus keeping the slaves as simple as possible (since there are typically many more slaves than masters). To reduce the complexity of the slaves, a slave should preferably respond to a request in a specified time, sufficient to allow the slave to begin or possibly complete a device-internal phase including any internal actions that must precede the subsequent bus access phase. The time for this bus access phase is known to all devices on the bus—each master being responsible for making sure that the bus will be free when the bus access begins. Thus the slaves never worry about arbitrating for the bus. This approach eliminates arbitration in single master systems, and also makes the slave-bus interface simpler.

In a preferred implementation of the invention, to initiate a bus transfer over the bus, a master sends out a request packet, a contiguous series of bytes containing address and control information. It is preferable to use a request packet containing an even number of bytes and also preferable to start each packet on an even bus cycle.

The device-select function is handled using the bus data lines. AddrValid is driven, which instructs all slaves to decode the request packet address, determine whether they contain the requested address, and if they do, provide the data back to the master (in the case of a read request) or accept data from the master (in the case of a write request) in a data block transfer. A master can also select a specific device by transmitting a device ID number in a request packet. In a preferred implementation, a special device ID number is chosen to indicate that the packet should be interpreted by all devices on the bus. This allows a master to broadcast a message, for example to set a selected control register of all devices with the same value.

The data block transfer occurs later at a time specified in the request packet control information, preferably beginning on an even cycle. A device begins a data block transfer almost immediately with a device-internal phase as the device initiates certain functions, such as setting up memory addressing, before the bus access phase begins. The time after which a data block is driven onto the bus lines is selected from values stored in slave access-time registers 173. The timing of data for reads and writes in preferably the same; the only difference is which device drives the bus. For reads, the slave drives the bus and the master latches the values from the bus. For writes the master drives the bus and the selected slave latches the values from the bus.

In a preferred implementation of this invention shown in FIG. 4, a request packet 22 contains 6 bytes of data—4.5 address bytes and 1.5 control bytes. Each request packet uses all nine bits of the multiplexed data/address lines (AddrValid 23+BusData[0:7] 24) for all six bytes of the request packet. Setting 23 AddrValid=1 in an otherwise unused even cycle indicates the start of an request packet (control information). In a valid request packet, AddrValid 27 must be 0 in the last byte. Asserting this signal in the last byte invalidates the request packet. This is used for the collision detection and arbitration logic (described below). Bytes 25–26 contain the first 35 address bits, Address[0:35]. The last byte contains AddrValid 27 (the invalidation switch) and 28, the remaining address bits, Address[36:39], and BlockSize[0:3] (control information).

The first byte contains two 4 bit fields containing control information, AccessType[0:3], an op code (operation code) which, for example, specifies the type of access, and Master [0:3], a position reserved for the master sending the packet to include its master ID number. Only master numbers 1 through 15 are allowed—master number 0 is reserved for special system commands. Any packet with Master[0:3]=0 is an invalid or special packet and is treated accordingly.

The AccessType field specifies whether the requested operation is a read or write and the type of access, for example, whether it is to the control registers or other parts of the device, such as memory. In a preferred implementation, AccessType[0] is a Read/Write switch: if it is a 1, then the operation calls for a read from the slave (the slave to read the requested memory block and drive the memory contents onto the bus); if it is a 0, the operation calls for a write into the slave (the slave to read data from the bus and write it to memory). AccessType[1:3] provides up to 8 different access types for a slave. AccessType[1:2] preferably indicates the timing of the response, which is stored in an access-time register, AccessRegN. The choice of access-time register can be selected directly by having a certain op code select that register, or indirectly by having a slave respond to selected op codes with pre-selected access times (see table below). The remaining bit, AccessType[3] may be used to send additional information about the request to the slaves.

One special type of access is control register access, which involves addressing a selected register in a selected slave. In the preferred implementation of this invention, AccessType[1:3] equal to zero indicates a control register request and the address field of the packet indicates the desired control register. For example, the most significant two bytes can be the device ID number (specifying which slave is being addressed) and the least significant three bytes can specify a register address and may also represent or include data to be loaded into that control register. Control register accesses are used to initialize the access-time registers, so it is preferable to use a fixed response time which can be preprogrammed or even hard wired, for example the value in AccessReg0, preferably 8 cycles. Control register access can also be used to initialize or modify other registers, including address registers.

The method of this invention provides for access mode control specifically for the DRAMs. One such access mode determines whether the access is page mode or normal RAS access. In normal mode (in conventional DRAMS and in this invention), the DRAM column sense amps or latches have been precharged to a value intermediate between logical 0 and 1. This precharging allows access to a row in the RAM to begin as soon as the access request for either inputs (writes) or outputs (reads) is received and allows the column sense amps to sense data quickly. In page mode (both conventional and in this invention), the DRAM holds the data in the column sense amps or latches from the previous read or write operation. If a subsequent request to access data is directed to the same row, the DRAM does not need to wait for the data to be sensed (it has been sensed already) and access time for this data is much shorter than the normal access time. Page mode generally allows much faster access to data but to a smaller block of data (equal to the number of sense amps). However, if the requested data is not in the selected row, the access time is longer than the normal access time, since the request must wait for the RAM to precharge before the normal mode access can start. Two access-time registers in each DRAM preferably contain the access times to be used for normal and for page-mode accesses, respectively.

The access mode also determines whether the DRAM should precharge the sense amplifiers or should save the contents of the sense amps for a subsequent page mode access. Typical settings are "precharge after normal access" and "save after page mode access" but "precharge after page mode access" or "save after normal access" are allowed, selectable modes of operation. The DRAM can also be set to precharge the sense amps if they are not accessed for a selected period of time.

In page mode, the data stored in the DRAM sense amplifiers may be accessed within much less time than it takes to read out data in normal mode (~10–20 nS vs. 40–100 nS). This data may be kept available for long periods. However, if these sense amps (and hence bit lines) are not precharged after an access, a subsequent access to a different memory word (row) will suffer a precharge time penalty of about 40–100 nS because the sense amps must precharge before latching in a new value.

The contents of the sense amps thus may be held and used as a cache, allowing faster, repetitive access to small blocks of data. DRAM-based page-mode caches have been attempted in the prior art using conventional DRAM organizations but they are not very effective because several chips are required per computer word. Such a conventional page-mode cache contains many bits (for example, 32 chips×4 Kbits) but has very few independent storage entries.

In other words, at any given point in time the sense amps hold only a few different blocks or memory "locales" (a single block of 4K words, in the example above). Simulations have shown that upwards of 100 blocks are required to achieve high hit rates (>90% of requests find the requested data already in cache memory) regardless of the size of each block. See, for example, Anant Agarwal, et. al., "An Analytic Cache Model," *ACM Transactions on Computer Systems*, Vol. 7(2), pp. 184–215 (May 1989).

The organization of memory in the present invention allows each DRAM to hold one or more (4 for 4 MBit DRAMS) separately-addressed and independent blocks of data. A personal computer or workstation with 100 such DRAMs (i.e. 400 blocks or locales) can achieve extremely high, very repeatable hit rates (98–99% on average) as compared to the lower (50–80%), widely varying hit rates using DRAMS organized in the conventional fashion. Further, because of the time penalty associated with the deferred precharge on a "miss" of the page-mode cache, the conventional DRAM-based page-mode cache generally has been found to work less well than no cache at all.

For DRAM slave access, the access types are preferably used in the following way:

| AccessType [1:3] | Use | AccessTime |
| --- | --- | --- |
| 0 | Control Register Access | Fixed, 8[AccessReg0] |
| 1 | Unused | Fixed, 8[AccessReg0] |
| 2–3 | Unused | AccessReg1 |
| 4–5 | Page Mode DRAM access | AccessReg2 |
| 6–7 | Normal DRAM access | AccessReg3 |

Persons skilled in the art will recognize that a series of available bits could be designated as switches for controlling these access modes. For example:

AccessType[2]=page mode/normal switch
AccessType[3]=precharge/save-data switch

BlockSize[0:3] specifies the size of the data block transfer. If BlockSize[0] is 0, the remaining bits are the binary representation of the block size (0–7). If BlockSize[0] is 1, then the remaining bits give the block size as a binary power of 2, from 8 to 1024. A zero-length block can be interpreted as a special command, for example, to refresh a DRAM without returning any data, or to change the DRAM from page mode to normal access mode or vice-versa.

| BlockSize[0:2] | Number of Bytes in Block |
| --- | --- |
| 0–7 | 0–7 respectively |
| 8 | 8 |
| 9 | 16 |
| 10 | 32 |
| 11 | 64 |
| 12 | 128 |
| 13 | 256 |
| 14 | 512 |
| 15 | 1024 |

Persons skilled in the art will recognize that other block size encoding schemes or values can be used.

In most cases, a slave will respond at the selected access time by reading or writing data from or to the bus over bus lines BusData[0:7] and AddrValid will be at logical 0. In a preferred embodiment, substantially each memory access will involve only a single memory device, that is, a single block will be read from or written to a single memory device.

Retry Format

In some cases, a slave may not be able to respond correctly to a request, e.g., for a read or write. In such a situation, the slave should return an error message, sometimes called a N(o)ACK(nowledge) or retry message. The retry message can include information about the condition requiring a retry, but this increases system requirements for circuitry in both slave and masters. A simple message indicating only that an error has occurred allows for a less complex slave, and the master can take whatever action is needed to understand and correct the cause of the error.

For example, under certain conditions a slave might not be able to supply the requested data. During a page-mode access, the DRAM selected must be in page mode and the requested address must match the address of the data held in the sense amps or latches. Each DRAM can check for this match during a page-mode access. If no match is found, the DRAM begins precharging and returns a retry message to the master during the first cycle of the data block (the rest of the returned block is ignored). The master then must wait for the precharge time (which is set to accommodate the type of slave in question, stored in a special register, PreChargeReg), and then resend the request as a normal DRAM access (AccessType=6 or 7).

In the preferred form of the present invention, a slave signals a retry by driving AddrValid true at the time the slave was supposed to begin reading or writing data. A master which expected to write to that slave must monitor AddrValid during the write and take corrective action if it detects a retry message. FIG. 5 illustrates the format of a retry message 28 which is useful for read requests, consisting of 23 AddrValid=1 with Master[0:3]=0 in the first (even) cycle. Note that AddrValid is normally 0 for data block transfers and that there is no master 0 (only 1 through 15 are allowed). All DRAMs and masters can easily recognize such a packet as an invalid request packet, and therefore a retry message. In this type of bus transaction all of the fields except for Master[0:3] and AddrValid 23 may be used as information fields, although in the implementation described, the contents are undefined. Persons skilled in the art recognize that another method of signifying a retry message is to add a DataInvalid line and signal to the bus. This signal could be asserted in the case of a NACK.

Bus Arbitration

In the case of a single master, there are by definition no arbitration problems. The master sends request packets and keeps track of periods when the bus will be busy in response to that packet. The master can schedule multiple requests so that the corresponding data block transfers do not overlap.

The bus architecture of this invention is also useful in configurations with multiple masters. When two or more masters are on the same bus, each master must keep track of all the pending transactions, so each master knows when it can send a request packet and access the corresponding data block transfer. Situations will arise, however, where two or more masters send a request packet at about the same time and the multiple requests must be detected, then sorted out by some sort of bus arbitration.

There are many ways for each master to keep track of when the bus is and will be busy. A simple method is for each master to maintain a bus-busy data structure, for example by maintaining two pointers, one to indicate the earliest point in the future when the bus will be busy and the other to indicate the earliest point in the future when the bus will be free, that is, the end of the latest pending data block transfer. Using this information, each master can determine whether and when there is enough time to send a request packet (as described above under Protocol) before the bus becomes busy with another data block transfer and whether the corresponding data block transfer will interfere with pending bus transactions. Thus each master must read every request packet and update its bus-busy data structure to maintain information about when the bus is and will be free.

With two or more masters on the bus, masters will occasionally transmit independent request packets during the same bus cycle. Those multiple requests will collide as each such master drives the bus simultaneously with different information, resulting in scrambled request information and neither desired data block transfer. In a preferred form of the invention, each device on the bus seeking to write a logical 1 on a BusData or AddrValid line drives that line with a current sufficient to sustain a voltage greater than or equal to the high-logic value for the system. Devices do not drive lines that should have a logical 0; those lines are simply held at a voltage corresponding to a low-logic value. Each master tests the voltage on at least some, preferably all, bus data and the AddrValid lines so the master can detect a logical '1' where the expected level is '0' on a line that it does not drive during a given bus cycle but another master does drive.

Another way to detect collisions is to select one or more bus lines for collision signalling. Each master sending a request drives that line or lines and monitors the selected lines for more than the normal drive current (or a logical value of ">1"), indicating requests by more than one master. Persons skilled in the art will recognize that this can be implemented with a protocol involving BusData and AddrValid lines or could be implemented using an additional bus line.

In the preferred form of this invention, each master detects collisions by monitoring lines which it does not drive to see if another master is driving those lines. Referring to FIG. 4, the first byte of the request packet includes the number of each master attempting to use the bus (Master [0:3]). If two masters send packet requests starting at the same point in time, the master numbers will be logical "or"ed together by at least those masters, and thus one or both of the masters, by monitoring the data on the bus and comparing what it sent, can detect a collision. For instance if requests by masters number 2 (0010) and 5 (0101) collide, the bus will be driven with the value Master[0:3]=7 (0010+ 0101=0111). Master number 5 will detect that the signal Master[2]=1 and master 2 will detect that Master[1] and Master[3]=1, telling both masters that a collision has occurred. Another example is masters 2 and 11, for which the bus will be driven with the value Master[0:3]=11 (0010+ 1011=1011), and although master 11 can't readily detect this collision, master 2 can. When any collision is detected, each master detecting a collision drives the value of AddrValid 27 in byte 5 of the request packet 22 to 1, which is detected by all masters, including master 11 in the second example above, and forces a bus arbitration cycle, described below.

Another collision condition may arise where master A sends a request packet in cycle 0 and master B tries to send a request packet starting in cycle 2 of the first request packet, thereby overlapping the first request packet. This will occur from time to time because the bus operates at high speeds, thus the logic in a second-initiating master may not be fast enough to detect a request initiated by a first master in cycle 0 and to react fast enough by delaying its own request. Master B eventually notices that it wasn't supposed to try to send a request packet (and consequently almost surely destroyed the address that master A was trying to send), and, as in the example above of a simultaneous collision, drives a 1 on AddrValid during byte 5 of the first request packet 27 forcing an arbitration. The logic in the preferred implementation is fast enough that a master should detect a request packet by another master by cycle 3 of the first request packet, so no master is likely to attempt to send a potentially colliding request packet later than cycle 2.

Slave devices do not need to detect a collision directly, but they must wait to do anything irrecoverable until the last byte (byte 5) is read to ensure that the packet is valid. A request packet with Master[0:3] equal to 0 (a retry signal) is ignored and does not cause a collision. The subsequent bytes of such a packet are ignored.

To begin arbitration after a collision, the masters wait a preselected number of cycles after the aborted request packet (4 cycles in a preferred implementation), then use the next free cycle to arbitrate for the bus (the next available even cycle in the preferred implementation). Each colliding master signals to all other colliding masters that it seeks to send a request packet, a priority is assigned to each of the colliding masters, then each master is allowed to make its request in the order of that priority.

FIG. 6 illustrates one preferred way of implementing this arbitration. Each colliding master signals its intent to send a request packet by driving a single BusData line during a single bus cycle corresponding to its assigned master number (1–15 in the present example). During two-byte arbitration cycle 29, byte 0 is allocated to requests 1–7 from masters 1–7, respectively, (bit 0 is not used) and byte 1 is allocated to requests 8–15 from masters 8–15, respectively. At least one device and preferably each colliding master reads the values on the-bus during the arbitration cycles to determine and store which masters desire to use the bus. Persons skilled in the art will recognize that a single byte can be allocated for arbitration requests if the system includes more bus lines than masters. More than 15 masters can be accommodated by using additional bus cycles.

A fixed priority scheme (preferably using the master numbers, selecting lowest numbers first) is then used to prioritize, then sequence the requests in a bus arbitration queue which is maintained by at least one device. These requests are queued by each master in the bus-busy data structure and no further requests are allowed until the bus arbitration queue is cleared. Persons skilled in the art will recognize that other priority schemes can be used, including assigning priority according to the physical location of each master.

System Configuration/Reset

In the bus-based system of this invention, a mechanism is provided to give each device on the bus a unique device identifier (device ID) after power-up or under other conditions as desired or needed by the system. A master can then use this device ID to access a specific device, particularly to set or modify registers 170 of the specified device, including the control and address registers. In the preferred embodiment, one master is assigned to carry out the entire system configuration process. The master provides a series of unique device ID numbers for each unique device connected to the bus system. In the preferred embodiment, each device connected to the bus contains a special device-type register which specifies the type of device, for instance CPU, 4 MBit memory, 64 MBit memory or disk controller. The configuration master should check each device, determine the device type and set appropriate control registers, including access-time registers 173. The configuration master should check each memory device and set all appropriate memory address registers 172.

One means to set up unique device ID numbers is to have each device to select a device ID in sequence and store the value in an internal device ID register 171. For example, a master can pass sequential device ID numbers through shift registers in each of a series of devices, or pass a token from device to device whereby the device with the token reads in device ID information from another line or lines. In a preferred embodiment, device ID numbers are assigned to devices according to their physical relationship, for instance, their order along the bus.

In a preferred embodiment of this invention, the device ID setting is accomplished using a pair of pins on each device, ResetIn and ResetOut. These pins handle normal logic signals and are used only during device ID configuration. On each rising edge of the clock, each device copies ResetIn (an input) into a four-stage reset shift register. The output of the reset shift register is connected to ResetOut, which in turn connects to ResetIn for the next sequentially connected device. Substantially all devices on the bus are thereby daisy-chained together. A first reset signal, for example, while ResetIn at a device is a logical 1, or when a selected bit of the reset shift register goes from zero to non-zero, causes the device to hard reset, for example by clearing all internal registers and resetting all state machines. A second reset signal, for example, the falling edge of ResetIn combined with changeable values on the external bus, causes that device to latch the contents of the external bus into the internal device ID register (Device[0:7]).

Figure 14:
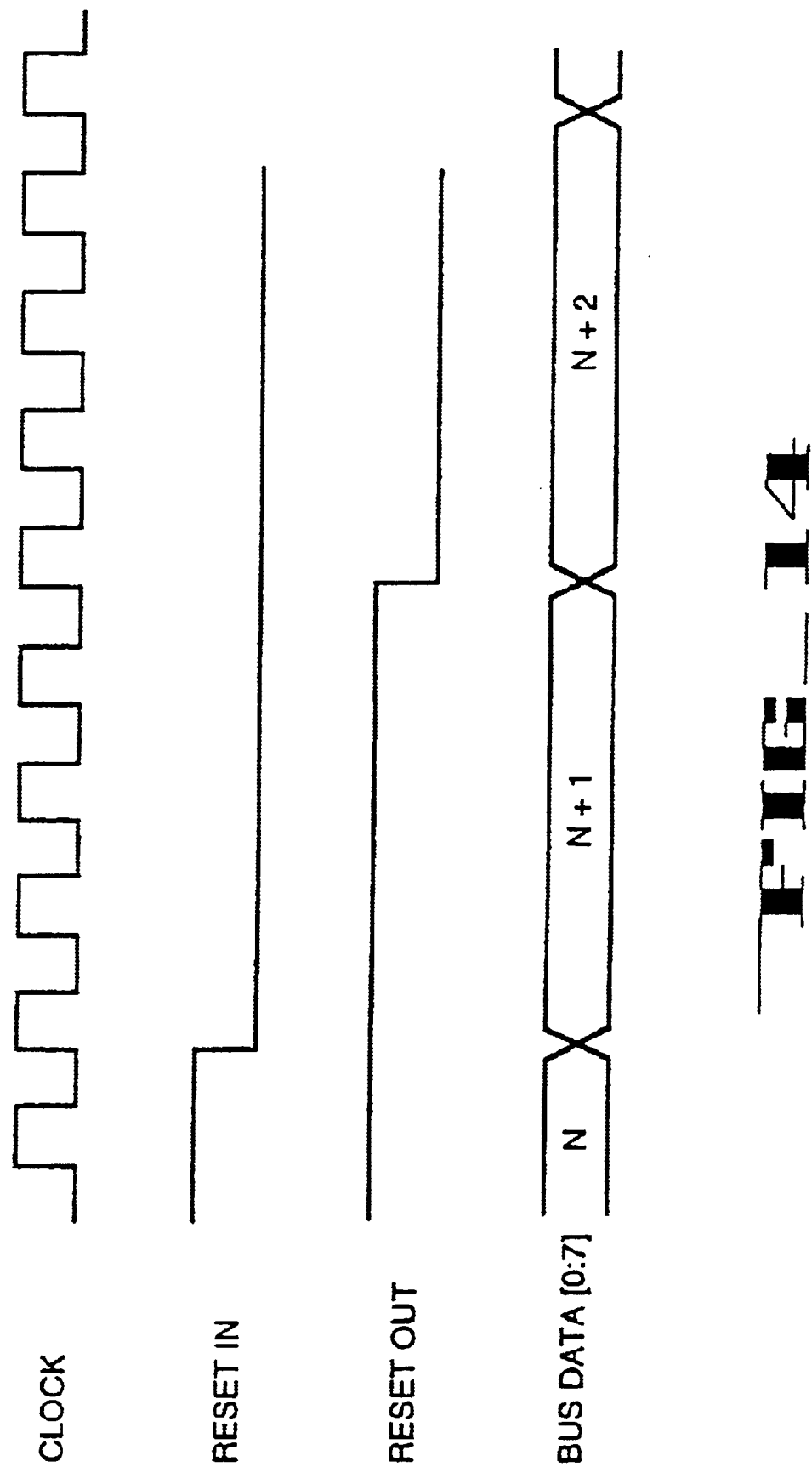
FIG. 14 is timing diagram of a preferred means of implementing the reset procedure of this invention.

To reset all devices on a bus, a master sets the ResetIn line of the first device to a "1" for long enough to ensure that all devices on the bus have been reset (4 cycles times the number of devices—note that the maximum number of devices on the preferred bus configuration is 256 (8 bits), so that 1024 cycles is always enough time to reset all devices.) Then ResetIn is dropped to "0" and the BusData lines are driven with the first followed by successive device ID numbers, changing after every 4 clock pulses. Successive devices set those device ID numbers into the corresponding device ID register as the falling edge of ResetIn propagates through the shift registers of the daisy-chained devices. FIG. 14 shows ResetIn at a first device going low while a master drives a first device ID onto the bus data lines BusData[0:3]. The first device then latches in that first device ID. After four clock cycles, the master changes BusData[0:3] to the next device ID number and ResetOut at the first device goes low, which pulls ResetIn for the next daisy-chained device low, allowing the next device to latch in the next device ID number from BusData[0:3]. In the preferred embodiment, one master is assigned device ID 0 and it is the responsibility of that master to control the ResetIn line and to drive successive device ID numbers onto the bus at the appropriate times. In the preferred embodiment, each device waits two clock cycles after ResetIn goes low before latching in a device ID number from BusData[0:3].

Persons skilled in the art recognize that longer device ID numbers could be distributed to devices by having each device read in multiple bytes from the bus and latch the values into the device ID register. Persons skilled in the art also recognize that there are alternative ways of getting device ID numbers to unique devices. For instance, a series of sequential numbers could be clocked along the ResetIn line and at a certain time each device could be instructed to latch the current reset shift register value into the device ID register.

The configuration master should choose and set an access time in each access-time register 173 in each slave to a period sufficiently long to allow the slave to perform an actual, desired memory-access. For example, for a normal DRAM access, this time must be longer than the row address strobe (RAS) access time. If this condition is not met, the slave may not deliver the correct data. The value stored in a slave access-time register 173 is preferably one-half the number of bus cycles for which the slave device should wait before using the bus in response to a request. Thus an access time value of '1' would indicate that the slave should not access the bus until at least two cycles after the last byte of the request packet has been received. The value of Access-Reg0 is preferably fixed at 8 (cycles) to facilitate access to control registers.

The bus architecture of this invention can include more than one master device. The reset or initialization sequence should also include a determination of whether there are multiple masters on the bus, and if so to assign unique master ID numbers to each. Persons skilled in the art will recognize that there are many ways of doing this. For instance, the master could poll each device to determine what type of device it is, for example, by reading a special register then, for each master device, write the next available master ID number into a special register.

ECC

Error detection and correction ("ECC") methods well known in the art can be implemented in this system. ECC information typically is calculated for a block of data at the time that block of data is first written into memory. The data block usually has an integral binary size, e.g. 256 bits, and the ECC information uses significantly fewer bits. A potential problem arises in that each binary data block in prior art schemes typically is stored with the ECC bits appended, resulting in a block size that is not an integral binary power.

In a preferred embodiment of this invention, ECC information is stored separately from the corresponding data, which can then be stored in blocks having integral binary size. ECC information and corresponding data can be stored, for example, in separate DRAM devices. Data can be read without ECC using a single request packet, but to write or read error-corrected data requires two request packets, one for the data and a second for the corresponding ECC information. ECC information may not always be stored permanently and in some situations the ECC information may be available without sending a request packet or without a bus data block transfer.

In a preferred embodiment, a standard data block size can be selected for use with ECC, and the ECC method will determine the required number of bits of information in a corresponding ECC block. RAMs containing ECC information can be programmed to store an access time that in equal to: (1) the access time of the normal RAM (containing data) plus the time to access a standard data block (for corrected data) minus the time to send a request packet (6 bytes); or (2) the access time of a normal RAM minus the time to access a standard ECC block minus the time to send a request packet. To read a data block and the corresponding ECC block, the master simply issues a request for the data immediately followed by a request for the ECC block. The ECC RAM will wait for the selected access time then drive its data onto the bus right after (in case (1) above)) the data RAM has finished driving out the data block. Persons skilled in the art will recognize that the access time described in case (2) above can be used to drive ECC data before the data is driven onto the bus lines and will recognize that writing data can be done by analogy with the method described for a read. Persons skilled in the art will also recognize the adjustments that must be made in the bus-busy structure and the request packet arbitration methods of this invention in order to accommodate these paired ECC requests.

Since this system is quite flexible, the system designer can choose the size of the data blocks and the number of ECC bits using the memory devices of this invention. Note that the data stream on the bus can be interpreted in various ways. For instance the sequence can be $2^n$ data bytes followed by $2^m$ ECC bytes (or vice versa), or the sequence can be $2^k$ iterations of 8 data bytes plus 1 ECC byte. Other information, such as information used by a directory-based cache coherence scheme, can also be managed this way. See, for example, Anant Agarwal, et al., "Scaleable Directory Schemes for Cache Consistency," 15th *International Symposium on Computer Architecture,* June 1988, pp. 280–289. Those skilled in the art will recognize alternative methods of implementing ECC schemes that are within the teachings of this invention.

Low Power 3-D Packaging

Another major advantage of this invention is that it drastically reduces the memory system power consumption. Nearly all the power consumed by a prior art DRAM is dissipated in performing row access. By using a single row access in a single RAM to supply all the bits for a block request (compared to a row-access in each of multiple RAMs in conventional memory systems) the power per bit can be made very small. Since the power dissipated by memory devices using this invention is significantly reduced, the devices potentially can be placed much closer together than with conventional designs.

The bus architecture of this invention makes possible an innovative 3-D packaging technology. By using a narrow, multiplexed (time-shared) bus, the pin count for an arbitrarily large memory device can be kept quite small—on the order of 20 pins. Moreover, this pin count can be kept constant from one generation of DRAM density to the next. The low power dissipation allows each package to be smaller, with narrower pin pitches (spacing between the IC pins). With current surface mount technology supporting pin pitches as low as 20 mils, all off-device connections can be implemented on a single edge of the memory device; Semiconductor die useful in this invention preferably have connections or pads along one edge of the die which can then be wired or otherwise connected to the package pins with wires having similar lengths. This geometry also allows for very short leads, preferably with an effective lead length of less than 4 mm. Furthermore, this invention uses only bused interconnections, i.e., each pad on each device is connected by the bus to the corresponding pad of each other device.

The use of a low pin count and an edge-connected bus permits a simple 3-D package, whereby the devices are stacked and the bus is connected along a single edge of the stack. The fact that all of the signals are bused is important for the implementation of a simple 3-D structure. Without this, the complexity of the "backplane" would be too difficult to make cost effectively with current technology. The individual devices in a stack of the present invention can be packed quite tightly because of the low power dissipated by the entire memory system, permitting the devices to be stacked bumper-to-bumper or top to bottom. Conventional plastic-injection molded small outline (SO) packages can be used with a pitch of about 2.5 mm (100 mils), but the ultimate limit would be the device die thickness, which is about an order of magnitude smaller, 0.2–0.5 mm using current wafer technology.

Bus Electrical Description

By using devices with very low power dissipation and close physical packing, the bus can be made quite short, which in turn allows for short propagation times and high data rates. The bus of a preferred embodiment of the present invention consists of a set of resistor-terminated controlled impedance transmission lines which can operate up to a data rate of 500 MHz (2 ns cycles). The characteristics of the transmission lines are strongly affected by the loading caused by the DRAMs (or other slaves) mounted on the bus. These devices add lumped capacitance to the lines which both lowers the impedance of the lines and decreases the transmission speed. In the loaded environment, the bus impedance is likely to be on the order of 25 ohms and the propagation velocity about c/4 (c=the speed of light) or 7.5 cm/ns. To operate at a 2 ns data rate, the transit time on the bus should preferably be kept under 1 ns, to leave 1 ns for the setup and hold time of the input receivers (described below) plus clock skew. Thus the bus lines must be kept quite short, under about 8 cm for maximum performance. Lower performance systems may have much longer lines, e.g. a 4 ns bus may have 24 cm lines (3 ns transit time, 1 ns setup and hold time).

In the preferred embodiment, the bus uses current source drivers. Each output must be able to sink 50 mA, which provides an output swing of about 500 mV or more. In the preferred embodiment of this invention, the bus is active low. The unasserted state (the high value) is preferably considered a logical zero, and the asserted value (low state) is therefore a logical 1. Those skilled in the art understand that the method of this invention can also be implemented using the opposite logical relation to voltage. The value of the unasserted state is set by the voltage on the termination resistors, and should be high enough to allow the outputs to act as current sources, while being as low as possible to reduce power dissipation. These constraints may yield a termination voltage about 2V above ground in the preferred implementation. Current source drivers cause the output voltage to be proportional to the sum of the sources driving the bus.

Referring to FIGS. 7a and 7b, although there is no stable condition where two devices drive the bus at the same time, conditions can arise because of propagation delay on the wires where one device, A 41, can start driving its part of the bus 44 while the bus is still being driven by another device, B 42 (already asserting a logical 1 on the bus) In a system using current drivers, when B 42 is driving the bus (before time 46), the value at points 44 and 45 is logical 1. If B 42 switches off at time 46 just when A 41 switches on, the additional drive by device A 41 causes the voltage at the output 44 of A 41 to briefly below the normal value. The voltage returns to its normal value at time 47 when the effect of device B 42 turning off is felt. The voltage at point 45 goes to logical 0 when device B 42 turns off, then drops at time 47 when the effect of device A 41 turning on is felt. Since the logical 1 driven by current from device A 41 is propagated irrespective of the previous value on the bus, the value on the bus is guaranteed to settle after one time of flight ($t_f$) delay, that is, the time it takes a signal to propagate from one end of the bus to the other. If a voltage drive was used (as in ECL wired-ORing), a logical 1 on the bus (from device B 42 being previously driven) would prevent the transition put out by device A 41 being felt at the most remote part of the system, e.g., device 43, until the turnoff waveform from device B 42 reached device A 41 plus one time of flight delay, giving a worst case settling time of twice the time of flight delay.

Clocking

Clocking a high speed bus accurately without introducing error due to propagation delays can be implemented by having each device monitor two bus clock signals and then derive internally a device clock, the true system clock. The bus clock information can be sent on one or two lines to provide a mechanism for each bused device to generate an internal device clock with zero skew relative to all the other device clocks. Referring to FIG. 8a, in the preferred implementation, a bus clock generator 50 at one end of the bus propagates an early bus clock signal in one direction along the bus, for example on line 53 from right to left, to the far end of the bus. The same clock signal then is passed through the direct connection shown to a second line 54, and returns as a late bus clock signal along the bus from the far and to the origin, propagating from left to right. A single bus clock line can be used if it is left unterminated at the far end of the bus, allowing the early bus clock signal to reflect back along the same line as a late bus clock signal.

FIG. 8b illustrates how each device 51, 52 receives each of the two bus clock signals at a different time (because of propagation delay along the wires), with constant midpoint in time between the two bus clocks along the bus. At each device 51, 52, the rising edge 55 of Clock1 53 is followed by the rising edge 56 of Clock2 54. Similarly, the falling edge 57 of Clock1 53 is followed by the falling edge 58 of Clock2 54. This waveform relationship is observed at all other devices along the bus. Devices which are closer to the clock generator have a greater separation between Clock1 and Clock2 relative to devices farther from the generator because of the longer time required for each clock pulse to traverse the bus and return along line 54, but the midpoint in time 59, 60 between corresponding rising or falling edges is fixed because, for any given device, the length of each clock line between the far end of the bus and that device is equal. Each device must sample the two bus clocks and generate its own internal device clock at the midpoint of the two.

Clock distribution problems can be further reduced by using a bus clock and device clock rate equal to the bus cycle data rate divided by two, that is, the bus clock period is twice the bus cycle period. Thus a 500 MHz bus preferably uses a 250 MHz clock rate. This reduction in frequency provides two benefits. First it makes all signals on the bus have the same worst case data rates—data on a 500 MHz bus can only change every 2 ns. Second, clocking at half the bus cycle data rate makes the labeling of the odd and even bus cycles trivial, for example, by defining even cycles to be those when the internal device clock is 0 and odd cycles when the internal device clock is 1.

Multiple Buses

The limitation on bus length described above restricts the total number of devices that can be placed on a single bus. Using 2.5 mm spacing between devices, a single 8 cm bus will hold about 32 devices. Persons skilled in the art will recognize certain applications of the present invention wherein the overall data rate on the bus is adequate but memory or processing requirements necessitate a much larger number of devices (many more than 32). Larger systems can easily be built using the teachings of this invention by using one or more memory subsystems, designated primary bus units, each of which consists of two or more devices, typically 32 or close to the maximum allowed by bus design requirements, connected to a transceiver device.

Referring to FIG. 9, each primary bus unit can be mounted on a single circuit board 66, sometimes called a memory stick. Each transceiver device 19 in turn connects to a transceiver bus 65, similar or identical in electrical and other respects to the primary bus 18 described at length above. In a preferred implementation, all masters are situated on the transceiver bus so there are no transceiver delays between masters and all memory devices are on primary bus units so that all memory accesses experience an equivalent transceiver delay, but persons skilled in the art will recognize how to implement systems which have masters on more than one bus unit and memory devices on the transceiver bus as well as on primary bus units. In general, each teaching of this invention which refers to a memory device can be practiced using a transceiver device and one or more memory devices on an attached primary bus unit. Other devices, generically referred to as peripheral devices, including disk controllers, video controllers or I/O devices can also be attached to either the transceiver bus or a primary bus unit, as desired. Persons skilled in the art will recognize how to use a single primary bus unit or multiple primary bus units as needed with a transceiver bus in certain system designs.

The transceivers are quite simple in function. They detect request packets on the transceiver bus and transmit them to their primary bus unit. If the request packet calls for a write to a device on a transceiver's primary bus unit, that transceiver keeps track of the access time and block size and forwards all data from the transceiver bus to the primary bus unit during that time. The transceivers also watch their primary bus unit, forwarding any data that occurs there to the transceiver bus. The high speed of the buses means that the transceivers will need to be pipelined, and will require an additional one or two cycle delay for data to pass through the transceiver in either direction. Access times stored in masters on the transceiver bus must be increased to account for transceiver delay but access times stored in slaves on a primary bus unit should not be modified.

Persons skilled in the art will recognize that a more sophisticated transceiver can control transmissions to and from primary bus units. An additional control line, TrncvrRW can be bused to all devices on the transceiver bus, using that line in conjunction with the AddrValid line to indicate to all devices on the transceiver bus that the information on the data lines is: 1) a request packet, 2) valid data to a slave, 3) valid data from a slave, or 4) invalid data (or idle bus). Using this extra control line obviates the need for the transceivers to keep track of when data needs to be forwarded from its primary bus to the transceiver bus—all transceivers send all data from their primary bus to the transceiver bus whenever the control signal indicates condition 2) above. In a preferred implementation of this invention, if AddrValid and TrncvrRW are both low, there is no bus activity and the transceivers should remain in an idle state. A controller sending a request packet will drive AddrValid high, indicating to all devices on the transceiver bus that a request packet is being sent which each transceiver should forward to its primary bus unit. Each controller seeking to write to a slave should drive both AddrValid and TrncvrRW high, indicating valid data for a slave is present on the data lines. Each transceiver device will then transmit all data from the transceiver bus lines to each primary bus unit. Any controller expecting to receive information from a slave should also drive the TrncvrRW line high, but not drive AddrValid, thereby indicating to each transceiver to transmit any data coming from any slave on its primary local bus to the transceiver bus. A still more sophisticated transceiver would recognize signals addressed to or coming from its primary bus unit and transmit signals only at requested times.

An example of the physical mounting of the transceivers is shown in FIG. 9. One important feature of this physical arrangement is to integrate the bus of each transceiver 19 with the original bus of DRAMs or other devices 15, 16, 17 on the primary bus unit 66. The transceivers 19 have pins on two sides, and are preferably mounted flat on the primary bus unit with a first set of pins connected to primary bus 18. A second set of transceiver pins 20, preferably orthogonal to the first set of pins, are oriented to allow the transceiver 19 to be attached to the transceiver bus 65 in much the same way as the DRAMs were attached to the primary bus unit. The transceiver bus can be generally planar and in a different plane, preferably orthogonal to the plane of each primary bus unit. The transceiver bus can also be generally circular with primary bus units mounted perpendicular and tangential to the transceiver bus.

Using this two level scheme allows one to easily build a system that contains over 500 slaves (16 buses of 32 DRAMs each). Persons skilled in the art can modify the device ID scheme described above to accommodate more than 256 devices, for example by using a longer device ID or by using additional registers to hold some of the device ID. This scheme can be extended in yet a third dimension to make a second-order transceiver bus, connecting multiple transceiver buses by aligning transceiver bus units parallel to and on top of each other and busing corresponding signal lines through a suitable transceiver. Using such a second-order transceiver bus, one could connect many thousands of slave devices into what is effectively a single bus.

Device Interface

The device interface to the high-speed bus can be divided into three main parts. The first part is the electrical interface. This part includes the input receivers, bus drivers and clock generation circuitry. The second part contains the address comparison circuitry and timing registers. This part takes the input request packet and determines if the request is for this device, and if it is, starts the internal access and delivers the data to the pins at the correct time. The final part, specifically for memory devices such as DRAMs, is the DRAM column access path. This part needs to provide bandwidth into and out of the DRAM sense amps greater than the bandwidth provided by conventional DRAMs. The implementation of the electrical interface and DRAM column access path are described in more detail in the following sections. Persons skilled in the art recognize how to modify prior-art address comparison circuitry and prior-art register circuitry in order to practice the present invention.

Electrical Interface—Input/Output Circuitry

A block diagram of the preferred input/output circuit for address/data/control lines is shown in FIG. 10. This circuitry is particularly well-suited for use in DRAM devices but it can be used or modified by one skilled in the art for use in other devices connected to the bus of this invention. It consists of a set of input receivers 71, 72 and output driver 76 connected to input/output line 69 and pad 75 and circuitry to use the internal clock 73 and internal clock complement 74 to drive the input interface. The clocked input receivers take advantage of the synchronous nature of the bus. To further reduce the performance requirements for device input receivers, each device pin, and thus each bus line, is connected to two clocked receivers, one to sample the even cycle inputs, the other to sample the odd cycle inputs. By thus de-multiplexing the input 69 at the pin, each clocked amplifier is given a full 2 ns cycle to amplify the bus low-voltage-swing signal into a full value CMOS logic signal. Persons skilled in the art will recognize that additional clocked input receivers can be used within the teachings of this invention. For example, four input receivers could be connected to each device pin and clocked by a modified internal device clock to transfer sequential bits from the bus to internal device circuits, allowing still higher external bus speeds or still longer settling times to amplify the bus low-voltage-swing signal into a full value CMOS logic signal.

The output drivers are quite simple, and consist of a single NMOS pulldown transistor 76. This transistor is sized so that under worst case conditions it can still sink the 50 mA required by the bus. For 0.8 micron CMOS technology, the transistor will need to be about 200 microns long. Overall bus performance can be improved by using feedback techniques to control output transistor current so that the current through the device is roughly 50 mA under all operating conditions, although this is not absolutely necessary for proper bus operation. An example of one of many methods known to persons skilled in the art for using feedback techniques to control current is described in Hans Schumacher, et al., "CMOS Subnanosecond True-ECL Output Buffer," *J. Solid State Circuits,* Vol. 25 (1), pp. 150–154 (February 1990). Controlling this current improves performance and reduces power dissipation. This output driver which can be operated at 500 MHz, can in turn be controlled by a suitable multiplexer with two or more (preferably four) inputs connected to other internal chip circuitry, all of which can be designed according to well known prior art.

Figure 11:
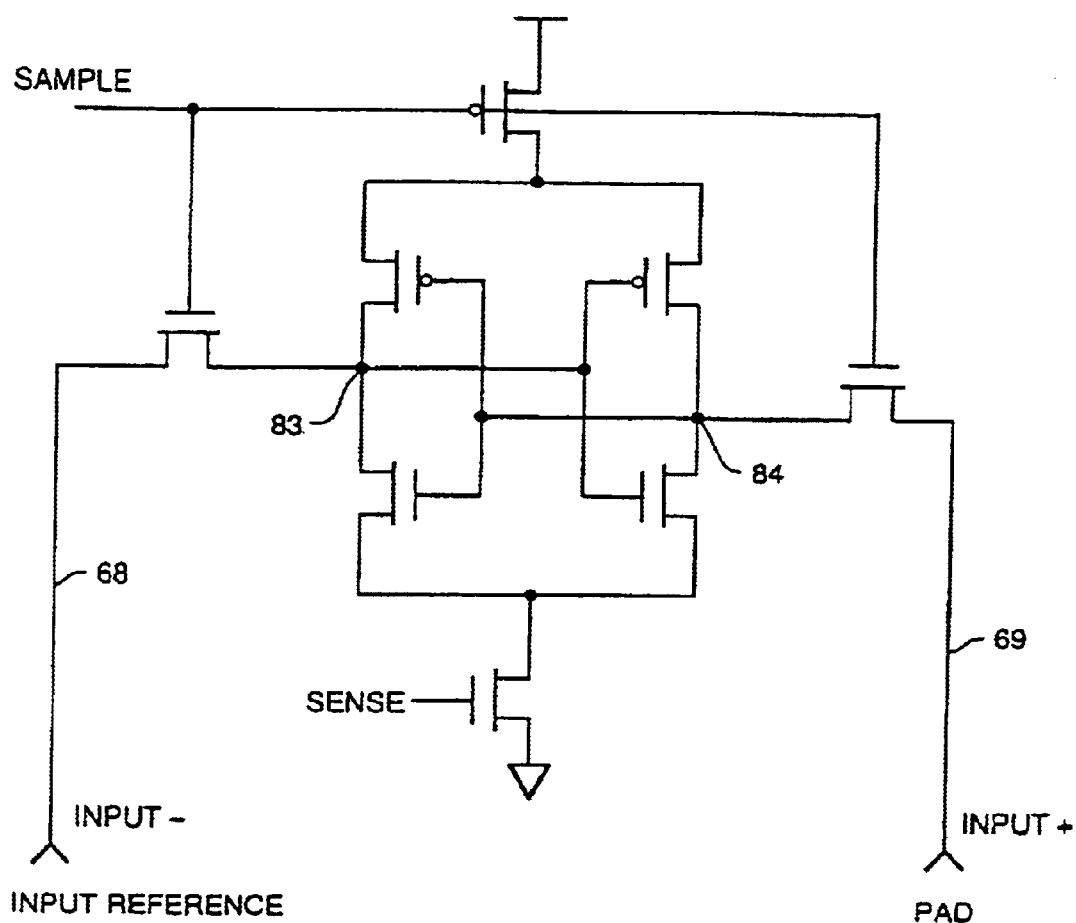
FIG. 11 is a schematic diagram of a clocked sense-amplifier used as a bus input receiver.

The input receivers of every slave must be able to operate during every cycle to determine whether the signal on the bus is a valid request packet. This requirement leads to a number of constraints on the input circuitry. In addition to requiring small acquisition and resolution delays, the circuits must take little or no DC power, little AC power and inject very little current back into the input or reference lines. The standard clocked DRAM sense amp shown in FIG. 11 satisfies all these requirements except the need for low input currents. When this sense amp goes from sense to sample, the capacitance of the internal nodes 83 and 84 in FIG. 11 is discharged through the reference line 68 and input 69, respectively. This particular current is small, but the sum of such currents from all the inputs into the reference lines summed over all devices can be reasonably large.

The fact that the sign of the current depends upon on the previous received data makes matters worse. One way to solve this problem is to divide the sample period into two phases. During the first phase, the inputs are shorted to a buffered version of the reference level (which may have an offset). During the second phase, the inputs are connected to the true inputs. This scheme does not remove the input current completely, since the input must still charge nodes 83 and 84 from the reference value to the current input value, but it does reduce the total charge required by about a factor of 10 (requiring only a 0.25V change rather than a 2.5V change). Persons skilled in the art will recognize that many other methods can be used to provide a clocked amplifier that will operate on very low input currents.

One important part of the input/output circuitry generates an internal device clock based on early and late bus clocks. Controlling clock skew (the difference in clock timing between devices) is important in a system running with 2 ns cycles, thus the internal device clock is generated so the input sampler and the output driver operate as close in time as possible to midway between the two bus clocks.

Figure 12:
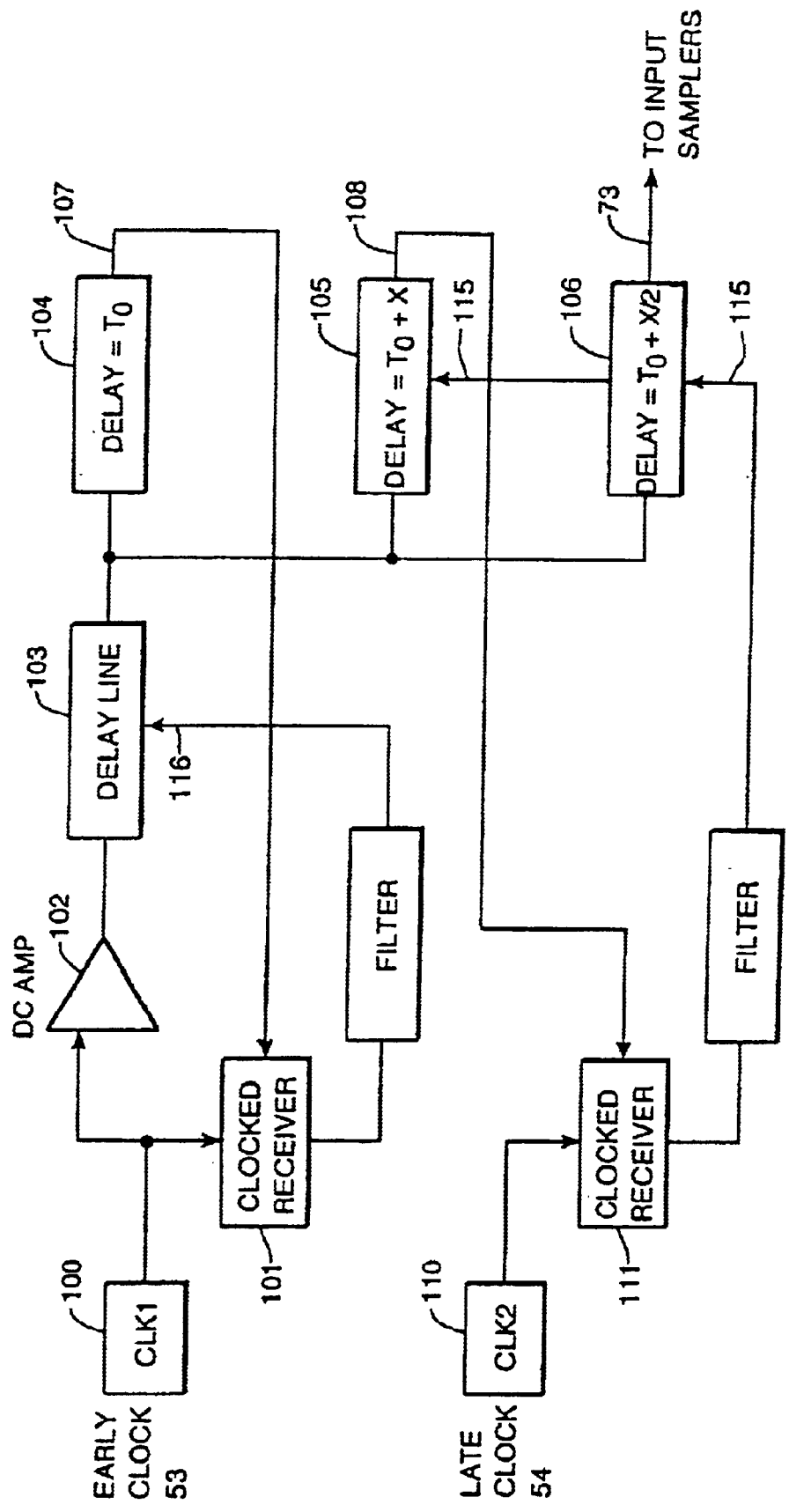
FIG. 12 is a block diagram showing how the internal device clock is generated from two bus clock signals using a set of adjustable delay lines.
Figure 13:
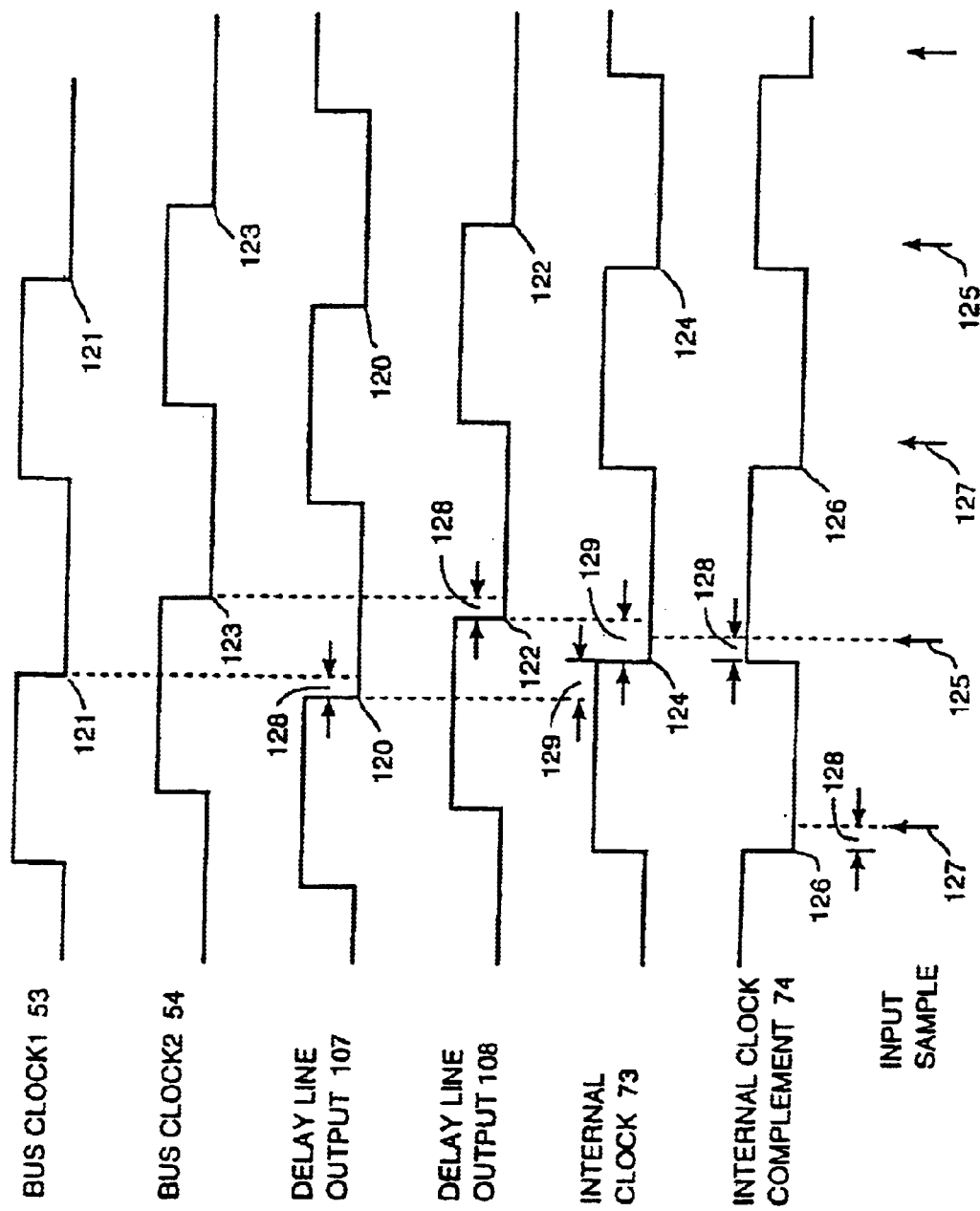
FIG. 13 is a timing diagram showing the relationship of signals in the block diagram of FIG. 12.

A block diagram of the internal device clock generating circuit is shown in FIG. 12 and the corresponding timing diagram in FIG. 13. The basic idea behind this circuit is relatively simple. A DC amplifier 102 is used to convert the small-swing bus clock into a full-swing CMOS signal. This signal is then fed into a variable delay line 103. The output of delay line 103 feeds three additional delay lines: 104 having a fixed delay; 105 having the same fixed delay plus a second variable delay; and 106 having the same fixed delay plus one half of the second variable delay. The outputs 107, 108 of the delay lines 104 and 105 drive clocked input receivers 101 and 111 connected to early and late bus clock inputs 100 and 110, respectively. These input receivers 101 and 111 have the same design as the receivers described above and shown in FIG. 11. Variable delay lines 103 and 105 are adjusted via feedback lines 116, 115 so that input receivers 101 and 111 sample the bus clocks just as they transition. Delay lines 103 and 105 are adjusted so that the falling edge 120 of output 107 precedes the falling edge 121 of the early bus clock, Clock1 53, by an amount of time 128 equal to the delay in input sampler 101. Delay line 108 is adjusted in the same way so that falling edge 122 precedes the falling edge 123 of late bus clock, Clock2 54, by the delay 128 in input sampler 111.

Since the outputs 107 and 108 are synchronized with the two bus clocks and the output 73 of the last delay line 106 is midway between outputs 107 and 108, that is, output 73 follows output 107 by the same amount of time 129 that output 73 precedes output 108, output 73 provides an internal device clock midway between the bus clocks. The falling edge 124 of internal device clock 73 precedes the time of actual input sampling 125 by one sampler delay. Note that this circuit organization automatically balances the delay in substantially all device input receivers 71 and 72 (FIG. 10), since outputs 107 and 108 are adjusted so the bus clocks are sampled by input receivers 101 and 111 just as the bus clocks transition.

In the preferred embodiment, two sets of these delay lines are used, one to generate the true value of the internal device clock 73, and the other to generate the complement 74 without adding any inverter delay. The dual circuit allows generation of truly complementary clocks, with extremely small skew. The complement internal device clock is used to clock the 'event' input receivers to sample at time 127, while the true internal device clock is used to clock the 'odd' input receivers to sample at time 125. The true and complement internal device clocks 73 and 74 are also used to select which data is driven to the output drivers. The gate delay between the internal device clock and output circuits driving the bus is slightly greater than the corresponding delay for the input circuits, which means that the new data always will be driven on the bus slightly after the old data has been sampled.

DRAM Column Access Modification

Figure 15:
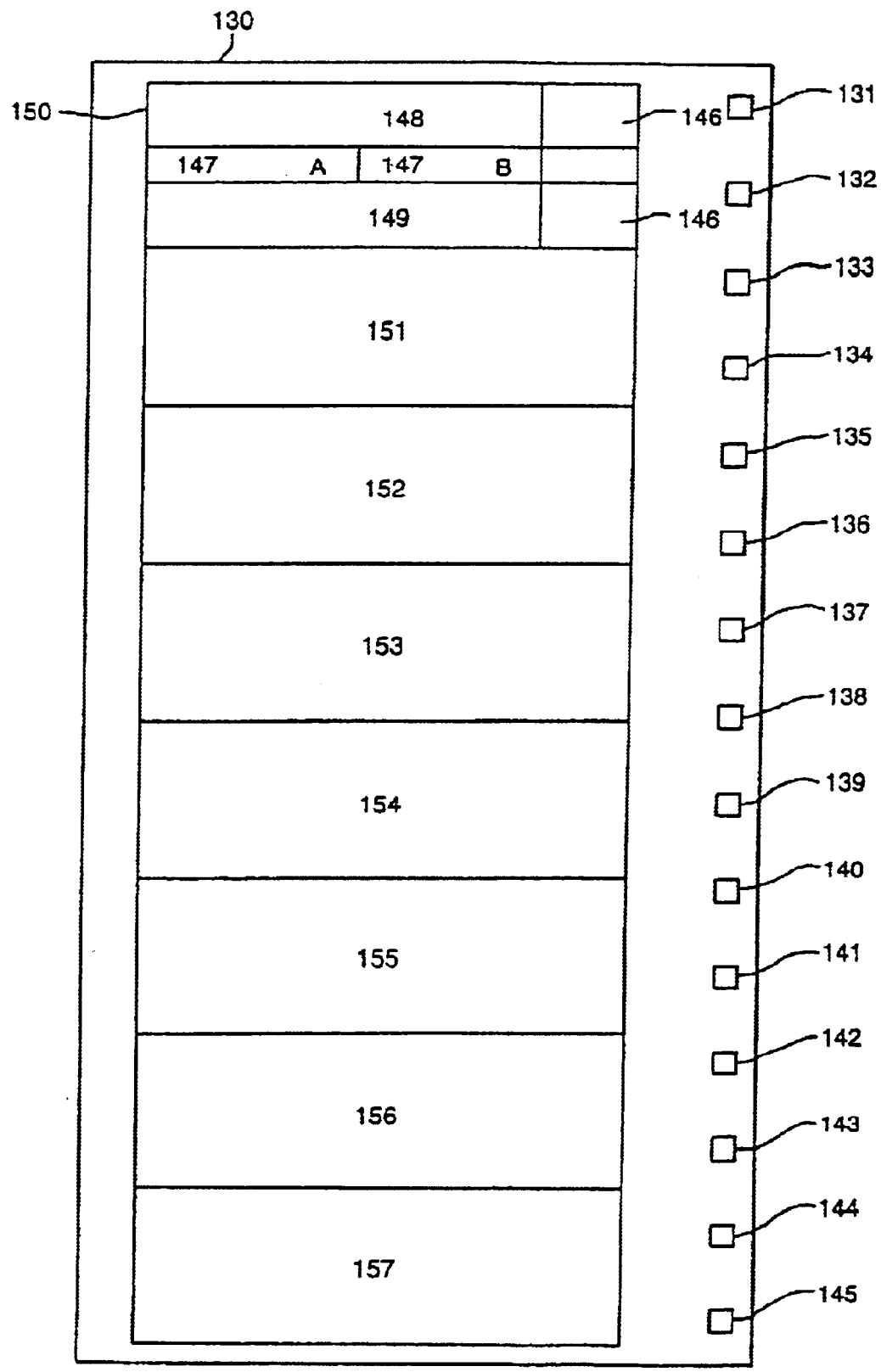
FIG. 15 is a diagram illustrating the general organization of a 4 Mbit DRAM divided into 8 subarrays.

A block diagram of a conventional 4 MBit DRAM 130 is shown in FIG. 15. The DRAM memory array is divided into a number of subarrays 150–157, for example, 8. Each subarray is divided into arrays 148, 149 of memory cells. Row address selection is performed by decoders 146. A column decoder 147A, 147B, including column sense amps on either side of the decoder, runs through the core of each subarray. These column sense amps can be set to precharge or latch the most-recently stored value, as described in detail above. Internal I/O lines connect each set of sense-amps, as gated by corresponding column decoders, to input and output circuitry connected ultimately to the device pins. These internal I/O lines are used to drive the data from the selected bit lines to the data pins (some of pins 131–145), or to take the data from the pins and write the selected bit lines. Such a column access path organized by prior art constraints does not have sufficient bandwidth to interface with a high speed bus. The method of this invention does not require changing the overall method used for column access, but does change implementation details. Many of these details have been implemented selectively in certain fast memory devices, but never in conjunction with the bus architecture of this invention.

Running the internal I/O lines in the conventional way at high bus cycle rates is not possible. In the preferred method, several (preferably 4) bytes are read or written during each cycle and the column access path is modified to ran at a lower rate (the inverse of the number of bytes accessed per cycle, preferably ¼ of the bus cycle rate). Three different techniques are used to provide the additional internal I/O lines required and to supply data to memory cells at this rate. First, the number of I/O bit lines in each subarray running through the column decoder 147 A, B is increased, for example, to 16, eight for each of the two columns of column sense amps and the column decoder selects one set of columns from the "top" half 148 of subarray 150 and one set of columns from the "bottom" half 149 during each cycle, where the column decoder selects one column sense amp per I/O bit line. Second, each column I/O line is divided into two halves, carrying data independently over separate internal I/O lines from the left half 147A and right half 147B of each subarray (dividing each subarray into quadrants) and the column decoder selects sense amps from each right and left half of the subarray, doubling the number of bits available at each cycle. Thus each column decode selection turns on n column sense amps, where n equals four (top left and right, bottom left and right quadrants) times the number of I/O lines in the bus to each subarray quadrant (8 lines each times 4=lines in the preferred implementation). Finally, during each RAS cycle, two different subarrays, e.g. 157 and 153, are accessed. This doubles again the available number of I/O lines containing data. Taken together, these changes increase the internal I/O bandwidth by at least a factor of 8. Four internal buses are used to route these internal I/O lines. Increasing the number of I/O lines and then splitting them in the middle greatly reduces the capacitance of each internal I/O line which in turn reduces the column access time, increasing the column access bandwidth even further.

The multiple, gated input receivers described above allow high speed input from the device pins onto the internal I/O lines and ultimately into memory; The multiplexed output driver described above is used to keep up with the data flow available using these techniques. Control means are provided to select whether information at the device pins should be treated as an address, and therefore to be decoded, or input or output data to be driven onto or read from the internal I/O lines.

Each subarray can access 32 bits per cycle, 16 bits from the left subarray and 16 from the right subarray. With 8 I/O lines per sense-amplifier column and accessing two subarrays at a time, the DRAM can provide 64 bits per cycle. This extra I/O bandwidth is not needed for reads (and is probably not used), but may be needed for writes. Availability of write bandwidth is a more difficult problem than read bandwidth because over-writing a value in a sense-amplifier may be a slow operation, depending on how the sense amplifier is connected to the bit line. The extra set of internal I/O lines provides some bandwidth margin for write operations.

Persons skilled in the art will recognize that many variations of the teachings of this invention can be practiced that still fall within the claims of this invention which follow.

What is claimed is:

1. A method of operation of a synchronous memory device, wherein the memory device includes an array of memory cells and a programmable register, the method of operation of the memory device comprises:

sampling a first operation code synchronously with respect to a transition of an external clock signal;

receiving a binary value synchronously with respect to the external clock signal, wherein the binary value is representative of a delay time to transpire before the memory device is to output data in response to a second operation code, wherein the second operation code specifies a read operation to the memory device; and storing the binary value in the programmable register in response to the first operation code.

2. The method of claim 1 wherein the first operation code is included in a control register access request packet.

3. The method of claim 2 wherein the first operation code and the binary value are included in the same control register access request packet.

4. The method of claim 1 wherein the delay time is representative of a number of clock cycles of the external clock signal.

5. The method of claim 4 further including:

receiving the second operation code; and outputting the data, in response to the second operation code, after the number of clock cycles of the external clock signal transpire.

6. The method of claim 5 further including sampling address information synchronously with respect to the external clock signal.

7. The method of claim 6 wherein the address information and the second operation code are included in a read request packet.

8. The method of claim 1 further including:

receiving block size information, wherein the block size information is representative of an amount of data to be output;

receiving the second operation code; and outputting the amount of data, in response to the second operation code, after the delay time transpires.

9. The method of claim 8 wherein the block size information further defines an amount of data to be input in response to a third operation code, wherein the third operation code specifies a write operation to the memory device, the method further including:

receiving the third operation code; and inputting the amount of data in response to the third operation code.

10. The method of claim 9 wherein the third operation code is included in a write request packet.

11. The method of claim 10 wherein the block size information and the third operation code are included in the same write request packet.

12. The method of claim 1 further including:

receiving the second operation code; and outputting data in response to the second operation code, wherein the data is output synchronously with respect to consecutive rising and falling edge transitions of the external clock signal.

13. The method of claim 1 wherein the first operation code is received during an initialization sequence after power is applied to the memory device.

14. The method of claim 1 wherein the first operation code is sampled from an external bus.

15. The method of claim 14 wherein the external bus includes a plurality of signal lines, and wherein the binary value and the first operation code are multiplexed over the plurality of signal lines.

16. A method of controlling a synchronous memory device by a controller, wherein the memory device includes an array of memory cells and a programmable register, the method of controlling the memory device comprises:

issuing a first operation code to the memory device, wherein the first operation code specifies an access of the programmable register in the memory device in order to store a binary value, wherein the binary value is representative of control information; and providing the binary value to the memory device, wherein the memory device stores the binary value in the programmable register in response to the first operation code.

17. The method of claim 16 wherein the control information is representative of a number of clock cycles of an external clock signal to transpire before the memory device outputs data in response to a second operation code.

18. The method of claim 17 further including:

issuing the second operation code to the memory device; and receiving data output by the memory device after the number of clock cycles of the external clock signal transpire.

19. The method of claim 18 further including providing address information to the memory device synchronously with respect to the external clock signal.

20. The method of claim 19 wherein the address information and the second operation code are included in a request packet.

21. The method of claim 16 further including:

providing block size information to the memory device, wherein the block size information defines an amount of data to be output by the memory device in response to a second operation code;

issuing the second operation code to the memory device; and receiving the amount of data output by the memory device.

22. The method of claim 21 wherein the block size information further defines an amount of data to be input by the memory device in response to a third operation code, the method further including:

issuing the third operation code to the memory device; and providing the amount of data to the memory device.

23. The method of claim 16 wherein the first operation code and the binary value are included in a request packet.

24. The method of claim 23 wherein the first operation code and the binary value are included in the same request packet.

25. The method of claim 16 wherein the first operation code is issued to the memory device via an external bus.

26. The method of claim 25 wherein the external bus includes a plurality of signal lines, and wherein the binary value and the first operation code are multiplexed over the plurality of signal lines.

27. The method of claim 16 wherein the control information includes a device type identifier.

28. The method of claim 16 wherein the control information identifies a location of a defective portion of the array of memory cells.

29. The method of claim 16 wherein the control information identifies a range of addressable locations of the array of memory cells.

30. The method of claim 16 wherein the control information includes a device identification value to identify the memory device uniquely among a plurality of memory devices.

31. A synchronous memory device including an array of memory cells, the synchronous memory device comprising:

a clock receiver to receive an external clock signal;

a plurality of input receivers to sample a first operation code synchronously with respect to a transition of the external clock signal; and a programmable register to store a binary value that is representative of control information, wherein the memory device stores the binary value in the programmable register in response to the first operation code.

32. The memory device of claim 31 wherein the control information is representative of a number of clock cycles of the external clock signal to transpire before the memory device outputs data, and wherein the memory device outputs the data in response to a second operation code.

33. The memory device of claim 32 further including a plurality of output drivers to output the data, after the number of clock cycles of the external clock signal transpire, in response to the second operation code.

34. The memory device of claim 31 further including a plurality of output drivers to output data in response to a second operation code, wherein the second operation code specifies a read operation, and wherein the plurality of output drivers output a first portion of the data synchronously with respect to a rising edge transition of the external clock signal and output a second portion of the data synchronously with respect to a falling edge transition of the external clock signal.

35. The memory device of claim 31 wherein the first operation code is included in a request packet.

36. The memory device of claim 31 wherein the first operation code and the binary value are each included in a request packet.

37. The memory device of claim 36 wherein the first operation code and the binary value are included in the same request packet.

38. The memory device of claim 31 wherein the plurality of input receivers are operative to receive a second operation code, wherein the second operation code specifies a write operation to the memory device, and wherein the memory device further includes additional input receivers to input data in response to the second operation code.

39. The memory device of claim 31 wherein the array of memory cells includes dynamic random access memory cells.

40. The memory device of claim 31 wherein the plurality of input receivers sample the first operation code from an external bus.

41. The memory device of claim 40 wherein the external bus includes a plurality of signal lines, and wherein the first operation code and the binary value are multiplexed over the plurality of signal lines.

42. The memory device of claim 41 wherein data, the first operation code and the binary value are multiplexed over the plurality of signal lines.

43. The memory device of claim 31 further including a delay locked loop, coupled to the clock receiver, to generate an internal clock signal using the external clock signal.

44. The memory device of claim 43 further including a plurality of output drivers, coupled to the delay locked loop, to output data in response to the internal clock signal, wherein the data is accessed from the memory array.

45. The memory device of claim 44 wherein the plurality of output drivers output a first portion of the data synchronously with respect to a rising edge transition of the external clock signal, and wherein the plurality of output drivers output a second portion of the data synchronously with respect to a falling edge transition of the external clock signal.

46. The memory device of claim 45 wherein the programmable register is included in a plurality of programmable registers of the memory device, each register of the plurality of registers to store a corresponding binary value.

47. The memory device of claim 31 wherein the control information includes a device identifier.

48. The memory device of claim 31 wherein the control information identifies a location of a defective portion of the array of memory cells.

49. The memory device of claim 31 wherein the control information identifies a range of addressable locations of the array of memory cells.

50. The memory device of claim 31 wherein the control information includes a device identification value to identify the memory device uniquely among a plurality of memory devices.

51. The memory device of claim 31 further including a plurality of registers, wherein the programmable register is included in the plurality of registers, and wherein the plurality of registers further includes at least one of:

a first register to store a value that identifies the memory device uniquely among a plurality of memory devices;

a second register to store a value that identifies a range of addressable locations of the array of memory cells; and a third register to store a value that identifies a location of a defective portion of the array of memory cells.

* * * * *

US006697295C1

(12) INTER PARTES REEXAMINATION CERTIFICATE (0252nd)

United States Patent
Farmwald et al.

(10) Number: US 6,697,295 C1
(45) Certificate Issued: Mar. 22, 2011

(54) MEMORY DEVICE HAVING A PROGRAMMABLE REGISTER

(75) Inventors: Michael Farmwald, Berkeley, CA (US); Mark Horowitz, Palo Alto, CA (US)

(73) Assignee: Rambus, Inc., Los Altos, CA (US)

Reexamination Request:
No. 95/001,013, Oct. 11, 2007

Reexamination Certificate for:
Patent No.: 6,697,295
Issued: Feb. 24, 2004
Appl. No.: 09/801,151
Filed: Mar. 7, 2001

Related U.S. Application Data

(63) Continuation of application No. 09/629,497, filed on Jul. 31, 2000, now Pat. No. 6,314,051, which is a continuation of application No. 09/566,551, filed on May 8, 2000, now Pat. No. 6,266,285, which is a continuation of application No. 09/213,243, filed on Dec. 17, 1998, now Pat. No. 6,101,152, which is a continuation of application No. 09/196,199, filed on Nov. 20, 1998, now Pat. No. 6,038,195, which is a continuation of application No. 08/798,520, filed on Feb. 10, 1997, now Pat. No. 5,841,580, which is a division of application No. 08/448,657, filed on May 24, 1995, now Pat. No. 5,638,334, which is a division of application No. 08/222,646, filed on Mar. 31, 1994, now Pat. No. 5,513,327, which is a continuation of application No. 07/954,945, filed on Sep. 30, 1992, now Pat. No. 5,319,755, which is a continuation of application No. 07/510,898, filed on Apr. 18, 1990, now abandoned.

(51) Int. Cl.
| | |
|---|---|
| G06F 12/06 | (2006.01) |
| G06F 12/02 | (2006.01) |
| G06F 13/376 | (2006.01) |
| G06F 13/16 | (2006.01) |
| G06F 13/36 | (2006.01) |
| G06F 11/10 | (2006.01) |
| G06F 11/00 | (2006.01) |
| G11C 7/10 | (2006.01) |
| G11C 7/22 | (2006.01) |
| G11C 8/00 | (2006.01) |
| G11C 5/06 | (2006.01) |
| G11C 29/00 | (2006.01) |
| G11C 5/00 | (2006.01) |
| G11C 11/4096 | (2006.01) |
| G11C 7/00 | (2006.01) |
| G11C 11/409 | (2006.01) |
| G11C 11/4076 | (2006.01) |
| G11C 11/407 | (2006.01) |

(52) U.S. Cl. ............... 365/189.15; 365/194; 365/233.17; 365/233.5; 711/E12.004; 711/E12.086; 711/E12.089

(58) Field of Classification Search .................. None
See application file for complete search history.

(56) References Cited

U.S. PATENT DOCUMENTS 3,031,643 A  4/1962  Sheftelman (Continued)

FOREIGN PATENT DOCUMENTS

DE  3733554  4/1988

(Continued)

OTHER PUBLICATIONS

Advanced Micro Devices, "Bipolar/MOS Memories Data Book," Sunnyvale, CA, 1986 (pp. 4–143 to 4–163).

(Continued)

*Primary Examiner*—Ovidio Escalante

(57) ABSTRACT

The present invention includes a memory subsystem comprising at least two semiconductor devices, including at least one memory device, connected to a bus, where the bus includes a plurality of bus lines for carrying substantially all address, data and control information needed by said memory devices, where the control information includes device-select information and the bus has substantially fewer bus lines than the number of bits in a single address, and the bus carries device-select information without the need for separate device-select lines connected directly to individual devices.

The present invention also includes a protocol for master and slave devices to communicate on the bus and for registers in each device to differentiate each device and allow bus requests to be directed to a single or to all devices. The present invention includes modifications to prior-art devices to allow them to implement the new features of this invention. In a preferred implementation, 8 bus data lines and an AddressValid bus line carry address, data and control information for memory addresses up to 40 bits wide.

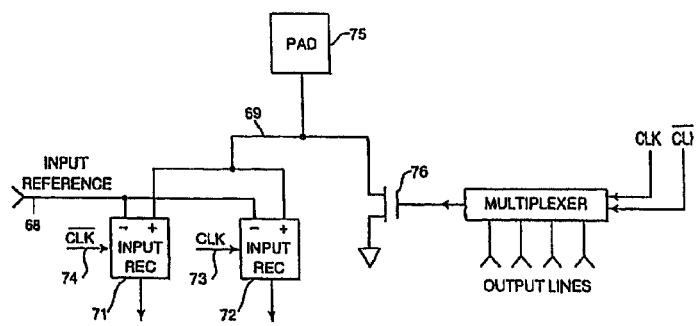

U.S. PATENT DOCUMENTS

| | | | |
|---|---|---|---|
| 3,068,405 | A | 12/1962 | Glazer et al. |
| 3,204,180 | A | 8/1965 | Bray et al. |
| 3,243,665 | A | 3/1966 | Fayer et al. |
| 3,348,141 | A | 10/1967 | Jensen et al. |
| 3,377,518 | A | 4/1968 | Radcliffe |
| 3,562,432 | A | 2/1971 | Gabbard |
| 3,585,500 | A | 6/1971 | Grubel |
| 3,633,166 | A | 1/1972 | Picard |
| 3,654,395 | A | 4/1972 | Schmidt |
| 3,671,865 | A | 6/1972 | Szumila et al. |
| 3,691,534 | A | 9/1972 | Varadi et al. |
| 3,713,025 | A | 1/1973 | McNair |
| 3,721,838 | A | 3/1973 | Brickman |
| 3,740,723 | A | 6/1973 | Beausoleil et al. |
| 3,753,244 | A | 8/1973 | Sumilas et al. |
| 3,758,761 | A | 9/1973 | Henrion |
| 3,760,261 | A | 9/1973 | Collins |
| 3,771,145 | A | 11/1973 | Wiener |
| 3,801,981 | A | 4/1974 | Alpers |
| 3,803,562 | A | 4/1974 | Hunter |
| 3,821,715 | A | 6/1974 | Hoff, Jr. et al. |
| 3,823,387 | A | 7/1974 | McClellan |
| 3,846,763 | A | 11/1974 | Riikonen |
| 3,882,420 | A | 5/1975 | Liu |
| 3,882,470 | A | 5/1975 | Hunter |
| 3,886,454 | A | 5/1975 | Oakley et al. |
| 3,900,837 | A | 8/1975 | Hunter |
| 3,906,159 | A | 9/1975 | Lutz |
| 3,924,241 | A | 12/1975 | Kronies |
| 3,950,735 | A | 4/1976 | Patel |
| 3,967,206 | A | 6/1976 | Roberson et al. |
| 3,969,706 | A | 7/1976 | Proebsting et al. |
| 3,972,028 | A | 7/1976 | Weber et al. |
| 3,975,714 | A | 8/1976 | Weber et al. |
| 3,983,537 | A | 9/1976 | Parsons et al. |
| 4,007,452 | A | 2/1977 | Hoff, Jr. |
| 4,016,545 | A | 4/1977 | Lipovski |
| 4,021,625 | A | 5/1977 | Bradley |
| 4,038,648 | A | 7/1977 | Chesley |
| 4,047,201 | A | 9/1977 | Kerllenevich |
| 4,047,246 | A | 9/1977 | Kerllenevich et al. |
| 4,048,673 | A | 9/1977 | Hendrie et al. |
| 4,053,950 | A | 10/1977 | Bourke et al. |
| 4,056,843 | A | 11/1977 | Bishop et al. |
| 4,063,080 | A | 12/1977 | Eichelberger et al. |
| 4,079,448 | A | 3/1978 | N'Guyen et al. |
| 4,084,154 | A | 4/1978 | Panigrahi |
| 4,092,665 | A | 5/1978 | Saran |
| 4,096,571 | A | * 6/1978 | Vander Mey ................. 711/151 |
| 4,099,231 | A | 7/1978 | Kotok et al. |
| 4,117,267 | A | 9/1978 | Haberle et al. |
| 4,142,069 | A | 2/1979 | Stover |
| 4,183,095 | A | 1/1980 | Ward |
| 4,189,769 | A | 2/1980 | Cook |
| 4,191,996 | A | 3/1980 | Chesley |
| 4,205,373 | A | 5/1980 | Shah et al. |
| 4,214,261 | A | 7/1980 | Bazin et al. |
| 4,222,112 | A | 9/1980 | Clemons |
| 4,231,104 | A | 10/1980 | St. Clair |
| 4,234,934 | A | 11/1980 | Thorsrud |
| 4,247,817 | A | 1/1981 | Heller |
| 4,249,247 | A | 2/1981 | Patel |
| 4,250,352 | A | 2/1981 | Workman, Sr. |
| 4,250,570 | A | 2/1981 | Tsang |
| 4,253,147 | A | 2/1981 | MacDougall et al. |
| 4,255,814 | A | 3/1981 | Osborn |
| 4,257,097 | A | 3/1981 | Moran |
| 4,263,650 | A | 4/1981 | Bennett et al. |
| 4,271,483 | A | 6/1981 | Baldwin et al. |
| 4,271,513 | A | 6/1981 | Maejima |
| 4,281,401 | A | 7/1981 | Redwine et al. |
| 4,286,321 | A | 8/1981 | Baker et al. |
| 4,289,979 | A | 9/1981 | Muller |
| 4,306,298 | A | 12/1981 | McElroy |
| 4,315,308 | A | 2/1982 | Jackson |
| 4,317,623 | A | 3/1982 | Nobusawa |
| 4,320,505 | A | 3/1982 | Baun, Jr. et al. |
| 4,322,635 | A | 3/1982 | Redwine |
| 4,330,852 | A | 5/1982 | Redwine et al. |
| 4,333,142 | A | 6/1982 | Chesley |
| 4,335,426 | A | 6/1982 | Maxwell et al. |
| 4,337,463 | A | 6/1982 | Vangen |
| 4,337,523 | A | 6/1982 | Hotta et al. |
| 4,338,569 | A | * 7/1982 | Petrich ....................... 327/158 |
| 4,348,754 | A | 9/1982 | Haynes |
| 4,354,258 | A | 10/1982 | Sato |
| 4,355,376 | A | 10/1982 | Gould |
| 4,359,735 | A | 11/1982 | Lewis et al. |
| 4,360,827 | A | 11/1982 | Braun |
| 4,360,870 | A | 11/1982 | McVey |
| 4,365,297 | A | 12/1982 | Grisham, Jr. |
| 4,373,183 | A | 2/1983 | Means et al. |
| 4,375,665 | A | 3/1983 | Schmidt |
| 4,377,855 | A | 3/1983 | Lavi |
| 4,379,222 | A | 4/1983 | Hayter et al. |
| 4,379,340 | A | 4/1983 | Holtey et al. |
| 4,385,350 | A | 5/1983 | Hansen et al. |
| 4,394,753 | A | 7/1983 | Penzel |
| 4,398,248 | A | 8/1983 | Hsia |
| 4,400,801 | A | 8/1983 | Kible |
| 4,405,996 | A | 9/1983 | Stewart |
| 4,408,272 | A | 10/1983 | Walters |
| 4,411,007 | A | 10/1983 | Rodman et al. |
| 4,412,286 | A | 10/1983 | O'Dowd |
| 4,419,747 | A | 12/1983 | Jordan |
| 4,421,996 | A | 12/1983 | Chuang |
| 4,426,685 | A | 1/1984 | Lorentzen |
| 4,433,934 | A | 2/1984 | Cleveland |
| 4,435,762 | A | 3/1984 | Milligan et al. |
| 4,438,494 | A | 3/1984 | Budde et al. |
| 4,443,864 | A | 4/1984 | McElroy |
| 4,445,204 | A | 4/1984 | Nishiguchi |
| 4,449,207 | A | 5/1984 | Kung et al. |
| 4,458,357 | A | 7/1984 | Weymouth et al. |
| 4,466,127 | A | 8/1984 | Ohgishi et al. |
| 4,468,733 | A | 8/1984 | Oka et al. |
| 4,468,738 | A | 8/1984 | Hansen et al. |
| 4,470,114 | A | 9/1984 | Gerhold |
| 4,476,560 | A | 10/1984 | Miller |
| 4,480,037 | A | 10/1984 | Ichishima et al. |
| 4,480,307 | A | 10/1984 | Budde et al. |
| 4,481,572 | A | 11/1984 | Ochsner |
| 4,481,625 | A | 11/1984 | Roberts et al. |
| 4,481,647 | A | 11/1984 | Gombert et al. |
| 4,482,999 | A | 11/1984 | Janson et al. |
| 4,488,218 | A | 12/1984 | Grimes |
| 4,493,021 | A | 1/1985 | Agrawal et al. |
| 4,494,021 | A | 1/1985 | Bell et al. |
| 4,494,185 | A | 1/1985 | Gunderson |
| 4,494,186 | A | 1/1985 | Goss et al. |
| 4,496,861 | A | 1/1985 | Bazes |
| 4,499,536 | A | 2/1985 | Gemma et al. |
| 4,500,905 | A | 2/1985 | Shibata |
| 4,500,991 | A | 2/1985 | Lubcke et al. |
| 4,506,348 | A | 3/1985 | Miller |
| 4,509,142 | A | 4/1985 | Childers |
| 4,513,370 | A | 4/1985 | Ziu et al. |
| 4,513,372 | A | 4/1985 | Ziegler et al. |
| 4,513,374 | A | 4/1985 | Hooks, Jr. |
| 4,519,034 | A | 5/1985 | Smith et al. |
| 4,520,465 | A | 5/1985 | Sood |

| | | | | | |
|---|---|---|---|---|---|
| 4,528,646 A | 7/1985 | Ochii et al. | 4,727,455 A | 2/1988 | Neidig et al. |
| 4,528,661 A | 7/1985 | Bahr et al. | 4,727,475 A | 2/1988 | Kiremidjian |
| 4,532,569 A | 7/1985 | Salcedo | 4,734,880 A | 3/1988 | Collins |
| 4,535,427 A | 8/1985 | Jiang | 4,734,909 A | 3/1988 | Bennett et al. |
| 4,536,795 A | 8/1985 | Hirota et al. | 4,739,502 A | 4/1988 | Nozaki |
| 4,539,658 A | 9/1985 | Shimohigashi | 4,740,923 A | 4/1988 | Kaneko et al. |
| 4,545,010 A | 10/1985 | Salas et al. | 4,740,924 A | 4/1988 | Tielert |
| 4,562,435 A | 12/1985 | McDonough et al. | 4,744,062 A | 5/1988 | Nakamura et al. |
| 4,566,098 A | 1/1986 | Gammage et al. | 4,745,548 A | 5/1988 | Blahut |
| 4,566,099 A | 1/1986 | Magerl | 4,747,079 A | 5/1988 | Yamaguchi |
| 4,570,220 A | 2/1986 | Tetrick et al. | 4,747,081 A | 5/1988 | Heilveil et al. |
| 4,571,672 A | 2/1986 | Hatada et al. | 4,747,100 A | 5/1988 | Roach et al. |
| 4,584,672 A | 4/1986 | Schutz | 4,748,320 A | 5/1988 | Yorimoto |
| 4,586,167 A | 4/1986 | Fujishima et al. | 4,748,595 A | 5/1988 | Mattausch |
| 4,589,108 A | 5/1986 | Billy | 4,748,617 A | 5/1988 | Drewlo |
| 4,595,923 A | 6/1986 | McFarland, Jr. | 4,750,839 A | 6/1988 | Wang et al. |
| 4,596,025 A | 6/1986 | Satoh | 4,752,915 A | 6/1988 | Suzuki et al. |
| 4,597,019 A | 6/1986 | Nishimoto et al. | 4,754,433 A | 6/1988 | Chin et al. |
| 4,607,173 A | 8/1986 | Knoedl, Jr. | 4,755,937 A | 7/1988 | Glier |
| 4,608,700 A | 8/1986 | Kirtley, Jr. et al. | 4,757,473 A | 7/1988 | Kurihara et al. |
| 4,612,594 A | 9/1986 | Yamaura et al. | 4,758,993 A | 7/1988 | Takemae |
| 4,616,268 A | 10/1986 | Shida | 4,761,567 A | 8/1988 | Walters, Jr. et al. |
| 4,623,244 A | 11/1986 | Andrews et al. | 4,761,799 A | 8/1988 | Arragon |
| 4,623,986 A | 11/1986 | Chauvel | 4,763,249 A | 8/1988 | Bomba et al. |
| 4,625,307 A | 11/1986 | Tulpule et al. | 4,764,846 A | 8/1988 | Go |
| 4,628,489 A | 12/1986 | Ong et al. | 4,766,536 A | 8/1988 | Wilson, Jr. et al. |
| 4,629,909 A | 12/1986 | Cameron | 4,768,168 A | 8/1988 | Watanabe |
| 4,630,193 A | 12/1986 | Kris | 4,769,778 A | 9/1988 | Tielert |
| 4,631,659 A | 12/1986 | Hayne et al. | 4,770,640 A | 9/1988 | Walter |
| 4,633,735 A | 1/1987 | Sakurai et al. | 4,775,931 A | 10/1988 | Dickie et al. |
| 4,635,192 A | 1/1987 | Ceccon et al. | 4,779,015 A | 10/1988 | Erdelyi |
| 4,635,196 A | 1/1987 | Nakamura et al. | 4,779,018 A | 10/1988 | Okuno et al. |
| 4,636,986 A | 1/1987 | Pinkham | 4,779,089 A | 10/1988 | Theus |
| 4,636,989 A | 1/1987 | Ikuzaki | 4,782,439 A | 11/1988 | Borkar et al. |
| 4,637,018 A | 1/1987 | Flora | 4,785,394 A | 11/1988 | Fischer |
| 4,639,890 A | 1/1987 | Heilveil et al. | 4,785,396 A | 11/1988 | Murphy et al. |
| 4,641,276 A | 2/1987 | Dunki-Jacobs | 4,785,428 A | 11/1988 | Bajwa |
| 4,644,469 A | 2/1987 | Sumi | 4,788,660 A | 11/1988 | Arizono |
| 4,644,532 A | 2/1987 | George et al. | 4,788,667 A | 11/1988 | Nakano et al. |
| 4,646,269 A | 2/1987 | Wong | 4,789,960 A | 12/1988 | Willis |
| 4,646,270 A | 2/1987 | Voss | 4,792,926 A | 12/1988 | Roberts |
| 4,648,102 A | 3/1987 | Riso et al. | 4,799,199 A | 1/1989 | Scales, III et al. |
| 4,649,511 A | 3/1987 | Gdula | 4,802,127 A | 1/1989 | Akaogi |
| 4,649,516 A | 3/1987 | Chung et al. | 4,802,135 A | 1/1989 | Shinoda |
| 4,654,655 A | 3/1987 | Kowalski | 4,803,621 A | 2/1989 | Kelly |
| 4,656,605 A | 4/1987 | Clayton | 4,805,198 A | 2/1989 | Stern et al. |
| 4,658,381 A | 4/1987 | Reed | 4,807,189 A | 2/1989 | Pinkham et al. |
| 4,660,141 A | 4/1987 | Ceccon et al. | 4,811,202 A | 3/1989 | Schabowski |
| 4,663,735 A | 5/1987 | Novak et al. | 4,811,336 A | 3/1989 | Backhaus et al. |
| 4,667,305 A | 5/1987 | Dill et al. | 4,811,364 A | 3/1989 | Sager et al. |
| 4,672,470 A | 6/1987 | Morimoto et al. | 4,814,648 A | 3/1989 | Hynecek |
| 4,675,813 A | 6/1987 | Locke | 4,817,058 A | 3/1989 | Pinkham |
| 4,675,850 A | 6/1987 | Kumanoya et al. | 4,818,985 A | 4/1989 | Ikeda |
| 4,677,648 A | 6/1987 | Zurfluh | 4,821,226 A | 4/1989 | Christopher et al. |
| 4,680,738 A | 7/1987 | Tam | 4,823,321 A | 4/1989 | Aoyama |
| 4,683,555 A | 7/1987 | Pinkham | 4,825,287 A | 4/1989 | Baji et al. |
| 4,685,088 A | 8/1987 | Iannucci | 4,825,416 A | 4/1989 | Tam et al. |
| 4,688,197 A | 8/1987 | Novak et al. | 4,831,338 A | 5/1989 | Yamaguchi |
| 4,689,581 A | 8/1987 | Talbot | 4,833,650 A | 5/1989 | Hirayama |
| 4,696,019 A | 9/1987 | Tulpule et al. | 4,835,674 A | 5/1989 | Collins et al. |
| 4,703,418 A | 10/1987 | James | 4,837,682 A | 6/1989 | Culler |
| 4,704,678 A | 11/1987 | May | 4,839,801 A | 6/1989 | Nicely et al. |
| 4,706,166 A | 11/1987 | Go | 4,839,856 A | 6/1989 | Tanaka |
| 4,710,904 A | 12/1987 | Suzuki | 4,845,664 A | 7/1989 | Aichelmann, Jr. et al. |
| 4,712,190 A | 12/1987 | Guglielmi et al. | 4,845,670 A | 7/1989 | Nishimoto et al. |
| 4,712,194 A | 12/1987 | Yamaguchi et al. | 4,845,677 A | 7/1989 | Chappell et al. |
| 4,719,505 A | 1/1988 | Katznelson | 4,846,937 A | 7/1989 | Driscoll et al. |
| 4,719,602 A | 1/1988 | Hag et al. | 4,847,833 A | 7/1989 | Doering et al. |
| 4,719,627 A | 1/1988 | Peterson et al. | 4,849,937 A | 7/1989 | Yoshimoto |
| 4,726,021 A | 2/1988 | Horiguchi et al. | 4,849,965 A | 7/1989 | Chomel et al. |
| 4,727,363 A | 2/1988 | Ishii | 4,851,990 A | 7/1989 | Johnson et al. |

| | | | | | | |
|---|---|---|---|---|---|---|
| 4,853,896 A | 8/1989 | Yamaguchi | | 5,006,982 A | 4/1991 | Ebersole et al. |
| 4,858,112 A | 8/1989 | Puerzer et al. | | 5,009,481 A | 4/1991 | Kinoshita et al. |
| 4,858,113 A | 8/1989 | Saccardi | | 5,012,408 A | 4/1991 | Conroy |
| 4,860,198 A | 8/1989 | Takenaka | | 5,014,242 A | 5/1991 | Akimoto |
| 4,862,158 A | 8/1989 | Keller et al. | | 5,016,226 A | 5/1991 | Hiwada et al. |
| 4,864,563 A | 9/1989 | Pavey et al. | | 5,018,109 A | 5/1991 | Shinoda |
| 4,866,675 A | 9/1989 | Kawashima | | 5,018,110 A | 5/1991 | Sugiyama |
| 4,870,562 A | 9/1989 | Kimoto et al. | | 5,018,111 A | 5/1991 | Madland |
| 4,870,622 A | 9/1989 | Aria et al. | | 5,021,722 A | 6/1991 | Llerena et al. |
| 4,870,652 A | 9/1989 | Thornton | | 5,021,772 A | 6/1991 | King et al. |
| H696 H | 10/1989 | Davidson | | 5,021,985 A | 6/1991 | Hu et al. |
| 4,873,671 A | 10/1989 | Kowshik et al. | | 5,022,004 A | 6/1991 | Kurtze et al. |
| 4,875,192 A | 10/1989 | Matsumoto | | 5,023,488 A | 6/1991 | Gunning |
| 4,876,670 A | 10/1989 | Nakabayashi et al. | | 5,023,835 A | 6/1991 | Akimoto et al. |
| 4,878,166 A | 10/1989 | Johnson et al. | | 5,023,838 A | 6/1991 | Herbert |
| 4,882,669 A | 11/1989 | Miura et al. | | 5,027,271 A | 6/1991 | Curley et al. |
| 4,882,710 A | 11/1989 | Hashimoto et al. | | 5,029,076 A | 7/1991 | Stewart et al. |
| 4,882,712 A | 11/1989 | Ohno et al. | | 5,029,079 A | 7/1991 | Magar et al. |
| 4,891,791 A | 1/1990 | Iijima | | 5,029,124 A | 7/1991 | Leahy et al. |
| 4,901,036 A | 2/1990 | Herold et al. | | 5,034,917 A | 7/1991 | Bland et al. |
| 4,903,238 A | 2/1990 | Miyatake | | 5,034,964 A | 7/1991 | Khan et al. |
| 4,905,201 A | 2/1990 | Ohira et al. | | 5,036,495 A | 7/1991 | Busch et al. |
| 4,907,199 A | 3/1990 | Dosaka et al. | | 5,038,277 A | 8/1991 | Altman |
| 4,912,630 A | 3/1990 | Cochcroft, Jr. | | 5,038,317 A | 8/1991 | Callan et al. |
| 4,912,679 A | 3/1990 | Shinoda | | 5,038,320 A | 8/1991 | Heath et al. |
| 4,916,670 A | 4/1990 | Suzuki | | 5,040,153 A | 8/1991 | Fung et al. |
| 4,920,483 A | 4/1990 | Pogue et al. | | 5,047,972 A | 9/1991 | Wada |
| 4,920,486 A | 4/1990 | Nielson | | 5,051,889 A | 9/1991 | Fung et al. |
| 4,922,141 A | 5/1990 | Lofgren et al. | | 5,051,954 A | 9/1991 | Toda |
| 4,922,460 A | 5/1990 | Furutani et al. | | 5,051,955 A | 9/1991 | Kobayashi |
| 4,926,385 A | 5/1990 | Fujishima et al. | | 5,056,060 A | 10/1991 | Fitch et al. |
| 4,928,265 A | 5/1990 | Higuchi et al. | | 5,056,064 A | 10/1991 | Iwahashi |
| 4,930,065 A | 5/1990 | McLagan et al. | | 5,062,073 A | 10/1991 | Masuda et al. |
| 4,932,002 A | 6/1990 | Houston | | 5,063,564 A | 11/1991 | Crandall et al. |
| 4,933,835 A | 6/1990 | Sachs et al. | | 5,075,886 A | 12/1991 | Isobe |
| 4,933,910 A | 6/1990 | Olson et al. | | 5,077,693 A | 12/1991 | Hardee et al. |
| 4,933,953 A | 6/1990 | Yagi | | 5,083,260 A | 1/1992 | Tsuchiya |
| 4,937,733 A | 6/1990 | Gillett, Jr. et al. | | 5,083,296 A | 1/1992 | Hara et al. |
| 4,937,734 A | 6/1990 | Bechtolsheim | | 5,093,807 A | 3/1992 | Hashimoto et al. |
| 4,939,101 A | 7/1990 | Black et al. | | 5,099,481 A | 3/1992 | Miller |
| 4,939,510 A | 7/1990 | Masheff et al. | | 5,101,117 A | 3/1992 | Johnson et al. |
| 4,940,909 A | 7/1990 | Mulder et al. | | 5,107,465 A | 4/1992 | Fung et al. |
| 4,941,128 A | 7/1990 | Wada et al. | | 5,107,491 A | 4/1992 | Chew |
| 4,943,944 A | 7/1990 | Sakui et al. | | 5,109,498 A | 4/1992 | Kamiya et al. |
| 4,945,471 A | 7/1990 | Neches | | 5,111,386 A | 5/1992 | Fujishima et al. |
| 4,945,516 A | 7/1990 | Kashiyama | | 5,111,423 A | 5/1992 | Kopec, Jr. et al. |
| 4,947,484 A | 8/1990 | Twitty et al. | | 5,111,464 A | 5/1992 | Farmwald et al. |
| 4,949,301 A | 8/1990 | Joshi et al. | | 5,111,486 A | 5/1992 | Oliboni et al. |
| 4,951,251 A | 8/1990 | Yamaguchi et al. | | 5,117,130 A | 5/1992 | Shoji |
| 4,953,128 A | 8/1990 | Kawai et al. | | 5,117,494 A | 5/1992 | Costes et al. |
| 4,953,130 A | 8/1990 | Houston | | 5,119,326 A * | 6/1992 | Cochran et al. ............. 708/819 |
| 4,954,987 A | 9/1990 | Auvinen et al. | | 5,121,382 A | 6/1992 | Yang et al. |
| 4,954,992 A | 9/1990 | Kumanoya et al. | | 5,123,100 A | 6/1992 | Hisada et al. |
| 4,961,171 A | 10/1990 | Pinkham et al. | | 5,124,946 A | 6/1992 | Takahashi |
| 4,964,038 A | 10/1990 | Louis | | 5,129,069 A | 7/1992 | Helm et al. |
| 4,965,792 A | 10/1990 | Yano | | 5,133,064 A | 7/1992 | Hotta et al. |
| 4,970,418 A | 11/1990 | Masterson | | 5,134,699 A | 7/1992 | Aria et al. |
| 4,975,763 A | 12/1990 | Baudouin et al. | | 5,140,688 A | 8/1992 | White et al. |
| 4,975,872 A | 12/1990 | Zaiki | | 5,142,376 A | 8/1992 | Ogura |
| 4,975,877 A | 12/1990 | Bell | | 5,142,637 A | 8/1992 | Harlin et al. |
| 4,977,542 A | 12/1990 | Matsuda et al. | | 5,148,523 A | 9/1992 | Harlin et al. |
| 4,978,905 A | 12/1990 | Hoff | | 5,150,325 A | 9/1992 | Yanagisawa |
| 4,979,145 A | 12/1990 | Remington et al. | | 5,153,856 A | 10/1992 | Takahashi |
| 4,982,368 A | 1/1991 | Arimoto | | 5,157,776 A | 10/1992 | Foster |
| 4,982,400 A | 1/1991 | Ebersole | | 5,159,676 A | 10/1992 | Wicklund et al. |
| 4,984,217 A | 1/1991 | Sato | | 5,170,130 A | 12/1992 | Ichihara |
| 4,998,069 A | 3/1991 | Nguyen et al. | | 5,173,617 A | 12/1992 | Alsup et al. |
| 4,998,222 A | 3/1991 | Sussman | | 5,175,822 A | 12/1992 | Dixon et al. |
| 4,998,262 A | 3/1991 | Wiggers | | 5,175,831 A | 12/1992 | Kumar |
| 5,001,626 A | 3/1991 | Kashiyama et al. | | 5,175,835 A | 12/1992 | Beighe et al. |
| 5,001,672 A | 3/1991 | Ebbers | | 5,179,667 A | 1/1993 | Iyer |

| Patent No. | Date | Inventor |
|---|---|---|
| 5,179,670 A | 1/1993 | Farmwald et al. |
| 5,179,687 A | 1/1993 | Hidaka et al. |
| 5,181,205 A | 1/1993 | Kertis |
| 5,184,027 A | 2/1993 | Masuda et al. |
| 5,193,149 A | 3/1993 | Awiszio et al. |
| 5,193,193 A | 3/1993 | Iyer |
| 5,193,199 A | 3/1993 | Dalrymple et al. |
| 5,198,995 A | 3/1993 | Dennard |
| 5,200,926 A | 4/1993 | Iwahashi |
| 5,206,833 A | 4/1993 | Lee |
| 5,210,715 A | 5/1993 | Houston |
| 5,210,844 A | 5/1993 | Shimura et al. |
| 5,214,610 A | 5/1993 | Houston |
| 5,218,686 A | 6/1993 | Thayer |
| 5,220,673 A | 6/1993 | Dalrymple et al. |
| 5,226,009 A | 7/1993 | Arimoto |
| 5,226,147 A | 7/1993 | Fujishima et al. |
| 5,235,543 A | 8/1993 | Rosen |
| 5,243,703 A | 9/1993 | Farmwald et al. |
| 5,247,518 A | 9/1993 | Takiyasu et al. |
| 5,251,309 A | 10/1993 | Kinoshita et al. |
| 5,254,883 A | 10/1993 | Horowitz et al. |
| 5,257,232 A | 10/1993 | Dhong |
| 5,257,892 A | 11/1993 | Branch |
| 5,266,848 A | 11/1993 | Nakagome |
| 5,268,639 A | 12/1993 | Gasbarro et al. |
| 5,268,865 A | 12/1993 | Takasugi |
| 5,270,973 A | 12/1993 | Guillemaud |
| 5,276,641 A | 1/1994 | Sprogis |
| 5,276,846 A | 1/1994 | Aichelmann, Jr. et al. |
| 5,278,974 A | 1/1994 | Lemmon et al. |
| 5,287,532 A | 2/1994 | Hunt |
| 5,291,453 A | 3/1994 | Aota |
| 5,297,091 A | 3/1994 | Blake |
| 5,301,155 A | 4/1994 | Wada |
| 5,301,162 A | 4/1994 | Shimizu |
| 5,301,278 A | 4/1994 | Bowater et al. |
| 5,305,280 A | 4/1994 | Hayano |
| 5,307,469 A | 4/1994 | Mann |
| 5,317,723 A | 5/1994 | Heap et al. |
| 5,319,598 A | 6/1994 | Aralis et al. |
| 5,319,755 A | 6/1994 | Farmwald et al. |
| 5,321,646 A | 6/1994 | Tomishima |
| 5,325,355 A | 6/1994 | Oprescu et al. |
| 5,329,489 A | 7/1994 | Diefendorff |
| 5,335,206 A | 8/1994 | Kawamoto |
| 5,343,425 A | 8/1994 | Saito |
| 5,343,434 A | 8/1994 | Noguchi |
| 5,353,427 A | 10/1994 | Fujishima et al. |
| 5,359,722 A | 10/1994 | Chan et al. |
| 5,361,277 A | 11/1994 | Grover |
| 5,361,343 A | 11/1994 | Kosonocky et al. |
| 5,371,892 A | 12/1994 | Petersen et al. |
| 5,376,839 A | 12/1994 | Horiguchi |
| 5,377,149 A | 12/1994 | Gaultier |
| 5,381,543 A | 1/1995 | Blomgren et al. |
| 5,384,501 A | 1/1995 | Koyama |
| 5,384,745 A | 1/1995 | Konishi et al. |
| 5,390,149 A | 2/1995 | Vogley et al. |
| 5,392,292 A | 2/1995 | Davis |
| 5,404,327 A | 4/1995 | Houston |
| 5,404,338 A | 4/1995 | Murai et al. |
| 5,408,129 A | 4/1995 | Farmwald et al. |
| 5,410,512 A | 4/1995 | Takase |
| 5,452,401 A | 9/1995 | Lin |
| 5,452,420 A | 9/1995 | Engdahl et al. |
| 5,453,991 A | 9/1995 | Suzuki et al. |
| 5,455,923 A | 10/1995 | Kaplinsky |
| 5,473,263 A | 12/1995 | Mahmood |
| 5,473,575 A | 12/1995 | Farmwald et al. |
| 5,479,635 A | 12/1995 | Kametani |
| 5,481,731 A | 1/1996 | Conary et al. |
| 5,485,426 A | 1/1996 | Lee |
| 5,487,050 A | 1/1996 | Kim |
| 5,497,347 A | 3/1996 | Feng |
| 5,498,990 A | 3/1996 | Leung et al. |
| 5,499,385 A | 3/1996 | Farmwald et al. |
| 5,511,024 A | 4/1996 | Ware et al. |
| 5,513,327 A | 4/1996 | Farmwald et al. |
| 5,523,760 A | 6/1996 | McEwan |
| 5,524,249 A | 6/1996 | Suboh |
| 5,537,354 A | 7/1996 | Mochizuki et al. |
| 5,539,696 A | 7/1996 | Patel |
| 5,546,346 A | 8/1996 | Agata et al. |
| 5,561,433 A | 10/1996 | Chaney et al. |
| 5,562,530 A | 10/1996 | Runnels |
| 5,570,053 A * | 10/1996 | Takla ........................ 327/292 |
| 5,574,454 A | 11/1996 | Wilson |
| 5,581,746 A | 12/1996 | Watanabe |
| 5,585,745 A | 12/1996 | Simmons et al. |
| 5,586,332 A | 12/1996 | Jain et al. |
| 5,587,675 A | 12/1996 | Schmitt |
| 5,590,081 A | 12/1996 | Shimizu |
| 5,590,086 A | 12/1996 | Park et al. |
| 5,594,937 A | 1/1997 | Stiles et al. |
| 5,598,554 A | 1/1997 | Litaize et al. |
| 5,604,705 A | 2/1997 | Ackland |
| 5,606,717 A | 2/1997 | Farmwald et al. |
| 5,611,058 A | 3/1997 | Moore et al. |
| 5,613,077 A | 3/1997 | Leung et al. |
| 5,615,169 A | 3/1997 | Leung |
| 5,629,897 A | 5/1997 | Iwamoto et al. |
| 5,636,173 A | 6/1997 | Schaefer |
| 5,638,334 A | 6/1997 | Farmwald et al. |
| 5,655,113 A | 8/1997 | Leung et al. |
| 5,657,481 A | 8/1997 | Farmwald et al. |
| 5,657,841 A | 8/1997 | Morvan |
| 5,666,322 A | 9/1997 | Conkle |
| 5,673,398 A | 9/1997 | Takeda |
| 5,684,753 A | 11/1997 | Hashimoto et al. |
| 5,687,183 A | 11/1997 | Chesley |
| 5,696,729 A | 12/1997 | Kitamura |
| 5,712,882 A | 1/1998 | Miller |
| 5,734,685 A | 3/1998 | Bedell et al. |
| 5,737,587 A | 4/1998 | Leung et al. |
| 5,742,194 A | 4/1998 | Saeki |
| 5,742,798 A | 4/1998 | Goldrian |
| 5,745,421 A | 4/1998 | Pham et al. |
| 5,748,914 A | 5/1998 | Barth et al. |
| 5,754,838 A | 5/1998 | Shibata et al. |
| 5,764,489 A | 6/1998 | Leigh et al. |
| 5,768,213 A | 6/1998 | Jung et al. |
| 5,787,041 A | 7/1998 | Hill et al. |
| 5,790,447 A | 8/1998 | Laudon |
| 5,790,839 A | 8/1998 | Luk et al. |
| 5,809,263 A | 9/1998 | Farmwald et al. |
| 5,815,462 A | 9/1998 | Konishi et al. |
| 5,821,787 A | 10/1998 | McClintock |
| 5,826,026 A | 10/1998 | Friedman |
| 5,829,026 A | 10/1998 | Leung et al. |
| 5,835,956 A | 11/1998 | Park et al. |
| 5,841,580 A | 11/1998 | Farmwald et al. |
| 5,841,707 A | 11/1998 | Cline et al. |
| 5,841,715 A | 11/1998 | Farmwald et al. |
| 5,847,997 A | 12/1998 | Harada et al. |
| 5,847,999 A | 12/1998 | Kwon |
| 5,860,125 A | 1/1999 | Reents |
| 5,873,114 A | 2/1999 | Rahman et al. |
| 5,881,016 A | 3/1999 | Kenkare |
| 5,886,946 A | 3/1999 | Ooishi |
| 5,892,713 A | 4/1999 | Jyouno |
| 5,915,105 A | 6/1999 | Farmwald et al. |

| | | | | | | |
|---|---|---|---|---|---|---|
| 5,917,760 | A | 6/1999 | Millar | | FOREIGN PATENT DOCUMENTS | |
| 5,928,343 | A | 7/1999 | Farmwald et al. | | | |
| 5,929,729 | A | 7/1999 | Swarup | DE | 37-42-487 | 7/1988 |
| 5,930,197 | A | 7/1999 | Ishibashi et al. | DE | 3850770 T2 | 1/1995 |
| 5,936,885 | A | 8/1999 | Morita | EP | 0028735 A2 | 5/1981 |
| 5,936,903 | A | 8/1999 | Jeng | EP | 0 126 976 | 12/1984 |
| 5,944,836 | A | 8/1999 | Edahiro | EP | 0 166 192 | 1/1986 |
| 5,953,263 | A | 9/1999 | Farmwald et al. | EP | 0 187 289 | 7/1986 |
| 5,954,804 | A | 9/1999 | Farmwald et al. | EP | 0 189 576 | 8/1986 |
| 5,955,904 | A | 9/1999 | Kawasaki | EP | 0 218 523 | 4/1987 |
| 5,969,986 | A | 10/1999 | Wong et al. | EP | 0 246 767 | 11/1987 |
| 5,983,320 | A | 11/1999 | Farmwald et al. | EP | 0 276 871 | 3/1988 |
| 5,995,443 | A | 11/1999 | Farmwald et al. | EP | 0 282 735 | 9/1988 |
| 6,002,589 | A | 12/1999 | Perino et al. | EP | 0282735 A2 | 9/1988 |
| 6,014,339 | A | 1/2000 | Kobayashi et al. | EP | 0 329 418 A2 | 8/1989 |
| 6,032,214 | A | 2/2000 | Farmwald et al. | EP | 0 334 552 | 9/1989 |
| 6,032,215 | A | 2/2000 | Farmwald et al. | EP | 0-339-224 | 11/1989 |
| 6,034,573 | A | 3/2000 | Alderton | EP | 0 348 113 A2 | 12/1989 |
| 6,034,918 | A | 3/2000 | Farmwald et al. | EP | 0449052 A2 | 3/1991 |
| 6,035,365 | A | 3/2000 | Farmwald et al. | EP | 0 424 774 | 5/1991 |
| 6,038,195 | A | 3/2000 | Farmwald et al. | EP | 0424774 A2 | 5/1991 |
| 6,044,426 | A | 3/2000 | Farmwald et al. | EP | 0 449 052 | 10/1991 |
| 6,049,846 | A | 4/2000 | Farmwald et al. | EP | 0457403 A2 | 11/1991 |
| 6,067,592 | A | 5/2000 | Farmwald et al. | EP | 0509811 A2 | 10/1992 |
| 6,070,222 | A | 5/2000 | Farmwald et al. | EP | 0617364 A2 | 9/1994 |
| 6,085,284 | A | 7/2000 | Farmwald et al. | EP | 0884732 A2 | 12/1998 |
| 6,088,774 | A | 7/2000 | Gillingham | EP | 0994420 A2 | 4/2000 |
| 6,091,667 | A | 7/2000 | Tanaka | EP | 1004956 A2 | 5/2000 |
| 6,101,152 | A | 8/2000 | Farmwald et al. | EP | 1022641 A1 | 7/2000 |
| 6,104,251 | A | 8/2000 | Ramey et al. | EP | 1022642 A1 | 7/2000 |
| 6,112,287 | A | 8/2000 | Litaize et al. | EP | 1050824 A2 | 11/2000 |
| 6,128,696 | A | 10/2000 | Farmwald et al. | EP | 1004956 B1 | 1/2001 |
| 6,128,700 | A | 10/2000 | Hsu et al. | EP | 0605887 B1 | 9/2001 |
| 6,150,866 | A | 11/2000 | Eto | EP | 1022642 B1 | 9/2001 |
| 6,181,178 | B1 | 1/2001 | Choi | EP | 1197830 A2 | 4/2002 |
| 6,182,184 | B1 | 1/2001 | Farmwald et al. | EP | 0994420 B1 | 1/2006 |
| 6,185,644 | B1 | 2/2001 | Farmwald et al. | EP | 1-640-847 | 3/2006 |
| 6,204,695 | B1 | 3/2001 | Alfke et al. | EP | 1640847 A2 | 3/2006 |
| 6,226,723 | B1 | 5/2001 | Gustavson et al. | EP | 1197830 B1 | 10/2006 |
| 6,249,481 | B1 | 6/2001 | Toda et al. | EP | 1146642 B1 | 12/2006 |
| 6,259,288 | B1 | 7/2001 | Nishimura | EP | 1022641 B1 | 3/2007 |
| 6,260,097 | B1 | 7/2001 | Farmwald et al. | EP | 1640847 B1 | 6/2007 |
| 6,266,285 | B1 | 7/2001 | Farmwald et al. | EP | 1816569 A2 | 8/2007 |
| 6,272,577 | B1 | 8/2001 | Leung et al. | EP | 1816570 A2 | 8/2007 |
| 6,304,071 | B1 | 10/2001 | Popplewell et al. | EP | 1830241 A1 | 9/2007 |
| 6,304,937 | B1 | 10/2001 | Farmwald et al. | EP | 1830241 B1 | 6/2008 |
| 6,314,051 | B1 | 11/2001 | Farmwald et al. | EP | 1816569 B1 | 1/2009 |
| 6,324,120 | B2 | 11/2001 | Farmwald et al. | GB | 329418 | 3/1929 |
| 6,345,321 | B1 | 2/2002 | Litaize et al. | GB | 1262691 | 2/1972 |
| 6,378,020 | B2 | 4/2002 | Farmwald et al. | GB | 2197553 | 5/1988 |
| 6,415,339 | B1 | 7/2002 | Farmwald et al. | GB | 2-197-553 | 5/1988 |
| 6,418,500 | B1 | 7/2002 | Gai | GB | 2-201-569 | 9/1988 |
| 6,426,916 | B2 | 7/2002 | Farmwald et al. | JP | 56-047996 | 4/1981 |
| 6,430,242 | B1 | 8/2002 | Buchanan | JP | 56-082961 | 7/1981 |
| 6,434,081 | B1 | 8/2002 | Johnson et al. | JP | 57-014922 | 1/1982 |
| 6,442,644 | B1 | 8/2002 | Gustavson et al. | JP | 57-033471 | 2/1982 |
| 6,452,863 | B2 | 9/2002 | Farmwald et al. | JP | 57-210495 | 12/1982 |
| 6,501,313 | B2 | 12/2002 | Boerstler | JP | 58-031637 | 2/1983 |
| 6,559,531 | B1 | 5/2003 | Sutherland | JP | 59-165285 | 3/1983 |
| 6,598,171 | B1 | 7/2003 | Farmwald et al. | JP | 58-080193 | 5/1983 |
| 6,701,280 | B2 | 3/2004 | Horne | JP | 58-184626 | 10/1983 |
| 6,707,759 | B2 | 3/2004 | Song | JP | 58-184647 | 10/1983 |
| 6,708,248 | B1 | 3/2004 | Garrett, Jr. et al. | JP | 58-192154 | 11/1983 |
| 6,731,692 | B1 | 5/2004 | Bhoja | JP | 59-135684 | 8/1984 |
| 7,042,914 | B2 | 5/2006 | Zerbe | JP | 59-165285 | 9/1984 |
| 7,043,599 | B1 | 5/2006 | Ware et al. | JP | 60-055459 | 3/1985 |
| 7,058,063 | B1 | 6/2006 | Cavendish | JP | 60-080193 | 5/1985 |
| 7,307,442 | B2 | 12/2007 | Ong | JP | 60-261095 | 12/1985 |
| 2002/0032900 | A1 | 3/2002 | Charisius et al. | JP | 61-028248 | 2/1986 |
| 2002/0051396 | A1 | 5/2002 | Higashiho et al. | JP | 61-072350 | 4/1986 |
| 2003/0161208 | A1 | 8/2003 | Nakashima et al. | JP | 61-107453 | 5/1986 |
| | | | | JP | 61-160129 | 7/1986 |

| | | |
|---|---|---|
| JP | 61-160130 | 7/1986 |
| JP | 61-220193 | 9/1986 |
| JP | 61-160556 | 10/1986 |
| JP | 61-245255 | 10/1986 |
| JP | 62-016289 | 1/1987 |
| JP | 62-51093 | 3/1987 |
| JP | 62-51387 | 3/1987 |
| JP | 62-051509 | 3/1987 |
| JP | 62-71428 | 4/1987 |
| JP | 62-120553 | 6/1987 |
| JP | 62-125589 | 6/1987 |
| JP | 62-135949 | 6/1987 |
| JP | 62-185253 | 8/1987 |
| JP | 63-034795 | 2/1988 |
| JP | 63-046864 | 2/1988 |
| JP | 63-091766 | 4/1988 |
| JP | 63-142445 | 6/1988 |
| JP | 63-217452 | 9/1988 |
| JP | 63-239676 | 10/1988 |
| JP | 63-244389 | 10/1988 |
| JP | 63-276871 | 11/1988 |
| JP | 63-276935 | 11/1988 |
| JP | 63-300310 | 12/1988 |
| JP | 64-29951 | 1/1989 |
| JP | 64-029951 | 1/1989 |
| JP | 64-43894 | 2/1989 |
| JP | 64-043894 | 2/1989 |
| JP | 64-059428 | 3/1989 |
| JP | 01-124193 | 5/1989 |
| JP | 1-124193 | 5/1989 |
| JP | 1-159891 | 6/1989 |
| JP | 01-163849 | 6/1989 |
| JP | 01-166545 | 6/1989 |
| JP | 1-232597 | 9/1989 |
| JP | 01-236494 | 9/1989 |
| JP | 1-271861 | 10/1989 |
| JP | 01-284132 | 11/1989 |
| JP | 02-12687 | 1/1990 |
| JP | 02-008950 | 1/1990 |
| JP | 02-028950 | 1/1990 |
| JP | 02-128201 | 5/1990 |
| JP | 03-076094 | 4/1991 |
| JP | 06-103153 | 4/1994 |
| JP | 06-251509 | 9/1994 |
| JP | 08-006842 | 1/1996 |
| JP | 2000-035831 A | 2/2000 |
| JP | 2000-307421 | 11/2000 |
| WO | WO 82/02615 | 8/1982 |
| WO | WO 89/06013 | 6/1989 |
| WO | WO 89/12936 | 12/1989 |
| WO | WO 91/16680 | 10/1991 |
| WO | WO 0002140 | 1/2000 |
| WO | WO 2004/008490 A2 | 1/2004 |

OTHER PUBLICATIONS

Agarwal, A., et al., "An Analytical Cache Model", ACM Trans. on Comp. Sys., vol. 7, No. 2, p. 184–215, May 1989.

Agarwal, A., et al., "An Evaluation of Directory Scemes for Cache Conference", IEEE, 15th Intern Symp. Comp. Architecture, p. 280–289, Jun. 1988.

Ahlquist, C. Norman, et al., "A 16 384–Bit Dynamic Ram," IEEE Journal of Solid–State Circuits, vol. SC–11, No. 5 (Oct. 1976), pp. 570–573.

Alnes, Knut, "Scalable Coherent Interface", SCI–Fweb.89–Fweb.89–doc52, (To Appear in Eurobus Conference Proceedings May 1989). p. 1–8.

Alnes, Knut, "SCI: A proposal for SCI Operation", SCI—Jan. 6, 1989—doc31, Norsk Data, Oslo, Norway, p. 1–24, Jan. 6, 1989.

Alnes, Knut, Norsk Data Report, SCI–Nov. 10, 1988–doc23, SCI: A Proposal For SCI Operation.

Amitai, Zwie, "Burst Mode Memories Improve Cache Design," WESCON/90 Conference Record, pp. 279–282 (Nov. 1990).

Amitai, Zwie, "New System Architectures for DRAM Control and Error Correction," Monolithic Memories Inc., Electro/87 and Mini/Mico Northeast: Focusing on the OEM Conference Record, pp. 1–9, (Apr. 1987).

Anceau, Francois, "A Synchronous Approach for Clocking VLSI Systems," IEEE Journal of Solid–State Circuit, vol. SC–17, No. 1, Feb. 1982, pp. 51–56.

Atwood, John, "p5 18M RDRAM Test Modes" (Aug. 3, 1992).

Baba, Fumio, et al., "A 64–K DRAM with 35 ns Static Column Operation," IEEE Journal of Solid–State Circuits, vol. SC–18, No. 5, (Oct. 1983), pp. 447–451.

Bakka, et al., "SCI: Logical Level Proposals—Working Paper", Jan. 6, 1989.

Bazes, M., et al., "A Programmable NMOS DRAM Controller for Microcomputer Systems with Dual–Port Memory and Error Checking and Correction", IEEE Journal of Solid State Circuits, vol. SC–18, No. 2, p. 164–172, Apr. 1983.

Boysel, et al., "Four–Phase LSI Logic Offers New Approach to Computer Designer", Four–Phase Systems Inc. Cupertino, CA, Computer Design, Apr. 1970, p. 141–146.

Boysel, et al., "Random Access MOS Memory Packs More Bits to the Chip", Electronics, Feb. 16, 1970, p. 109–146.

Bursky, Dave, "Memory–CPU Interface Speeds Up Data Transfers," Electronic Design, pp. 137–142 (Mar. 19, 1992).

Bursky, Dave, "Multibanked Architecture Provides Fast, Flexible, and Redundant DRAMS," Electronic Design, pp. 41–42 (Aug. 22, 1994).

Bursky, Dave, "Advanced Self–Timed SRAM Pares Access Time to 5ns," Electronic Design, pp. 145–147 (Feb. 22, 1990).

Callahan, R.W. et al., "Burst–Mode PIO Bus Control," IBM Technical Disclosure Bulletin, vol. 21, No. 4, pp. 1417–1419, (a delphion.com reprint on two sheets) (Sep. 1978).

Carson, J., et al., "Advanced On–Focal Plane Signal Processing for Non–Planar Infrared Mosaics", SPIE, vol. 311; p. 53–58, 1981.

Chesley, G., "Virtual Memory Integration", Submitted to IEETC, Sep. 1983.

Chipworks, "MoSys MD909SJ–5–100 288+32Bit Multibank DRAM Identification Report," (Apr. 11, 2007).

Choi, et al., "16Mbit Synchronous DRAM with 125Mbyte/sec Data Rate", 1993 Symposium on VLSI Circuits, Digest of Technical Papers, p. 65–66, 1993.

Chun, J., et al., "A 1.2ns GaAs 4K Read Only Memory", IEEE Gallium Arsenide Integrated Circuit Symposium Technical Digest, p. 83–86, Nov. 1988.

Chun, Jino et al., "A Pipelined 650MHz GaAs 8K ROM with Translation Logic," GaAs IC Symposium, 1990 IEEE, pp. 139–142.

Colwell, Rebert P. et al., "Performance Effects of Architectural Complexity in the Intel 432," ACM Transactions on Computer Systems, vol. 6, No. 3, pp. 296–339 (Aug. 1988).

Davidson, E., "Electrical Design of a High Speed Computer Package", IBM J. Res. Develop., vol. 26, No. 3, p. 349–361, May 1982.

Dix, G. L., et al., "Common Chips for Use in Disk and Diskette Controllers", IBM J. Res. Develop., vol. 26, No. 4, Jul. 1982, pp. 440–445.

Dubois, Michel et al., "Effects of Cache Coherency in Multiprocessors," IEEE Transaction in Computers, vol. C–31, No. 11, pp. 1083–1099, Nov. 1982.

Ebel, et al., "A 4096–Bit High–Speed Emitter–Coupled–Logic (ECL) Compatible Random–Access Memory" IEEE Journal of Solid–State Circuits, vol. SC–10, No. 5, pp. 262–267, Oct. 1976.

Emmerson, Richard et al., "Fault Tolerance Achieved in VLSI," IEEE MICRO, Dec. 1984, pp. 34–43.

European Search Report, dated Dec. 2, 1990, from European Patent Application No. 89 30 2613.

Fagan, John L., "A 16–kbit Nonvolatile Charge Addressed Memory," IEEE Journal of Solid–State Circuits, vol. SC–11, No. 5, pp. 631–636 (Oct. 1976).

Fellin et al., Designing Memory Systems with the 8K×8 iRAM, Intel, Application Note, AP–132 (Jun. 1982).

Fielder, Alan et al., "A 3 NS IK X 4 Static Self–Timed GaAs RAM," GaAs IC Symposium IEEE Gallium Arsenide Integrated Circuit Symposium, Technical Digest 1988, pp. 67–70, (Nov. 1988).

Frank, Edward H., "The SBUS: Sun's High Performance Bus for RISC Workstations," Sun Microsystems Inc., 1990 IEEE, pp. 189–194.

Frisone, J., "A Classification for Serial Loop Data Communications Systems", Raleigh Patent Operations, Nov. 2, 1972.

Fujii, Syuso, et al., "A 45–ns. 16–Mbit DRAM with Triple–Well Structure," IEEE Journal of Solid–State Circuits, vol. 24, No. 5 (Oct. 1989), pp. 1170–1175.

Fujii, Syuso, et al., "A Low–Power Sub 100 ns 256K Bit Dynamic RAM,", IEEE Journal of Solid–State Circuits, vol. SC–18, No. 5 (Oct. 1983), pp. 441–446.

Fujitsu, "Memories 1986–87 Databook," Fujitsu Inc., 1986 (pp. 1–102 to 1–128).

Fujiwara, et al., "A200MHz 16Mbit Synchronous DRAM with Block Access Mode", 1994 Symposium on VLSI Ciruits Digest of Technical Papers, p. 79–80, 1994.

Gary, Sonya et al., "The Power PC 603 Microprocessor: A LowPower Design for Portable Applications," 1994 IEEE, pp. 307–315 (1994).

Gelsinger, Pelsinger P. et al., "Microprocessors circa 2000," IEEE Spectrum, Oct. 1989, pp. 43–47.

Gerninger, Edward F. et al., "A Survey of Commercial Parallel Processors," Computer Architecture News, vol. 16, No. 4, Sep. 1988, pp. 75–107.

Gigabit Logic, Inc, "1989 GaAs IC Data Book & Designers Guide" (Aug. 1989).

Gigabit Logic, Inc., 1988 GaAs IC Data Book & Designers Guide (May 1988).

Gillingham, Peter, "SLDRAM Architectural and Functional Overview," 1997 SLDRAM Consortium (Aug. 1997).

Glew, Andy, "Motorola MC68030 Cache Organization," posting to Internet Newsgroup net.arch by aglew@ccvaxa.UUCP (a google.com reprint on two sheets) (Sep. 29, 1986).

Graham, Andy et al., "Pipelined Static RAM Endows Cache Memories with 1–ns Speed," Electronic Design, pp. 157–170 (Dec. 1984).

Gregory Uvieghara et al., "An On–Chip Smart Memory for a Data–Flow CPU," IEEE Journal of Solid–State Circuits, vol. 25, No. 1, pp. 84–89 (Feb. 1990).

Grover, et al., "Precision Time–Transfer in Transport Networks Using Digital Crossconnect Systems", IEEE Paper 47.2 Globecom, 1988, p. 1544–1548.

Gustavson, David B. et al, "The Scalable Coherent Interface Project (Superbus)," Aug. 22, 1988, Draft., Rev. 14, pp. 1–16.

Gustavson, David B., "Scalable Coherent Interface," SCI–C [1 and SCI 2] (Nov. 28, 1988).

Gustavson, David B., "Scalable Coherent Interface," Invited Paper, COMPCON Spring '89, San Francisco, CA (Feb. 27–Mar. 3, 1989), IEEE, pp. 536–538.

Hansen, et al., "A RISC Microprocessor with Intregal MMU and Cache Interface", MIPS Computer Systems, Sunnyvale, CA, IEEE 1986, p. 145–148.

Hart, F., "Multiple Chips Speed CPU Subsytems", High–Performance Systems, p. 45–55, Sep. 1989.

Hatakeyama, et al., TP 4.5: A256Mb SDRAM Using a Register–Controlled Digital DLL, IEEE ISSCC Digest of Technical Papers, Feb. 6–8, 1997.

Hawley, D., "Superfast Bus Supports Sophisticated Transactions", High Performance Systems, p. 90–94, Sep. 1989.

Hidaka, Hideto et al., "The Cache DRAM Architecture: A DRAM With An On–Chip Cache Memory," IEEE Micro (Apr. 1990).

Hopper, Andy et al., "Multiple vs. Wide Shared Bus Multiprocessors," Proceedings of the 16$^{th}$ Annual International Symposium on Computer Architecture, Jerusalem, Israel, Jun. 1989, IEEE Computer Society Press, 1989.

Horowitz, Mark et al., "MIPS–X: A 20–MIPS Peak 32–bit Microprocessor with On–Chip Cache", IEEE Journal of Solid State Circuits. vol. 22, No. 5, pp. 790–799 (Oct. 1987).

Horowitz, Market et al., "PLL Design for a 500 MBIs Interface," ISSCC 93; Session 10—High–speed Communication and Interfaces (1993).

Hyundai, DDR SDRAM Device Operation, Rev. 0.2, published Dec. 1998.

Hyundai, HYDV651622, Rev. 0.9, published Jan. 2000.

Hyundai, HY57V658020B, Rev. 1.2, published Dec. 1998.

Hyundai, SDRAM Timing Diagram, Rev. 1.2, published Dec. 1999.

IBM, "Range Check of an Address Counter", IBM Technical Disclosure Bulletin, p. 2136–2137, Dec. 1973.

IBM, "Accordion Start–Stop Sequencer for a Variable Cycle Storage Controller," IBM Technical Disclosure Bulletin, pp. 2074–2075, (a delphion.com reprint on two sheets) (Oct. 1986).

IBM, "Fast Packet Bus for Microprocessor Systems with Caches," IBM Technical Disclosure Bulletin, vol. 31, No. 8, pp. 279–282 (Jan. 1989).

IEEE, "IEEE Standard for a Simple 32–Bit Backplane Bus", ANSI/IEEE Std., p. 1193–1987, Feb. 24, 1988.

IEEE, "IEEE Standard for High–Bandwidth Memory Interface Based on Scalable Coherent Interface (SCI) Signaling Technology", IEEE Std., p. 1596.4–1996, Sep. 15, 1996.

IEEE, "IEEE Standard for scalable Coherent Interface (SCI)", IEEE Std. 1596–1992, Aug. 2, 1993.

Ikeda, Hiroaki et al., "100 MHz Serial Access Architecture for 4Mb Field Memory," 1990 Symposium on VLSI Circuits, Digest of Technical Papers, pp. 11–12 (Jun. 1990).

Integrated Device Technology Inc., "High Speed CMOS Databook", Santa Clara, CA, p. 9–1 to 9–14, 1988.

Intel, "Intel iAPX432 Interconnect Architecture Reference Manual", Intel document No. 172487–001, Dec. 1982.

Intel, Electrical Specifications for iAPX 43204 Bus–Interface Unit (BIU) and iAPX 43205 Memory control unit (MCU), Mar. 1983.

Intel, "Intel MCS–4 Micro Computer Set Datasheet," Intel Corporation, Santa Clara, CA, 1972, (pp. 1–12).

Intel, "Intel MCS–4 Micro Computer Set Users Manual," Intel Corporation, Santa Clara, CA, Mar. 1972, pp. 1–26 and 60–68.

Intel, "Memory Components Handbook," 1985, Chapter 1 and Chapter 3, Application Note AP–132.

Intel, iAPX 43204, iAPX 43205, Fault Tolerant Bus Interface and Memory Control Units, Intel Publication No. 210963–001, pp. 1–32, Mar. 1983.

Intel, iAPX432 GDP Datasheet, Intel iAPX 43202 VLSI General Data Processors Data Sheet, Intel Publication No. 171873–001 Rev. A (1981).

Intel, iAPX432 IP Datasheet, Intel iAPX43203 VLSI Interface Processor Data Sheet, Intel Publication No. 171874–001 Rev. A (1981).

Iqbal, Mohammad Shakaib, "Internally Timed RAMs Build Fast Writable Control Stores," Electronic Design, pp.93–96 (Aug. 25, 1988).

Ishimoto, Syoji. et al., "A 256K Dual Port Memory," 1985 IEEE International Solid–State Circuits Conference, Digest of Technical Papers, pp. 38–39 (Feb. 1985).

James, David., "Scalable I/O Architecture for Buses," IEEE, pp. 539–544 (Apr. 1989).

JEDEC, "Double Data Rate (DDR) SDRAM Specification", JEDEC Standard–JESD79D, Jan. 2004.

JEDEC, "JC–42.3 Minutes of Meeting No. 75—Committe on RAM Memories," (May 24, 1995).

JEDEC, "JC–42.3 Task Group Minutes—Meeting on Synchronous DRAM Ballots," (Jan. 21, 1993).

JEDEC, "Minutes of Meeting No. 48–JC–42.3 Committe on MOS Memories w/ Attachment L Proposal," JC 42.3 Committe On MOS Memories (Dec. 7, 1988).

JEDEC, Joint Electron Device Engineering Council (JEDEC) Standard No. 21–C, Revision 9 published in 1999.

JEDEC, Minutes of Meeting No. 51 JC 42.3 Committe On MOS Memories, JC 42.3 Committe On MOS Memories (Sep. 12, 1989).

Jeong, Deog–Kyoon et al., "Design of PLL–Based Clock Generation Circuits," IEEE Journal of Solid–State Circuits, vol. SC–22, No. 2, Apr. 1987, pp. 255–261.

Jeremiah, T.L. et al., "Synchronous LSSD Packet Switching Memory And I/O Channel," IBM Tech., Disc. Bul,. vol. 24, No. 10, pp. 4986–4987 (Mar. 1982).

Johnson et al., "A Variable Delay Line PLL for CPU–Coprocessor Synchronization," IEEE Jounal of Solid–State Circuits, vol. 23, No. 5, Oct. 1988, p. 1218–1223.

Johnson, Dave et al., "Intel iAPX 432–VLSI Building Blocks for a Fault–Tolerant Computer," AFIPS Conference Proceedings, 1983 National Computer Conference, pp. 531–537 (May 16–19, 1983).

Johnson, Mark G. et al., "THAM 11.3: A Variable Delay Line Phase Loop for CPU–Coprocessor Synchronization," ISSCC 88 Session XI: High–Speed Logic, pp. 142–143, 334, and 336 (Feb. 18, 1988).

Jones, David, "Synchronous static ram," Electronics and Wireless World, vol. 93, No. 1622, pp. 1243–1244 (Dec. 1987).

Kalter, Howard L. et al., "A 50–ns 16Mb DRAM with a 10–ns Data Rate and On–Chip ECC," IEEE Journal of Solid State Circuits, vol. 25, No. 5, pp. 1118–1128 (Oct. 1990).

Kalter, Howard L., et al., "An Experimental 80–ns 1–Mbit DRAM with Fast Page Operation," IEEE Journal of Solid–State Circuits, vol. SC–20, No. 5 (Oct. 1985), pp. 914–923.

Kanellos, Future of memory market hangs on Rambus trials—It's the trial of the century, at least as far as the memory industry is concerned, CNET News.com, Feb. 12, 2001, http://news.com/com/Future+of+memory+hangs+on+Rambus+trials/2100–1001_3–252404.html.

Kanopoulos, Nick et al., "A First–In, First–Out Memory for Signal Processing Applications," IEEE Transactions on Circuits and Systems, vol. CAS–33, No. 5, pp. 556–558 (May 1986).

Kawahara, Takayuki, et al., "A Charge Recycle Refresh for Gb–Scale DRAM's in File Applications," IEEE Journal of Solid–State Circuits, vol. 29 (Jun. 1994), pp. 715–722.

Kawamoto, Hiroshi et al., "A 288K CMOS Pseudostatic RAM," IEEE Journal of Solid–State Circuits, vol. SC–1, No. 5, Oct. 1984, pp. 619–623.

Khan, A., "What's the Best Way to Minimize Memory Traffic", High Performance Systems, p. 49–67, Sep. 1989.

Kimoto, Masayoshi, "A 1.4ns/64kb RAM with 85ps/3680 Logic Gate Array", IEEE 1989 Custom Integrated Circuits Conference, pp. 15.8.1–15.8.4.

Knight, Tom et al., "Self Terminating Low Voltage Swing CMOS Output Driver," IEEE 1987 Custom Integrated Circuits Conference, Jul. 1987, pp. 289–292.

Kristiansen, et al., Scalable Coherent Interface, Feb. 1989.

Kuriyama, Hirotada et al., "A 4–Mbit CMOS SRAM With 8–NS Serial Access Time,"1990 Symposium on VLSI Circuits, Digest of Technical Papers, IEEE, pp. 51–52, (Jun. 1990).

Kurnanoya, Masakiel al., "A Reliable 1–Mbit DRAM with a Multi–Bit–Test Mode," IEEE Journal of Solid–State Circuits, vol. sc–20, No. 5, pp. 909–913 (Oct. 1985).

Kushiyama, N. et al., "500 Mbytetsec Data– Rate 5 12 Kbits x 9 DRAM Using a Novel I10 Interface," 1992 Symposium on VLSI Circuits Digest of Technical Papers (1992).

Kushiyama, Natsuki et al., "A 500–Megabytels Data–Rate 4.5M DRAM," IEEE Journal of Solid–State Circuits, vol. 28, No. 4, pp. 490–498 (Apr. 1, 1993 OR Apr. 1994).

Kushiyama, Natsuki, et al., "A 12–MHz Data Cycle 4–Mb DRAM with Pipeline Operation," IEEE Journal of Solid–State Circuits, vol. 26, No. 4 (Apr. 1991), pp. 479–483.

Kwon, S., et al., Memory Chip Organizations for Improved Reliability in Virtual Memories IBM Technical Disclosure Bulletin, vol. 25, No. 6, p. 2952–2957, Nov. 1982.

Lee, Hsing–San et al., "An Experimental 1–Mbit CMOS SRAM with Configurable Organization and Operation," IEEE Journal of Solid State Circuits, vol. 23, No. 5 (Oct. 1988).

Lee, Thomas H. et al., "A 2.5 V CMOS Delay– Locked Loop for an 18Mbit, 500 Megabytels DRAM," IEEE Journal of Solid–State Circuits, vol. 29, No. 12, pp. 1491 1496 (Dec. 1994).

Lee, Thomas H. et al., "A 2.5 V Delay–Locked Loop for an 18 Mbit, 500 Megabytels DRAM," Solid–state Circuits Conference, 1994. Digest of Technical Papers. 41st ISSCC., 1994 IEEE International (Feb. 1994).

Lidington, Gary P., "Overview of the MicroVAX 3500/3600 Processor Module," Digital Technical Journal, No. 7, Aug. 1988, pp. 79–86.

Lineback, J. Robert, "System Snags Shouldn't Slow the Boom in Fast Static RAMs," Electronics, pp. 60–62 (Jul. 23, 1997).

Lines, Valerie et al., "High Speed Circuit Techniques in a 150Mhz 64M SDRAM," IEEE, pp. 8–11 (1997).

Llewellyn, et al., "WAM 1.1 A33Mb/s Data Synchronizing Phase–Locked–Loop Circuit", IEEE ISSCC Digest of Technical Papers, 1988, p. 12–13,276–277, Feb. 17, 1988.

Lodi, Robert J. et al., "Chip and System Characteristics of a 2048–Bit MNOS–BORAM LSI Circuit," 1976 IEEE International Solid–State Circuits Conference , Feb. 1976, pp. 62–63, 223.

Lodi, Robert J. et al., "MNOS–BORAM Memory Characteristics," IEEE Journal of Solid–State Circuits, vol. SC–11, No. 5, pp. 622–631 (Oct. 1976).

LSI Logic Preliminary Datasheet, "LR2000 High Performance RISC Microprocessor," Sep. 1998.

LSI Logic Preliminary Datasheet, "LR2010 Floating–Point Accelerator," Nov. 1988.

Lu, et. al., "A Novel CMOS Implementation of Double–Edge–Triggered Flip–Flops", IEEE Journal of Solid–State Circuits, vol. 25, No. 4, p. 1008–1010, Aug. 1990.

Lu, Nicky C.C., et al., "A 20–ns 128–kbit X 4 High–Speed DRAM 30–Mbit/s Data Rate," IEEE Journal of Solid–State Circuits, vol. 23, No. 5 (Oct. 1988), pp. 149.

Lu, Nicky et al., "The Future of DRAMS," 1988 IEEE International Solid–State Circuits Conference, Digest of Technical Papers, Feb. 1988, pp. 98–99.

MacDonald, et al., FAM 16.2: 200Mb Wafer Memory, IEEE IssCC, Digest of Technical Papers, 1989, p. 240–241, 350, Feb. 17, 1989.

Margulis, N., "Single Chip RISC CPU Eases Single Chip System Design", High Performance Systems, p. 34–36, 40–41, and 44, Sep. 1989.

Martino, William L. Jr., et al., "An On–Chip Back–Bias Generator for MOS Dynamic Memory," IEEE Journal of Solid–State Circuits, vol. SC–15, No. 5 (Oct. 1980), pp. 820–826.

Matick, R., "Comparison of Memory Chip Organizations vs. Reliability in Virtual Memories", FTCS 12$^{th}$ Annual International Symposium Fault–Tolerant Committee, p. 223–227, Jun. 2, 1984.

Mattausch, Hans–Jurgen et al., "A Memory–Based High–Speed Digital Delay Line with a Large Adjustable Length," IEEE Journal of Solid–State Circuits, vol. 23, No. 1, pp. 105–110 (Feb. 1988).

McGeady, "The i960CA SuperScalar Implementation of the 80960 Architecture", 1990 COMPCON Proceedings, p. 232–240.1990.

Metzeger, Larry r., "A 16K CMOS PROM with Polysilicon Fusible Links," IEEE Journal of Solid State Circuits, vol. 18, No. 5, pp. 562–567 (Oct. 1983).

Micro Design Resources Inc., "MIPS Chip Set Implements Full ECL CPU," Microprocessor Report, vol. 3, No. 12, Dec. 1989, pp. 1–24.

Miller, Frank et al., "High Frequency System Operation Using Synchronous SRAMS," Mideon/87 Conference Record, pp. 430–433 Chicago, IL, Sep. 15–17, 1987.

MIPS Computer Systems Inc., "R6000 System Bus & R6020 SBC Specification," Sunnyvale, CA, Aug. 22, 1989

Miyamoto, Hiroshi, et al., A Fast 266K x4 CMOS DRAM with a Distributed Sense and Unique Restore Circuit, IEEE Journal of Solid–State Circuits, vol. SC–22, No. 5 (Oct. 987), pp. 861–867.

Miyamoto, Hiroshim et al., "Improved Address Buffers, TTL Input Current Reduction, and Hidden Refresh a 4–Mb Dram," IEEE Journal of Solid–State Circuits, vol. 25, No. 2 (Apr. 1990).

Morgan, David, "The CVAX CMCTL—A CMOS Memory Controller Chip," Digital Technical Journal, No. 7, Aug. 1988, pp. 139–143.

MOSAID Technologies Inc., "MOSAID's Synclink Feasibility v 1.1," Provisional Application SN 60057092 (Aug. 1997).

MoSys, MoSys Data Sheet—"MD904 to MD920,½ tp 2 112 Mbyte Multibank DRAM (MDRAM) 128Kx32 to 656Kx32," (Feb. 1997).

MoSys, MoSys Data Sheet—"MD904 to MD920,112 to 2 112 Mbyte Multibank DRAM (MDRAM) 128Kx32 to 656–x32," (Dec. 1995).

MoSys, "MoSys Incorporated Technology White Paper," (Jul. 1994).

MoSys, "MoSys MD909SJ–5–100 288Kx32Bit Multibank DRAM Identification Report," (Apr. 11, 2007).

Motorola MC88200 Cache/Memory Management Unit User's Manual, Motorola Inc., 1989.

Moussouris, J., et al., "A CMOS Processor with Integrated Systems Functions", MIPS Computer Systems, Sunnyvale, CA, IEEE 1986, p. 126–130.

Moussouris, J., 'The Advanced Systems Outlook–Life Beyond RISC: The Next 30 Years in High–Performance Computing', Computer Letter, Jul. 31, 1989 (an edited excerpt from an address at the fourth annual conference on the Advanced Systems Outlook, in San Francisco, CA (Jun. 5)).

Muchmore, S., "Designing Computer Systems Based on Multibus II," New Electronics, vol. 20, No. 16, pp. 31–32 (Aug. 11, 1987).

Nitta, et al., "SP 23.5: 1.6 GB/s Data–Rate 1 Gb Synchronous DRAM with Hierarchical Square–Shaped Memory Block and Distributed Bank Architecture", IEEE ISSCC Digest of Technical Papers, p. 376–377, 477, Feb. 10, 1996.

Nogami, Kazutaka et al., "A 9–ns HIT–Delay 32–kbyte Cache Macro for High–Speed RISC," IEEE Journal of Solid State Circuits, vol. 25, No. 1, pp. 100–108 (Feb. 1990).

Numata, Kenji et al., "New Nibbled–Page Architecture for High Density DRAM's," IEEE Journal of Solid State Circuits, vol. 24, No. 4, pp. 900–904, 08/00/1989.

Ogiue, Katsumi et al., "13–ns, 500–mW, 64–kbit ECL RAM Using HI–BICMOS Technology," IEEE Journal of Solid–State Circuits, vol. SC–21, No. 5, Oct. 1986, pp. 681–685.

Ohno, Chikai, "Self–Timed RAM: STRAM," Fujitsu Sci. Tech. J., 24, 4, pp. 293–300 (Dec. 1988).

Ohta, Kiyoto, "A 1–Mbit DRAM with 33–MHz Serial I/O Ports," IEEE Journal of Solid State Circuits, vol. 21, No. 5, pp. 649–654 (Oct. 1986).

Patterson, David A. et al., "Computer Architecture A Quantitative Approach," Morgan Kaufmann Publishers, Inc., San Francisco, CA, Second Ed., excerpt (1996).

Pease, R., et al., "Physical Limits to the Useful Packaging Density of Electronic Systems", Standard Center for Integrated Systems, Stanford University, Sep. 1988.

Pelgrom, et al., "A 32–kbit Variable–Length Shift Register for Digital Audio Application", IEEE Journal of Solid–State Circuits, vol. SC–22, No. 3, p. 415–422, Jun. 1987.

Pelgrom, Marcel et al., "A 32–Kbit Variable Length Shift Register for Digital Audio Application," ESSCIRC '86 Digital Tech. Papers, pp. 38–40.

Pelgrom, Marcel et al., "A 32–Kbit Variable Length Shift Register for Digital Audio Application," IEEE Journal of Solid–State Circuits, vol. SC–22, No. 3, Jun. 1987, pp. 415–422.

Peterson, C.B. et al., "Two Chips endow 32–bit processor with fault–tolerant architecture," Electronics, pp. 159–164 (Apr. 7, 1983).

Peterson, J., System–.Level Concerns Set Performance Gains, High–Performance Systems, p. 71–77, Sep. 1989.

Pinkham, Ray et al., "A 128Kx8 70–MHz Multiport Video RAM with Auto Register Reload and 8×4 Write Feature," IEEE Journal of Solid State Circuits, vol. 23, No. 3, pp. 1133–1139 (Oct. 1988).

Pinkham, Raymond et al., "A High Speed Dual Port Memory with Simultaneous Serial and Random Mode Access for Video Applications," IEEE Journal of Solid–State Circuits, vol. SC–19, No. 6, pp. 999–1007 (Dec. 1984).

Poletti, "Rambus wins victory from Supreme Court—Win could Lead to Success for Rambus' Other Lawsuits seeking Royalties", San Jose Mercury News, Oct. 7, 2003.

Poon, T. C., et al., "A CMOS DRAM–Controller Chip Implementation," IEEE Journal of Solid State Circuits, vol. SC–22, No. 3, pp. 491–494, Jun. 1987.

Prince , "Semiconductor Memories," A Wiley–Interscience Publication (1983).

Ralston, E.D. Reilly, "Synchronous/Asynchronous Operation," Encyclopedia of Computer Science, Chapman & Hall, 1983, p. 1471–73.

Rambus Inc., "8/9–Mbit (1Mx8/9) and 16/1 8–Mbit (2Mx8/9) RDRAM," (Mar. 1, 1996).

Rambus Inc., "NEC 18Mb Rambus DRAM Core Interface," (Aug. 9, 1992).

Rambus Inc., "RDRAM Design Guide" (Apr. 1995).

Rau, B. Ramakrishna et al., "The Cydra 5 Departmental Supercomputer Design Philosophies, Decisions, and Trade–offs," Computer IEEE, vol. 22, No. 1, Jan. 1989, pp. 12–35.

Rau, et al., "The Cydra 5 Department Supercomputer Design Philosphies, Decisions, and Trade–offs", IEEE Computer, p. 12–35, Jan. 1989.

Riordan, T., "MIPS R2000 Processor Interface 78–00005(C)", MIPS Computer Systems, Sunnyvale, CA, Jun. 30, 1987,p. 1–83.

Rosenbaum, Stanley D. et al., "A 16 384–Bit High–Density CCD Memory," IEEE Journal of Solid State Circuits, vol. SC–11, No. 1, pp. 33–39, Feb. 1976.

Rowen, Chris et al., "The MIPS R3010 Floating–Point Comprocessor," IEEE Micro, Jun. 1988, pp. 53–62.

Saeki, et al., "SP 23.4: A 2.5 ns Clock Access 250MHz 256Mb SDRAM with a Synchronous Mirror Delay", IEEE ISSCC Digest of Technical Papers, p. 374–375, 476, Feb. 10, 1996.

Saito, Shozo, et al., "A 1–Mbft CMOS DRAM with Fast Page Mode and Static Column Mode," IEEE Journal of Solid–State Circuits, vol. SC–20, No. 5 (Oct. 1985), pp. 903–908.

Sakai, Yuji et al., "A Synchronous DRAM.with New High–speed L/O Lines Method for the Multimedia Age," IEICE Trans. Electron, vol. E78–C, No. 7 (Jul. 1995).

Sawada, Kazuhiro et al., "A 72K CMOS Channelless Gate Array With Embedded 1 Mbit Dynamic RAM," IEEE 1988 Custom Integrated Circuits Conference, 1988, pp. 20.3.1–20.3.4.

Schanke, Morten, "Proposal for Clock Distribution in SCI," SCI–B [1 and SCI 2] (May 5, 1989).

Schmidt, R.L., "A Memory Control Chip for Formatting Data into Block Suitable for Video Coding Applications", IEEE TRansactions on Circuits and Systems, vol. 36, No. 10, p. 1275–1280, Oct. 1989.

Schmitt–Landsiedel, Doris et al., "Pipeline Architecture for Fast CMOS Buffer RAMs," IEEE Journal of Solid–State Circuits, vol. 25, No. 3, pp. 741–747 (Jun. 1990).

Schnaitter, William M. et al., "A 0.5–GHz CMOS Digital RF Memory Chip," IEEE Journal of Solid–State Circuits, vol. SC–21, No. 5, pp. 720–726 (Oct. 1986).

Schumacher, H., "CMOS Submamosecond True–ECL Output Buffer", IEEE Journal of Solid–State Circuits, vol. 25, No. 1, p. 150–154, Feb. 1990.

SCI, P1596: SCI, A Scalable Coherent Interface Bus Specification Components (Nov. 18, 1988).

Siddique, Naseer, "100–MHz DRAM Controller Sparks Multiprocessor Designs," Electronic Design, pp. 138–141, (Sep. 1986).

Siemens AG, "ICs for Entertainment Electronics Picture in Picture System," Ed. 8.89, 1989.

SLDRAM, "400 Mb/s/pin SLDRAM Advance Data Sheet," Provisional Application SN 60057092 (Aug. 1997).

Sonntag, J., et al., "A Monolithic CMOS 10MHz DPLL for Burst–Mode Data Retiming", IEEE Interntaional Solid–State Circuits Conference (ISSCC), Feb. 16, 1990.

Sutherland, Ivan E., "Micropipelines," Communications of the ACM, Jun. 1989, vol. 32, No. 6, pp. 720–738.

Svensson, Christer et al., "High Speed CMOS Chip to Chip Communications Circuit," IEEE International Symposium on Circuits and Systems, pp. 2228–2231 (Jun. 1991).

Synclinc Consortium, "Synclink Feasibility v1.1," Synclinc Consortium (Apr. 30, 1996).

Synclink, "Draft Standard for A High–Speed Memory Interface," Provisional U.S. Appl. No. 60/055,368, file Aug. 1997.

Takada, Tomoji et al., "A Video Codec LSI for High–Definition TV Systems with One–Transistor DRAM Line Memories," IEEE Journal of Solid–State Circuits, vol. 24, No. 6, pp. 1655–1659 (Dec. 1989).

Takai, et al., "250 Mbyte/sec Synchronous DRAM Using a 3–Stage Pipelined Architecture", 1993 Symposium on VLSI Circuits, Digest of Technical Papers, p. 59–60, May 19–21, 1993.

Takashima, Daisaburo, et al., "Low–Power On–Chip Supply Voltage Converstion Schema for Ultrahigh–Density DRAM's " IEEE Journal of Solid–State Circuits, vol. 28; No. 4 (Apr. 1993), pp. 04–509.

Takasugi, A. et al., "A Data–Transfer Architecture for Fast Multi–Bit Serial Access Mode DRAM," 11$^{th}$ European Solid State Circuits Conference. Toulouse, France pp. 161–165 (Sep. 1985).

Thorson, et al., "ECL Bus Controller Hits 266 Mbytes/s", Microprocessor Report, vol. 4, No. 1, p. 12–14, Jan. 24, 1990.

Towler, Fred et. al., "A 128k 6.5ns Access/ 5ns Cycle CMOS ECL Static RAM," 1989 IEEE international Solid State Circuits Conference, pp. 30–31, 280 (Feb. 1989).

Volz, Richard A. et al., "Position Paper On Global Clock For The Futurebut +," SCI–1989–doc–59, pp. 1–9.

Wakayama, Myles et al., "A 30–MHz Low–Jitter High–Linearity CMOS Voltage–Controlled Oscillator," IEEE Journal of Solid–State Circuits, vol. SC–22, No. 6, pp. 1074–1081 (Dec. 1987).

Ward, Stephen, "Computation Structures," The MIT Press, McGraw–Hill Book Company, 1990, pp. 174–175, 93, 250–251, and 258–259.

Ware, Frederick, "16/18 Mbit (2Mx8/9) & 64/72 Mbit (8Mx8/9) Concurrent RDRAM," (Jul. 1996).

Watanabe, et al., "A New CR–Delay Circuit Technology for High–Density and High–Speed DRAM's", IEEE Journal of Solid–State Circuits, vol. 24, p. 905–910, Aug. 1989.

Watanabe, S., et al., "An Experimental 16Mbft Cmos Dram Chip with a 100–MHz Serial Read/Write Mode", IEEE Journal of Solid State Circuits, vol. 24, No. 3, p. 763–770, Jun. 1982.

Watanabe, Takayuki, "Session XIX: High Density SRAMS," IEEE International Solid State Circuits Conference, pp. 266–267 (1987).

Waters, "Hynix Told to Pay Damages to Rambus", Financial Times, Apr. 24, 2006.

Wendell, Dennis et. al., "A 3.5ns, 2Kx9 Self Timed SRAM," 1990 IEEE Symposium on VLSI Circuits (Feb. 1990), pp. 49–50.

Whiteside, Frank et al., "A Dual–Port 65ns 64Kx4 DRAM with a 50MHz Serial Output," IEEE International Solid–State Circuits Conference Digest (Feb. 1986).

Wong, Donald T. et al., "An 11–ns 8Kx18 CMOS Static RAM with 0.5–µm Devices," IEEE Journal of Solid State Circuits, vol. 23, No. 5, pp. 1095–1103 (Oct. 1988).

Wooley, B., et al., "Active Substrate System Integration", Proceedings 1987 IEEE International Conference on Computer Design: VLSI in Computers & Processors, Rye Brook, New York, Oct. 5, 1987.

Wu, Jieh–Tsorng et al., "A 100–MHz Pipelined CMOS Comparator," IEEE Journal of Solid–State Circuits, vol. 23, No. 6, pp. 1379–1385 (Dec. 1988).

Yang, T., et al., "A 4–ns 4Kx1–bit Two–Port BiCMOS SRAM", IEEE Journal of Solid–State Cirucits, vol. 23, No. 5, p. 1030–1040, Oct. 1988.

Yoo, et al., "A 150 MHZ 8–Bank 256M Synchronous DRAM with Wave Pipelining Methods", IEEE ISSCC Digest of Technical Papers, p. 250–251, 374, Feb. 17, 1995.

Yuen, Alex et al., "A 32K ASIC Synchronous RAM Using a Two–Transistor Basic Cell," IEEE Journal of Solid State Circuits, vol. 24, No. 1, pp. 57–61 (Feb. 1989).

Motorola, "Motorola MC88200 Cache/Memory Management Unit User's Manual," Second Edition, Prentice Hall (1988).

Definitions of variations of the word "Operation", Academic Press Dictionary of Science and Technology (1992) submitted in the European Opposition Proceedings for EP 1 197 830 dated May 21, 2008.

Alfke, "Efficient Shift Registers, LFSR Counters, and Long Pseudo–Random Sequence Generators." Xilinx Application Note, XAPP 052, (version 1.1), Jul. 7, 1996.

Amital, "New System Architectures for DRAM Control and Error Correction", Monolithic Memories, Inc., Electro/87 and Mini/Micro Northeast: Focusing on the OEM Conference Record, pp. 4/3 1–9 (Apr. 1987).

Bazes, "Two Novel Fully Complementary Self–Biased CMOS Differential Amplifiers," IEEE Journal of Solid State Circuits, vol. 26, No. 2, Feb. 1991, pp. 165–168.

Blake (Editor), "CVAX–Based Systems," Digital Technical Journal Digital Equipment Corporation, No. 7 pp. 1–143, Aug. 1988.

N. F. Brickman, Reprint of "Redundant Memory Cell and Decoder", IBM Technical Disclosure Bulletin, vol. 13, No. 7–Dec. 1970, pp. 1924–1926.

Burndy Connects, "If you're ready for surface mounting, we're ready for you! Surface Mounting Right Now," Advertisement, Electronic Engineering Times, pp. T24–T25 (Feb. 24, 1986).

Bursky, "Fast DRAMs Can Be Swapped for SRAM Caches," Electronic Design, Jul. 22, 1993, pp. 55–65.

Bursky, "Triple–Port Dynamic RAM Accelerates Data Movement," Electronic Design, May 24, 1990, pp. 37–43.

Carter, "Survey of Synchronization Technique for a TDMA Satellite–Switched System," IEEE Transaction on Communications, vol. COM–28, No. 8, pp. 1291–1300, Aug. 1980.

Clayton, "Prediction of Crosstalk in Ribbon Cables: Comparison of Model Predictions and Experimental Results", IEEE Transactions on Electromagnetic Compatibility, vol. EMC–20, No. 3, Aug. 1978, pp. 394–406.

Clement, "Process–Tolerant High Level Shifter", Motorola Technical Development, Motorola Inc., 1987.

Cole, "Designers Try Alternatives to Asynchronous DRAMs," Electronic Engineering Times, Dec. 7, 1992, pp. 1, 2, 39, 42, 44.

Dally et al., Digital Systems Engineering, Cambridge University Press, New York, NY, pp. 334–347 and 352, 1998.

Deering et al., "The Triangle Processor and Normal Vector Shader", Computer Graphics, vol. 22, No. 4, Aug. 1988, Siggraph, Atlanta.

Diede, "The Titan Graphics Supercomputer Architecture," Computer, pp. 13–30, Sep. 1988.

Digital Equipment Corporation, KA 660 CPU Module Technical Manual, Digital Equipment Corporation, version 1.2, Mar. 1990, submitted in Oppositions filed by Micron Europe and by Hynix Semiconductor Deutschland GmbH, in Official Communication from EPO.

Electric Engineering Times, A CMP Publication, Issue 724, Dec. 7, 1992, pp. 1, 2.

Ellingson, et al., "Dissemination of System Time," IEEE Transactions on Communications, vol. COM–21, No. 5, pp. 605–624, May 1973.

Ethirajan et al., "Termination Techniques For High–Speed buses," EDN Magazine, Issue 04, Feb. 16, 1998.

Fallin, "Designing Memory Systems with the 8K×8 iRAM" Intel Application Note, AP132, Jun. 1982, submitted in the Opposition of Hynix dated Oct. 6, 2009, in Patent No. DE 1 816 569 issued Jan. 7, 2009 with Application No. 06 125 946.1.

Gustavson, David B., IEEE P 1596, "A Scalable Coherent Interface for Gigabyte/sec Multiprocessor Application," presented orally at the Nuclear science Symposium Nov. 9–11, 1988.

Gumm et al., "Unraveling the Intricacies of Dynamic RAMs," Electronic Design News, pp. 155–165 (Mar. 30, 1989).

Gutierrez et al., "Integrated PLL Clock Generator for 275 MHz Graphic Displays," IEEE Custom Integrated Circuits Conference, 1990, pp. 15.1.1–15.1.4.

Hartmann et al., "Synchronization Techniques for Digital Networks," IEEE Journal on Selected Areas in Communications, vol. SAC–4, No. 4, pp. 506–513, Jul. 1986.

Hashimoto et al., "Clock–driven On–chip Testing for Superconductor Logic Circuits," Jun. 1999, IEEE, pp. 3169–3172.

Huber, Expert Report Regarding the Invention Claimed in Rambus' EP 0 525 068 Patent vs. The CVAX CMCTL—A CMOS Memory Controller Chip and Designing Memory Systems with the 8k×8 iRAM (Jul. 13, 2004).

IBM Technical Disclosure Bulletin "Inexpensive Chip Package" vol. 33 No. 1A, pp. 272 and 273, Jun. 1990.

Integrated Device Technology, Inc. , IDT 79R2010 RISC Floating Point Accelerator (FPA) Advance Information, Integrated Device Technology, Inc. Santa Clara, CA, 1987, pp. 9–1 to 9–14. (Jan. 1988).

IEEE, An American National Standard, "IEEE Standard for a Simple 32–Bit Backplane Bus: NuBus," Technical Committe on Microcomputers and Microprocessors of the IEEE Computer Society, Approved Jun. 11, 1987 by IEEE Standards Board, Approved Feb. 24, 1988 by American National Standards Institute, Copyright 1988, submitted in Notice of Opposition to European Patent No. 1 816 569, dated Oct. 15, 2009, with Application No. 06125946.1 dated Jun. 13, 2007.

IEEE, Extraction defining variations of the word "Operation" from The New IEEE Standard Dictionary of Electrical and Electronic Terms (1993).

IEEE, Extraction defining variations of the word "Operation" from IEEE Standard Dictionary of Electrical and Electronic Terms (Nov. 3, 1988) submitted in in the European Opposition Proceedings for EP 1 197 830 dated May 21, 2008.

Ikeda et al., "100 MHz Serial Access Architecture for 4MB Field Memory," Symposium of VLSI Circuits, Digest of Technical Papers, pp. 11–12 (Jun. 1990).

Intel, "iAPX432 IP Datasheet, iAPX GDP Datasheet, iAPX432 Manual, iAPX432 Specification (BIU), iAPX432 Specification (MCU)," 1981–1983.

Intel 8203 64K Dynamic Ram Controller, pp. 2:1–15 (Nov. 1997), submitted in EP 1 197 830 proceedings.

James, "Scalable I/O Architecture for Buses", COMPCON Spring 1989, SCI, Nov. 28, 1988.

JEDEC, JC 42.3 Committee on Sep. 12, 1989, Minutes of Meeting No. 51 JC 42.3 Committee on MOS Memories.

Alnes, Norsk Data Report, "SCI: A Proposal For SCI Operation," dated Nov. 10, 1988.

Keda et al., "100 MHz Serial Access Architecture for 4Md Field Memory," Symposium of VLSI Circuits, Digest of Technical Papers, pp. 11–12, (Jun. 1990).

Ko et al., "Development of 3–Dimensional Memory Die Stack Packages Using Polymer Insulated Sidewall Technique." 1999 Electronic Component and Technology Conference, pp. 663–667.

Kopetz et al., "Clock Synchronization in Distributed Real–Time Systems," IEEE Transactions on Computers, vol. C–30, No. 8, pp. 933–940, Aug. 1987.

Lebeck et al., "Power Aware page Allocation", Proceeding of the Ninth International Conference on Architectural Support for Programming Languages and Operating Systems, (ASPLOS–IX), Nov. 2000.

Lee et al., "A 2.5V Delay–Locked Loop for an 18Mbit, 500 Megabyte/s DRAM,"Solid State Circuits Conference, Digest of Technical Papers, 41st ISSCC International, Feb. 1994, pp. 300, 301, 357.

Lindsey et al., "Mutual Synchronization of Two Oscillators," IEEE National Telesystems Conference, Nov. 1982. pp. E1.5.1, E2.1.1–E2.1.5.

Lindsey et al., "Network Synchronization by Means of a Returnable Timing System," IEEE Transactions of Communications, vol. COM–26, No. 6, pp. 892–896, Jun. 1978.

Lindsey et al., "Network Synchronization of Random Signals," IEEE Transactions on Communications, vol. COM–28, No. 8, pp. 1260–1265, Aug. 1980.

Lundelius et al., "A New Fault–Tolerant Algorithm for Clock Synchronization," ACM Proceedings of the 3rd Annual ACM Symposium on Principles of Distributed Computing, Jun. 1984, pp. 75–88.

Manners, "Memory Survival Crisis," Electronics Weekly, Apr. 1, 1992, p. 14.

Microsoft, Extraction Defining variations of the word "Operation" from Microsoft Press—Computer Dictionary (1991) submitted in the European Opposition Proceedings for EP 1 197 830, dated May 21, 2008.

MoSys MD909SJ–5–100 Multibank DRAM (MDRAM) Circuit Analysis, Chipworks, Apr. 22, 2008.

Motorola Inc., "68030 Cache Organization", posting to Internet Newsgroup net.arch by aglew@ccvaxa.UUCP, (a google.com reprint on two sheets obtained on Jan. 14, 2008), Sep. 29, 1986.

Nitta et al.,"SP 23.5: A 1.6GB/s Data–Rate 1Gb Synchronous DRAM with Hierarchical Square–Shaped Memory Block and Distributed Bank Architecture," IEEE Solid State Circuits Conference, Nov. 1996, pp. 376–377, 477.

Ofek, "Integration of Voice Communication on a Synchronous Optical Hypergraph," IEEE, 1988, pp. 1B.3.1–1B.3.7.

Ohta, "A 1–Mbit DRAM with 33–MHz Serial I/O Ports", IEEE Journal of Solid State Circuits, vol. 21, No. 5, pp. 649–654 (Oct. 1986).

Park, "A Semi–Digital Delay Locked Loop for Clock Skew Minimization" VLSI Design, 1999. Proceedings. 12th International Conference, GOA, INDIA, Jan. 7–10, 1999, pp. 584–588 (1999).

Patterson et al., "Computer Architecture A Quantative Approach," pp. 1, 2, 374, 429 (1990).

Pattini et al., "A Synchronization Technique for On–Board Master Clock of a Regenerative TDMA Satellite Communications System," IEEE International Conference on Communications 1985, vol. 2, pp. 32.3.1–32.3.6, Jun. 1985.

Peigrom et al., "A 32 Kbit Variable Length Shift Register for Digital Audio Application," ESSCIRC Dig. Tech. Papers, pp. 38–40 (1986).

Prince, "Semiconductor Memories," 1983, John Wiley & Sons Ltd., Excerpts from Chapter 2, 4, & 11, submitted in Opposition of Hynix dated Oct. 6, 2009, in Patent No. DE 1 816 569 issued Jan. 7, 2009 with Application No. 06 125 946.1.

Prince, "Semiconductor Memories: A Handbook of Design, Manufacture, and Application" Second Edition, pp. 273–230, 281–290 (1983), submitted in Opposition of Micron from the EPO Mar. 2, 2009 Opposition of Hynix Mar. 19, 2009.

Prince, "Semiconductor Memories: A Handbook of Design, Manufacture, and Application," Second Edition, (1991), pp. 248, 273–290, submitted in Opposition of Hynix dated Oct. 6, 2009, in Patent No. DE 1 816 569 issued Jan. 7, 2009 with Application No. 06 125 946.1.

QBM Alliance, Platform Conference, "Quad Band Memory (QBM): DDR 200/266/33 devices producing DDR400/533/667," Jan. 23–24, 2002.

Quinnell, "Coupling DRAM and Bus Technology Yields 500–MHz Burst Transfers," EDN, Mar. 30, 1992, pp. 77, 78.

Quinnell, "Synchronous Memories,"EDN, Aug. 4, 1994, pp. 56–66.

Rambus, Inc., "p5 18Mb RDRAM Test Modes," Aug. 3, 1992.

Saeki et al., SP 23.4: A 2.5ns Clock Access 250MHz 256Mb 256Mb SDRAM with a Synchronous Mirror Delay, IEEE International Solid–State Circuits Conference, 1996, pp. 300–301, 374–375, 480.

Sato et al., "A 5–Gbyte/s data–transfer scheme with bit–to–bit skew control for synchronous DRAM," "IEEE Journal of Solid–State Circuits," 34:653–660 (1999).

Sawada et al., "A 72K CMOS Channelless Gate Array With Embedded 1 Mbit Dynamic RAM," IEEE 1988 Custom Integrated Circuits Conference 1988, pp. 20.3.1–20.3.4 (1988).

Schmitt–Lansiedel et al., "Pipeline Architecture for Fast CMOS Buffer RAMs" IEEE Journal of Solid–State Circuits, vol. 25, No. 3, pp. 741–746 (Jun. 1990).

Schuster, "Selective Metalization Removal for Redundancy", IBM Technical Disclosure Bulletin, vol. 15, No. 2–Jul. 1972.

Shah et al., "A Temperature Independent Trimmable Current Source," Department of Engineering Science, University of Oxford, ISCAS 2002.

SLDRAM Consortium, 400 Mb/s/pin SLDRAM, 4M×18SLDRAM Pipelined, SLDRAM Consortium, Eight Bank, 2.5v Operation, Rev. Aug. 27, 1997.

Sontag, "A Monolithic CMOS 10MHz DPLL for Burst–Mode Data Retiming", 1990 IEEE International Solid–State Circuit Conference Digest of Technical Papers, 37th ISSCC, Session:"High Speed Communication ICs," Feb. 14–16, 1990, pp. 194–195 and 294.

Technologic Partners, "On Common Ground, The marriage of the engineering computer and the office pc gives birth to a new category: the personal workstation," Technologic Computer Letter, vol. 5, No. 25, Jul. 31, 1989 including Moussouris, "Life Beyond RISC: The next 30 years in high performance computing."

Thorp et al., "Real Time Voltage–Phasor Measurements for Static State Estimation," IEEE Transactions on Power Apparatus and Systems, vol. PAS–104, No. 11, pp. 3098–3106, Nov. 1985.

Tuite, "Cache Architectures Under Pressure to Match CPU Performance," Computer Design, Mar. 1993, pp. 91–97.

Vansanthavada et al., "Synchronization of Fault–Tolerant Clocks in the Presence of Malicious Failures," IEEE Transactions on Computers, vol. 37, No. 4, Apr. 1988.

von Kaenel, "A High–Speed, Low–Power Clock Generator for a Microprocessor Application," IEEE Journal of Solid–State Circuits, vol. 33, No. 11, Nov. 1998, pp. 1634–1639.

Wikipedia, "Phase–Locked Loop," downloaded Aug. 5, 2006 from http://en.wikipedia.org/wiki/Phase–locked_loop re Opposition Hynix Annexes dated Jul. 3, 2007.

Wilson, "A Cure for the Bottleneck Blues," Computer Design, May 1992, pp. 38, 40.

Wilson, "MoSys Details High–Speed Graphics DRAM" Electronic Times, Jul. 18, 1994, pp. 1, 2, 16.

Wooley et al., "Active Substrate Integration," Private Communication, Semiconductor Research Corporation, (Mar. 15, 1988).

Yoshikawa et al., "A Precise—TDMA Synchronization Scheme Employing Onboard Reference Burst Generator," IEEE International Conference on Communications 1985, vol. 2, pp. 994–998, Jun. 1985.

Zerbe et al., "Equalization and Clock Recovery for a 2.5–10 Gb/s 2–PAM/4–PAM Backplane Transceiver Cell," presented at ISSCC 2003, paper 4.6.

Joint Electron Device Engineering Council (JEDEC) Standard No. 21–C, Revision 9 published in 1999.

Intel Corporation "iAPX 432 Interconnect Architecture Reference Manual", published in 1982.

Intel Corporation, "Electrical Specifications for iAPX 43204 Bus–Interface unit (BIU) and iAPX 43205 Memory Control Unit (MCU)", published Mar. 1983.

Johnson et al., "A Variable Delay Line PLL for CPU—Coprocessor Synchronization", IEEE Journal of Solid–State Circuits, vol. 23, No. 5, published Oct. 1988.

Rau et al., "The Cydra 5 Departmental Supercomputer Design Philosphies, Decisions, and Tradeoffs", published Jan. 1989.

* cited by examiner

INTER PARTES REEXAMINATION CERTIFICATE ISSUED UNDER 35 U.S.C. 316

NO AMENDMENTS HAVE BEEN MADE TO THE PATENT

AS A RESULT OF REEXAMINATION, IT HAS BEEN DETERMINED THAT:

The patentability of claims 1-51 is confirmed.

* * * * *